(12) United States Patent
Nagata et al.

(10) Patent No.: US 6,229,757 B1
(45) Date of Patent: May 8, 2001

(54) SEMICONDUCTOR MEMORY DEVICE CAPABLE OF SECURING LARGE LATCH MARGIN

(75) Inventors: Kyoichi Nagata; Yasuo Kobayashi, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/315,828

(22) Filed: May 21, 1999

(30) Foreign Application Priority Data

May 21, 1998 (JP) ................................................ 10-140128

(51) Int. Cl.[7] ........................................................ G11C 8/00
(52) U.S. Cl. .................... 365/233; 365/189.05; 365/193; 365/194
(58) Field of Search .................................. 365/233, 193, 365/194, 230.08, 189.05, 189.12

(56) References Cited

U.S. PATENT DOCUMENTS

| | | | |
|---|---|---|---|
| 5,896,347 | * | 4/1999 | Tomita et al. ......................... 365/233 |
| 5,978,281 | * | 11/1999 | Anand et al. ...................... 365/189.05 |
| 6,034,916 | * | 3/2000 | Lee ......................................... 365/233 |
| 6,052,325 | * | 4/2000 | Merritt ................................... 365/226 |
| 6,052,329 | * | 4/2000 | Nishino et al. ....................... 365/233 |
| 6,061,292 | * | 4/1999 | Su et al. ........................... 365/230.06 |

* cited by examiner

*Primary Examiner*—Richard Elms
*Assistant Examiner*—Hien Nguyen
(74) *Attorney, Agent, or Firm*—Sughrue, Mion, Zinn, Macpeak & Seas, PLLC

(57) ABSTRACT

In a double data rate type synchronous dynamic random access memory (DDR-SDRAM) device, a large latch margin of input data is secured. The DDR-SDRAM device is arranged by a data strobe signal processing circuit for detecting at least one of a rise edge of a data strobe signal and a fall edge thereof to thereby produce at least a first one-shot pulse signal; a clock signal processing circuit for detecting a rise edge of a clock signal to thereby produce a second one-shot pulse signal; and a data-in processing circuit for latching input data by using the first one-shot pulse signal produced from the data strobe signal, and further for latching the latched input data by using the second one-shot pulse signal produced from the clock signal, and also for simultaneously writing both the latched data into a memory cell in a parallel manner. The data-in processing circuit controls a delay amount of the first one-shot pulse signal and another delay amount of the second one-shot pulse signal so as to secure a latch margin of the input data.

3 Claims, 41 Drawing Sheets

11; data strobe signal circuit

12; clock signal circuit tDQSS = 0.75tCK (tDQSS min.)

$$\frac{tDQSS = 1.25tCK}{(tDQSS\ max.)}$$

tDQSS = 0.75tCK (tDQSS min.)

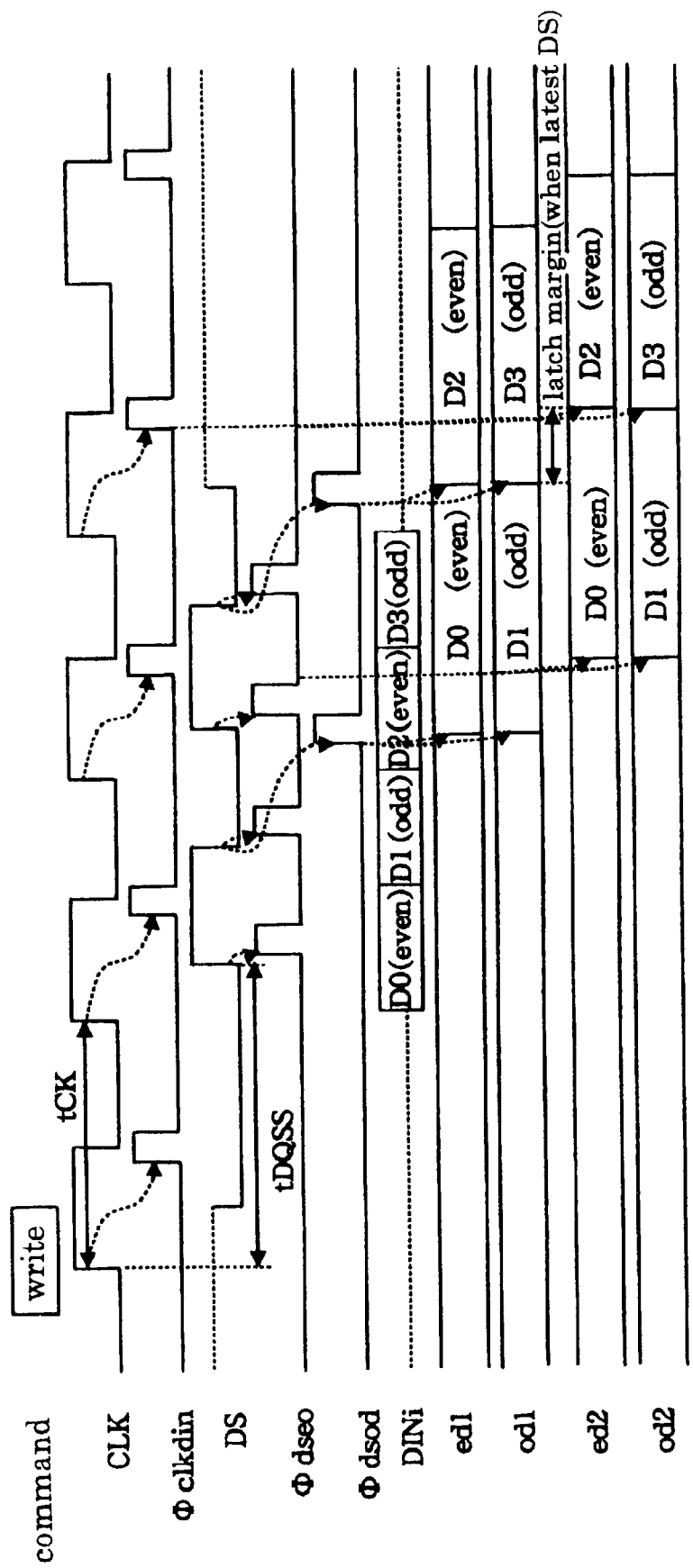

51; data strobe signal circuit

52; clock signal circuit tDQSS = 0.75tCK (tDQSS min.)

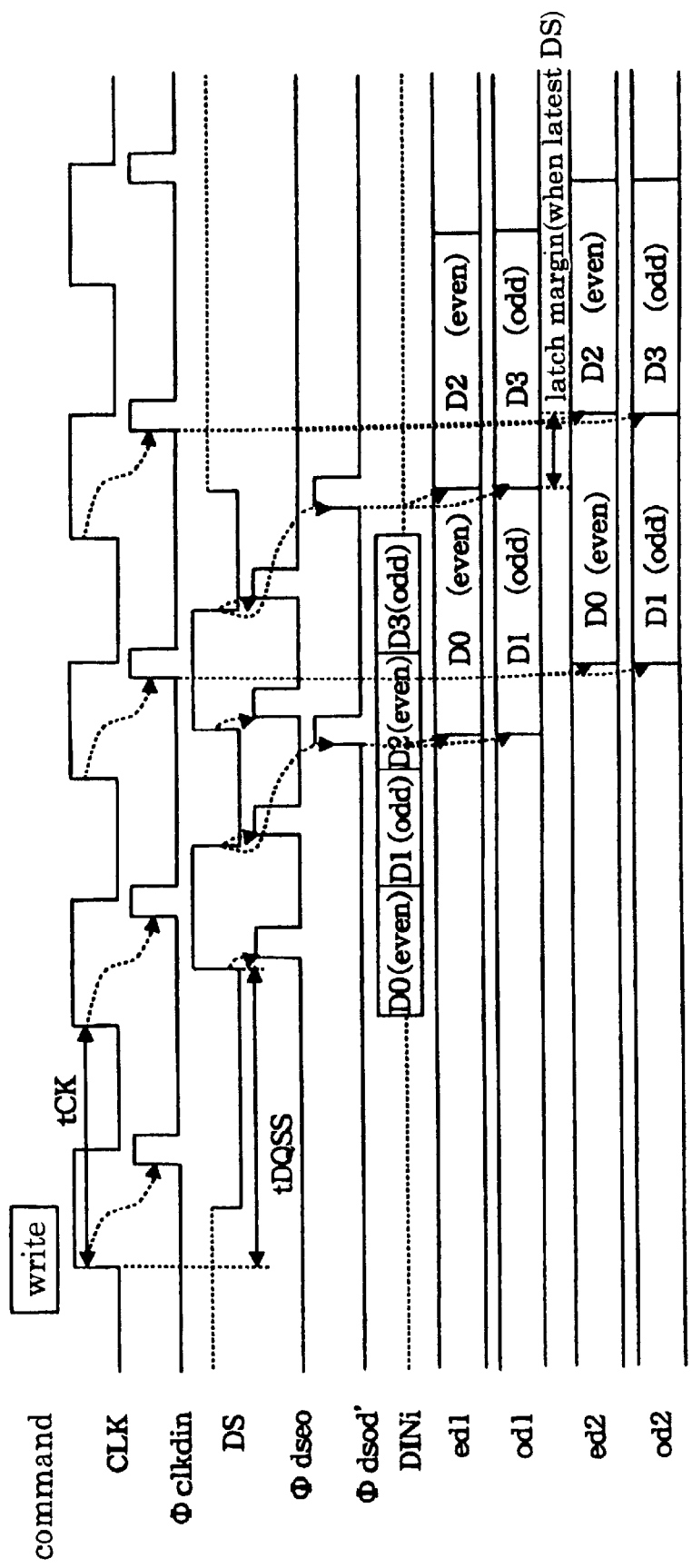

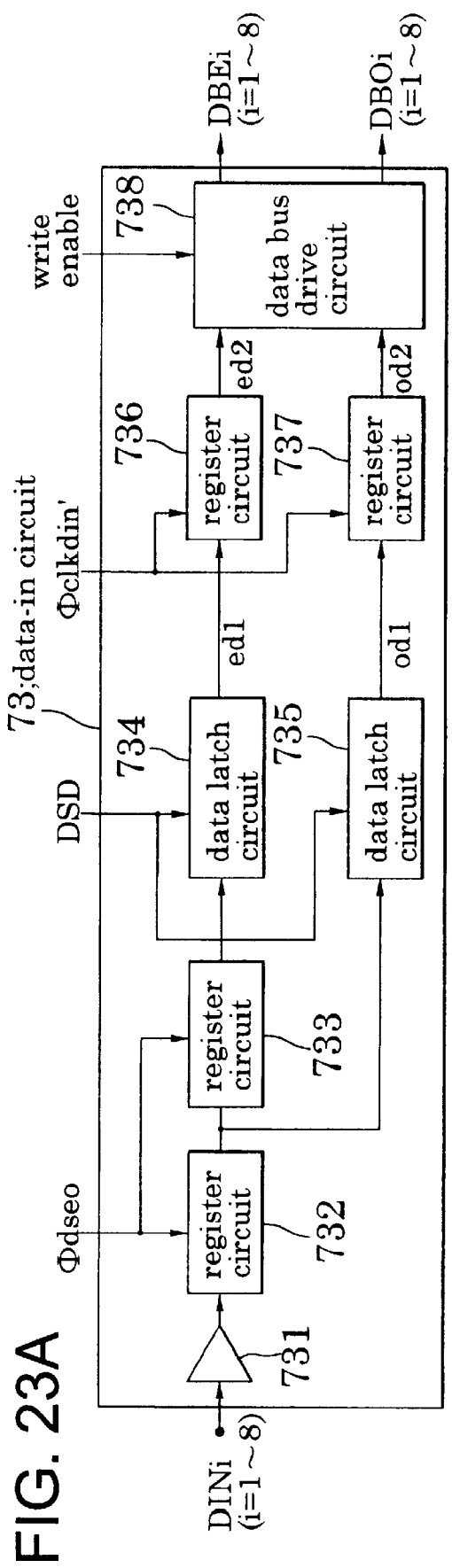
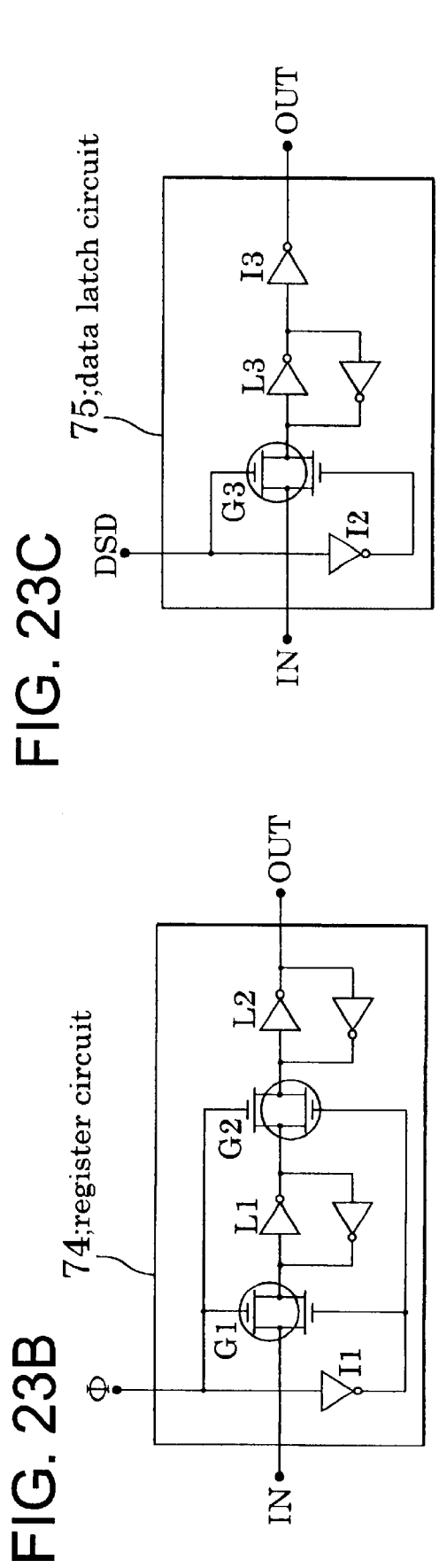
FIG. 23A
FIG. 23B
FIG. 23C

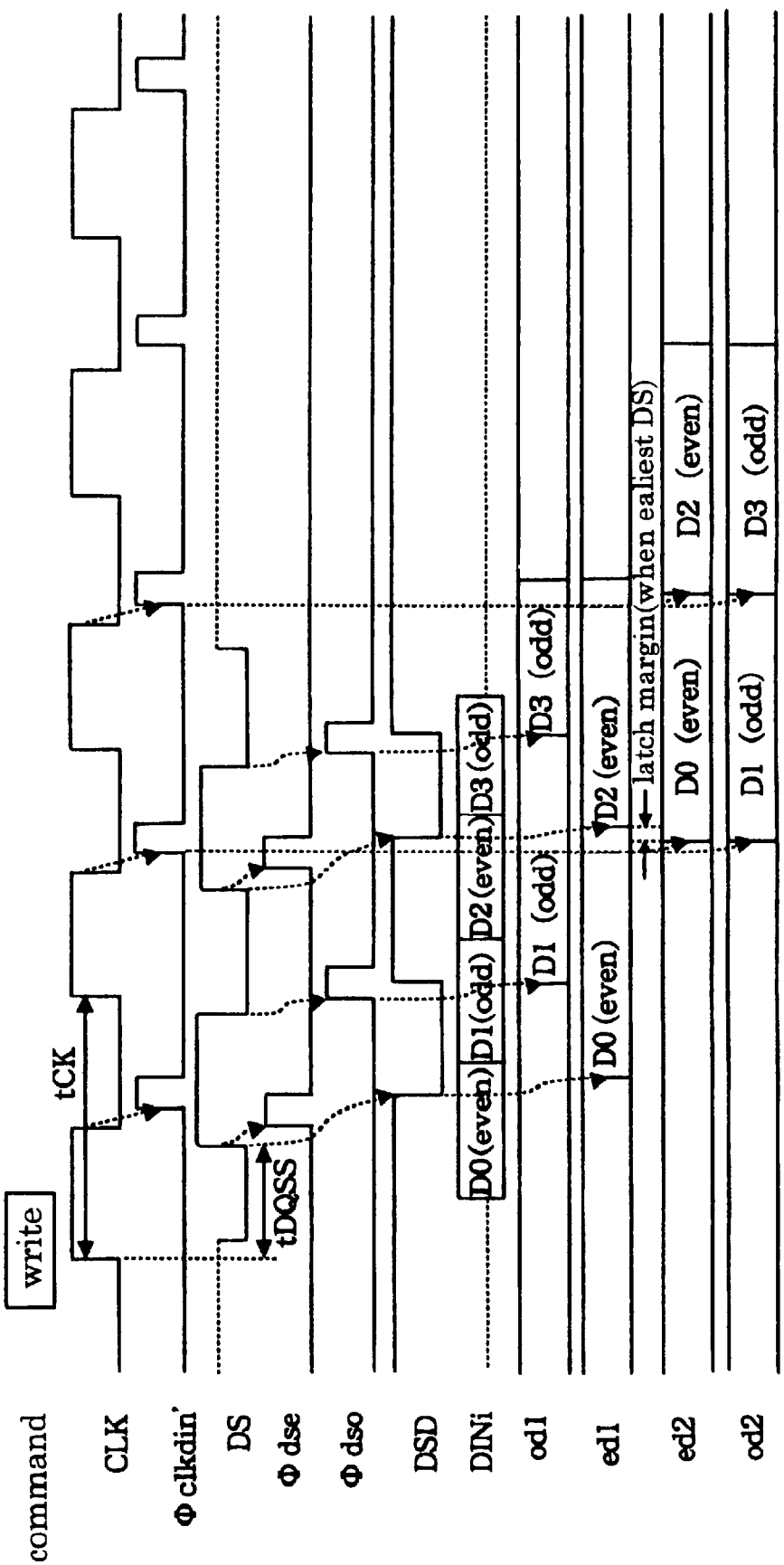

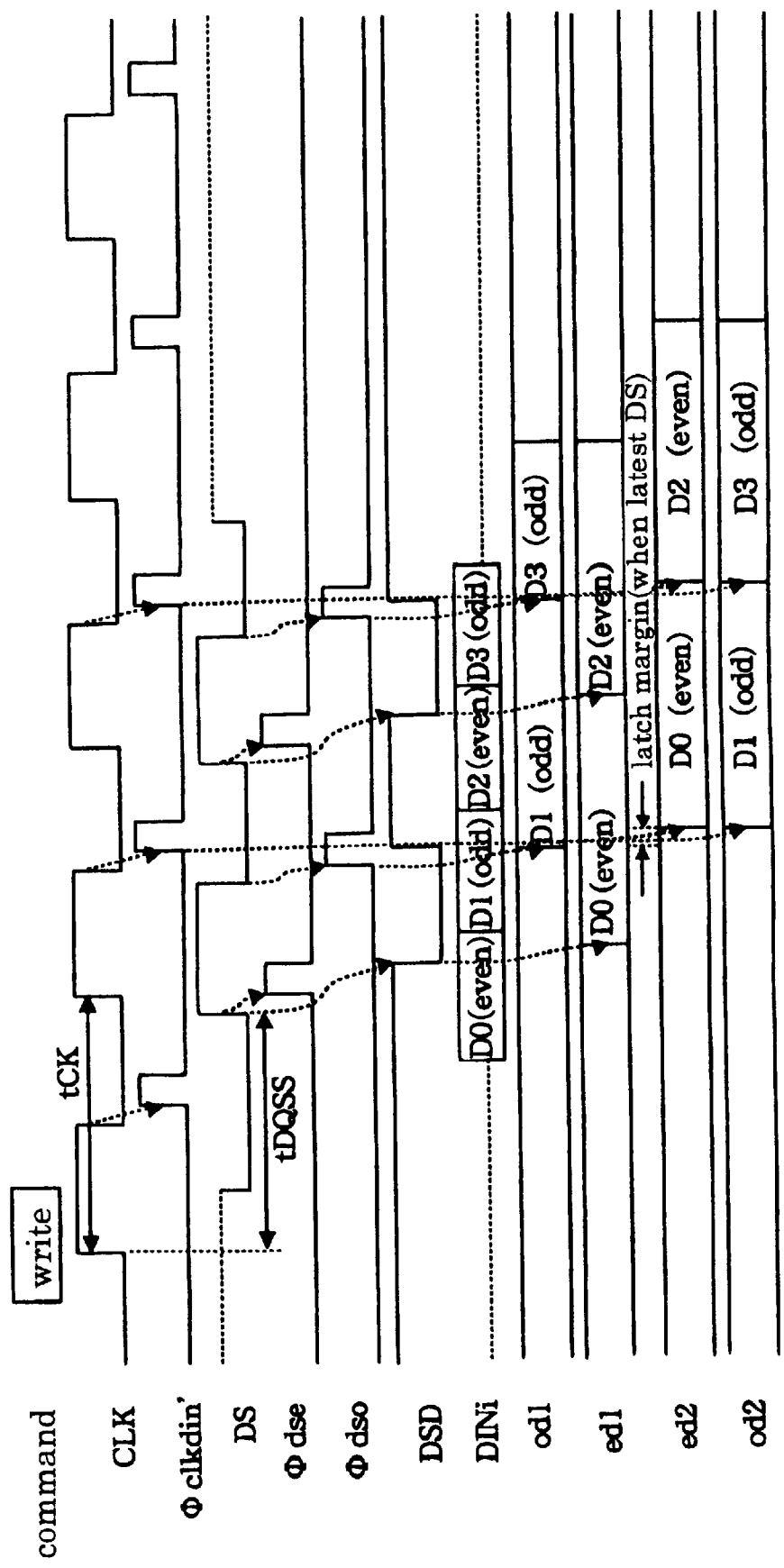

SEMICONDUCTOR MEMORY DEVICE CAPABLE OF SECURING LARGE LATCH MARGIN

BACKGROUND OF THE INVENTION

1. Field of the Invention

The present invention generally relates to a semiconductor memory device. More specifically, the present invention is directed to a double data rate type synchronous dynamic random access memory (DDR type SDRAM, or DDP-SDRAM) capable of securing a large latch margin.

2. Description of the Related Art

While central processing units (CPUs) are operable in high speeds, SDRAMs operable in synchronism with clock signals are used in main storage units of computers. To further increase operating speeds, 2-bit prefetch type SDRAMs have been recently proposed. In a 2-bit prefetch type SDRAM, 2-bit data are read/written at the same time.

First, a first prior art semiconductor memory device constituted by a 2-bit prefetch type SDRAM will be described.

FIG. 36 and FIG. 37 are schematic block diagrams for representing an electric circuit arrangement of a semiconductor memory device according to the first prior art. FIG. 38 is a timing chart for explaining operations of this first prior art semiconductor memory device.

As schematically shown in FIG. 36 and FIG. 37, this first prior art semiconductor memory device is mainly arranged by a clock signal circuit 201, and a data-in circuit 202.

Precisely speaking, as shown in FIG. 36, the clock signal circuit 201 contains an input buffer 2011, a rise transition pulse generating circuit 2012, a delay circuit 2013, a frequency dividing circuit 2014, and a rise transition pulse generating circuit 2015.

As shown in FIG. 37(a), the data-in circuit 202 contains an input buffer 2021, register circuits 2022, 2023, 2024, 2025, and also a data bus drive circuit 2026.

Next, a description will be made of operations of the first prior art semiconductor memory device constituted by the 2-bit prefetch type SDRAM with reference to FIG. 37 to FIG. 38.

In the clock signal circuit 201 shown in FIG. 36, the rise transition pulse generating circuit 2012 detects a rise edge of a clock signal CLK which is externally entered via an input buffer 2011 to thereby an one-shot pulse signal "Φclk". The frequency dividing circuit 2014 frequency-divides an input clock signal by a ½ frequency, which is produced by delaying the entered clock signal CLK by preselected time via the delay circuit 2013. The rise transition pulse generating circuit 1015 detects a rise edge of the frequency-divided clock signal derived from the frequency dividing circuit 2014 to thereby generate another one-shot pulse signal "Φclkdin". This one-shot pulse signal "Φclkdin" owns a time period two times higher than that of the clock signal CLK.

In the data-in circuit 202 shown in FIG. 37(a), a data input signal DINi (i=1 to 8) indicates 1-bit data among 8-bit parallel input data. The register circuit 2022 acquires the data input signal DINi derived via the input buffer 2021 in response to the one-shot pulse "Φclk" produced by the rise transition of the clock signal CLK. The register circuit 2023 acquires the signal saved from the register circuit 2022 in response to the next one-shot pulse signal "Φclk". Next, the register circuit 2024 and the register circuit 2025 acquire at the same time both the data saved in the register circuits 2022 and 2023 in response to the one-shot pulse signal "Φclkdin" produced every time the two cycles of the clock signal CLK have passed. At this stage, in order to avoid the mis-latch operation, this one-shot pulse signal "Φclkdin" is delayed by the delay circuit 2013 so as to be supplied after the one-shot pulse signal "Φclk". The data bus drive circuit 2026 supplies both the output data "ed" derived from the register circuit 2024 and the output data "od" derived from the register circuit 2025 in a parallel manner to even-numbered data buses DBEi (i=1 to 8) and also odd-numbered data buses DBOi (i=1 to 8), so that the input data may be written into a memory cell (not shown).

It should be understood in this first prior art memory circuit that all of these register circuits 2022, 2023, 2024, and 2025 shown in FIG. 37(a) own the same circuit arrangements as a circuit arrangement of a register circuit 203 shown in FIG. 37(b). This register circuit 203 owns an inverter I1, gates G1, G2, and latches L1, L2. In response to a fall edge of an external clock signal "Φ", the input data IN is latched by the latch circuit L1 by opening the gate G1, and also the data latched by this latch circuit L1 is latched by another latch circuit L2 by opening the gate G2 in response to a rising edge of this external clock signal "Φ". As a result, 1-bit data is held in this register circuit 203 during 1 time period of the external clock signal "Φ".

Next, a description of a second prior art semiconductor memory device will be explained, which is arranged by a 2-bit prefetch type SDRAM. FIG. 39 and FIG. 40 are schematic block diagrams for showing an electric circuit arrangement of a semiconductor memory device according to the second prior art invention. FIG. 41 is a timing chart for explaining operation of this second prior art memory device.

This semiconductor memory device of the second prior art is mainly arranged by a clock signal circuit 211, and a data-in circuit 212.

As indicated in FIG. 39, the clock signal circuit 211 contains an input buffer 2111, a frequency dividing circuit 2111, a rise transition pulse generating circuit 2113, a delay circuit 2114, an 1-time-period delay circuit 2115, another frequency dividing circuit 2116, and another rise transition pulse generating circuit 2117.

As indicated in FIG. 40(a), the data-in circuit 212 contains an input buffer 2121, register circuits 2122, 2123, 2124, and 2125, and a data bus drive circuit 2126.

Next, a description will be made of operations of the second prior art semiconductor memory device constituted by the 2-bit prefetch type SDRAM with reference to FIG. 39 to FIG. 41.

In the clock signal circuit 211 shown in FIG. 39, the frequency dividing circuit 2112 frequency-divides an input clock signal by a ½ frequency, which is externally entered via the delay circuit 2111. The rise transition pulse generating circuit 2113 detects a rise edge of the frequency-divided clock signal derived from the frequency dividing circuit 2112 to thereby generate an one-shot pulse signal "Φclk". The delay circuit 2114 delays the output signal of the frequency dividing circuit 2112 by preset time. The rise transition pulse generating circuit 2113 detects a rise edge of the output signal derived from the delay circuit 2114 to thereby generate another one-shot pulse "Φclkdin". Also, the 1-time-period delay circuit 2115 delays the output signal of the input buffer 2111 by 1 time period, whereas the frequency dividing circuit 2116 frequency-divides the output signal produced from the 1-time-period delay circuit 2115 by a ½ frequency. The rise transition pulse generating circuit 2117 detects a rise edge of the frequency-divided signal of the frequency dividing circuit 2116 to produce another one-shot pulse "Φ/clk".

In the data-in circuit 212 shown in FIG. 40(a), the register circuit 2112 acquires the data input signal DINi entered via the input buffer 2121 in response to the one-shot pulse signal "Φclk" generated by detecting the rise transition of the frequency-divided clock signal CLK by 2. Also, the register circuit 2123 acquires the output signal derived from the input buffer 2121 in response to the one-shot pulse signal "Φ/clk" produced by detecting the rise transition of the clock signal CLK which has been delayed by 1 time period and then is frequency-divided by 2. Next, the register circuit 2124 and the register circuit 2125 acquire at the same time both the data saved in the register circuits 2122 and 2123 in response to the one-shot pulse signal "Φclkdin" produced every time the two cycles of the clock signal CLK have passed. At this stage, in order to avoid the mis-latch operation, this one-shot pulse signal "Φclkdin" is delayed so as to be supplied after the one-shot pulse signal "Φclk". The data bus drive circuit 2126 supplies both the output data "ed" derived from the register circuit 2124 and the output data "od" derived from the register circuit 2125 in a parallel manner to even-numbered data buses DBEi (i=1 to 8) and also odd-numbered data buses DBOi (i=1 to 8), so that the input data may be written into a memory cell (not shown).

It should be understood in this second prior art memory device that all of these register circuits 2122, 2123, 2124, and 2125 own the same circuit arrangements as a circuit arrangement of a register circuit 213 shown in FIG. 40(b). This register circuit 213 owns the same arrangement/function as those of the register circuit 203 indicated in FIG. 37(b).

In the above-explained conventional semiconductor memory devices, the operating speed of the clock signal must be necessarily increased so as to increase the data processing speeds. However, since in actual systems with using such an SDRAM, a large number of SDRAMs are mounted on a module board to be driven, there are serious problems in timing skews between the clock signal CLK and the data input signal DINi. As a result, the highspeed operation of the clock signal CLK cannot be readily realized.

The reason why such a timing skew problem occurs is given as follows: That is, the data input signal is acquired only by using the clock signal CLK. To the contrary, very recently, the double data rate type DDR-SDRAM has been proposed, and is now standardized by JEDEC (Joint Electron Device Engineering Council).

In this DDR-SDRAM, the 2-bit prefetch system is employed. The data input signal is acquired by receiving the data strobe signal DS. The time period of the clock signal CLK becomes two times higher than that of the data input signal. This data strobe signal DS is produced together with the data input signal DINi at the same time by a central processing unit (CPU: not shown). The data strobe signal DS and the data input signal DINi are connected to the SDRAM via the wiring lines having the same lengths, so that the timing skew problem between these clock signal CLK and data input signal DINi can be solved. As a consequence, both the problem about the highspeed operation of the clock signal, and the timing skew problem between the clock signal and the data input signal can be solved at the same time. It should be noted that after the data input signal is acquired by using the data strobe signal DS, the acquired data input signal must be converted under control of the clock signal CLK. The control/-converting operations effected at this stage must be firmly carried out, namely a sufficiently large latch margin is required.

SUMMARY OF THE INVENTION

With the foregoing in view, it is an object of the present invention to provide a semiconductor memory device capable of securing a sufficiently large latch margin in the case that after an input data signal has been acquired in a DDR-SDRAM under control of a data strobe signal, the acquired input data signal is converted under control of a clock signal.

To achieve the above-mentioned object, according to a first aspect of the present invention, there is provided a semiconductor memory device comprising: a data strobe signal processing circuit for detecting at least one of a rise edge of a data strobe signal and a fall edge thereof to thereby produce at least a first one-shot pulse signals; a clock signal processing circuit for detecting a rise edge of a clock signal to thereby produce a second one-shot pulse signal; and a data-in processing circuit for latching input data by using the first one-shot pulse signal produced from the data strobe signal, and further for latching the latched input data by using the second one-shot pulse signal produced from the clock signal, and also for simultaneously writing both the latched data into a memory cell in a parallel manner, wherein: the data-in processing circuit controls a delay amount of the first one-shot pulse signal and another delay amount of the second one-shot pulse signal so as to secure a latch margin of the input data.

In the foregoing, it is preferable that the semiconductor memory device is a double data rate type synchronous dynamic random access memory capable of simultaneously reading/writing 2-bit input data.

Also, a preferable mode is one wherein the data strobe signal processing circuit includes at least a rise/fall transition pulse generating circuit; the clock signal processing circuit includes at least a rise transition pulse generating circuit; and the data-in processing circuit includes at least two sets of cascade-connected register circuits.

According to a second aspect of the present invention, there is provided a semiconductor memory device comprising:

first and second cascade-connected data saving means for sequentially acquiring input data to save thereinto the acquired input data in response to both a rise edge of a data strobe signal and a fall edge of the data strobe signal, the data strobe signal being outputted in a time period during which two sets of the input data are entered into the semiconductor memory device; and data read/write means for reading the input data acquired into the first and second cascade-connected data saving means at the same time and for writing the simultaneously read input data into a memory cell in a parallel manner in response to timing of a clock signal.

Also, according to a third aspect of the present invention, there is provided a semiconductor memory device comprising:

a first set of two cascade-connected data saving means for sequentially acquiring thereinto input data in response to a first one-shot pulse signal produced from both a rise edge of a data strobe signal and a fall edge of the data strobe signal, the data strobe signal being outputted in a time period during which two sets of the input data are entered into the semiconductor memory device;

a second set of two data saving means for simultaneously acquiring thereinto the two sets of input data which have been acquired into the first set of two data saving means in response to a timing signal having a time period two times longer than that of the first one-shot pulse signal;

a third set of two data saving means for simultaneously acquiring thereinto the two sets of input data which have been acquired into the second set of two data saving means in response to a second one-shot pulse signal produced from at least one of a rise edge of a clock signal and a fall edge of the clock signal; and data writing means for writing the two sets of input data which have been acquired into the third set of two data saving means into a memory cell in a parallel manner.

In the foregoing, a preferable mode is one wherein this semiconductor memory device is further comprised of: means for producing the timing signal after the first one-shot pulse signal.

Also, it is preferable that the second set of two data saving means are constituted by a register circuit, respectively.

Also, a preferable mode is one wherein the semiconductor memory device is further comprised of: means for producing the timing signal after the first one-shot pulse signal; and the second set of two data saving means are constituted by a register circuit, respectively.

Also, it is preferable that this memory device is further comprised of delay means for delaying the timing signal so as to produce a delayed timing signal from one of the rise/fall edges of the data strobe signal; and also for delaying the second one-shot pulse signal in order to produce a delayed second one-shot pulse signal from one of rise/fall edges of a clock signal.

Also, it is preferable that the second set of two data saving means are arranged by a data latch circuit, respectively.

Moreover, according to a fourth aspect of the present invention, there is provided a semiconductor memory device comprising:

first data saving means for acquiring input data to save thereinto the acquired input data in response to one edge of rise/fall edges of a data strobe signal outputted in a time period during which two sets of the input data are entered into the semiconductor memory device;

second data saving means for acquiring the input data to save thereinto the acquired input data in response to the other edge of the rise/fall edges of the data strobe signal; and data read/write means for simultaneously reading the input data saved in both the first data saving means and the second data saving means, and for writing two sets of the simultaneously read input data into a memory cell in a parallel manner.

In addition, according to a fifth aspect of the present invention, there is provided a semiconductor memory device comprising:

a first set of two data saving means constituted by first data saving means for acquiring input data to save thereinto the acquired input data in response to a first one-shot pulse signal generated from one edge of rise/fall edges of a data strobe signal outputted in a time period during which two sets of the input data are entered into the semiconductor memory device, and second data saving means for acquiring the input data to save thereinto the acquired input data in response to a second one-shot pulse signal generated from the other edge of the rise/fall edges of the data strobe signal;

a second set of two data saving means for simultaneously acquiring thereinto the two sets of input data which have been acquired into the first set of two data saving means in response to a timing signal having the same time period as that of any one of the first and second one-shot pulse signals;

a third set of two data saving means for simultaneously acquiring thereinto the two sets of input data which have been acquired into the second set of two data saving means in response to a third one-shot pulse signal generated from at least one of a rise edge of a clock signal and a fall edge of a clock signal; and data write means for writing the two sets of input data which have been acquired into the third set of two data saving means into a memory cell in a parallel manner.

Also, a preferable mode is one wherein this semiconductor memory device is further comprised of: means for producing the timing signal after any one of the first and second one-shot pulse signals.

Also, it is preferable that the second set of two data saving means are constituted by a register circuit, respectively.

Also, it is preferable that the semiconductor memory device is further comprised of: means for producing the timing signal after any one of the first and second one-shot pulse signals; and the second set of two data saving means are constituted by a register, respectively.

Furthermore, a preferable mode is one wherein the semiconductor memory device is further comprised of: delay means for delaying the timing signal so as to produce a delayed timing signal from one of the first and second one-shot pulse signals, and also for delaying the third one-shot pulse signal so as to produce a delayed third one-shot pulse signal from any one of rise/fall edges of the clock signal.

Also, it is preferable that the second set of two data saving means are arranged by a data latch circuit, respectively.

Since the above-described semiconductor memory device employs the memory circuit arrangement as defined in the aspects of the present invention, the following featured operations can be carried out. That is, in the DDR-SDRAM with employment of the data strobe signal DS, after the input data is latched by employing the one-shot pulse signal produced from this data strobe signal, this latched input data is again latched by using another one-shot pulse signal generated from the clock signal. As a result, while the input data which has been acquired by the data strobe signal control is converted into the clock signal control, the sufficient latch margin of the input data can be secured by controlling the delay amounts of the respective one-shot pulse signals. At this stage, since the control operation by the clock signal is carried out by way of the one-shot pulse signal produced from the clock signal, the dependent characteristic of the clock signal with respect to the duty ratio (namely, ratio of high-level width to low-level width) can be canceled.

BRIEF DESCRIPTION OF THE DRAWINGS

The above and other objects, advantages and features of the present invention will be more apparent from the following description taken in conjunction with the accompanying drawings in which:

FIG. 12 is an explanatory diagram for explaining a latch margin of the third semiconductor memory device in the case that the data strobe signal owns the latest timing;

FIG. 19 is an explanatory diagram for explaining a latch margin of the fifth semiconductor memory device in the case that the data strobe signal owns the latest timing;

FIG. 23, diagrams a and b are schematic block diagrams for indicating another electric circuit arrangement of the semiconductor memory device according to the seventh embodiment of the present invention;

FIG. 32 is an explanatory diagram for explaining a latch margin of the ninth semiconductor memory device in the case that the data strobe signal owns the earliest timing;

FIG. 33 is an explanatory diagram for explaining a latch margin of the ninth semiconductor memory device in the case that the data strobe signal owns the latest timing;

DESCRIPTION OF THE PREFERRED EMBODIMENTS

Referring to drawings, various preferred embodiments of the present invention will be described in detail.

CIRCUIT ARRANGEMENT/TIMING CHART OF FIRST SEMICONDUCTOR MEMORY DEVICE

Figure 3:
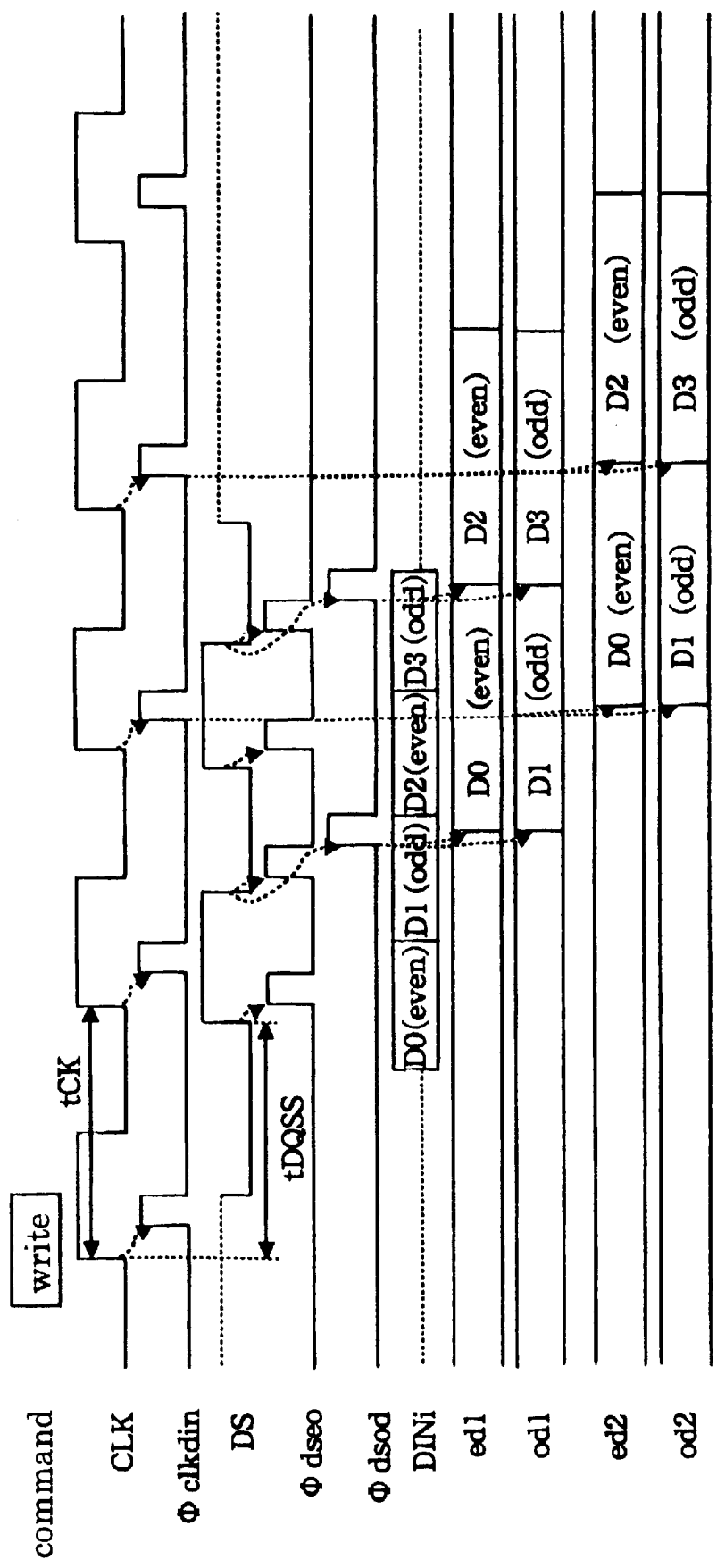
FIG. 3 is a timing chart for explaining operations of the semiconductor memory device according to the first embodiment.
Figure 4:
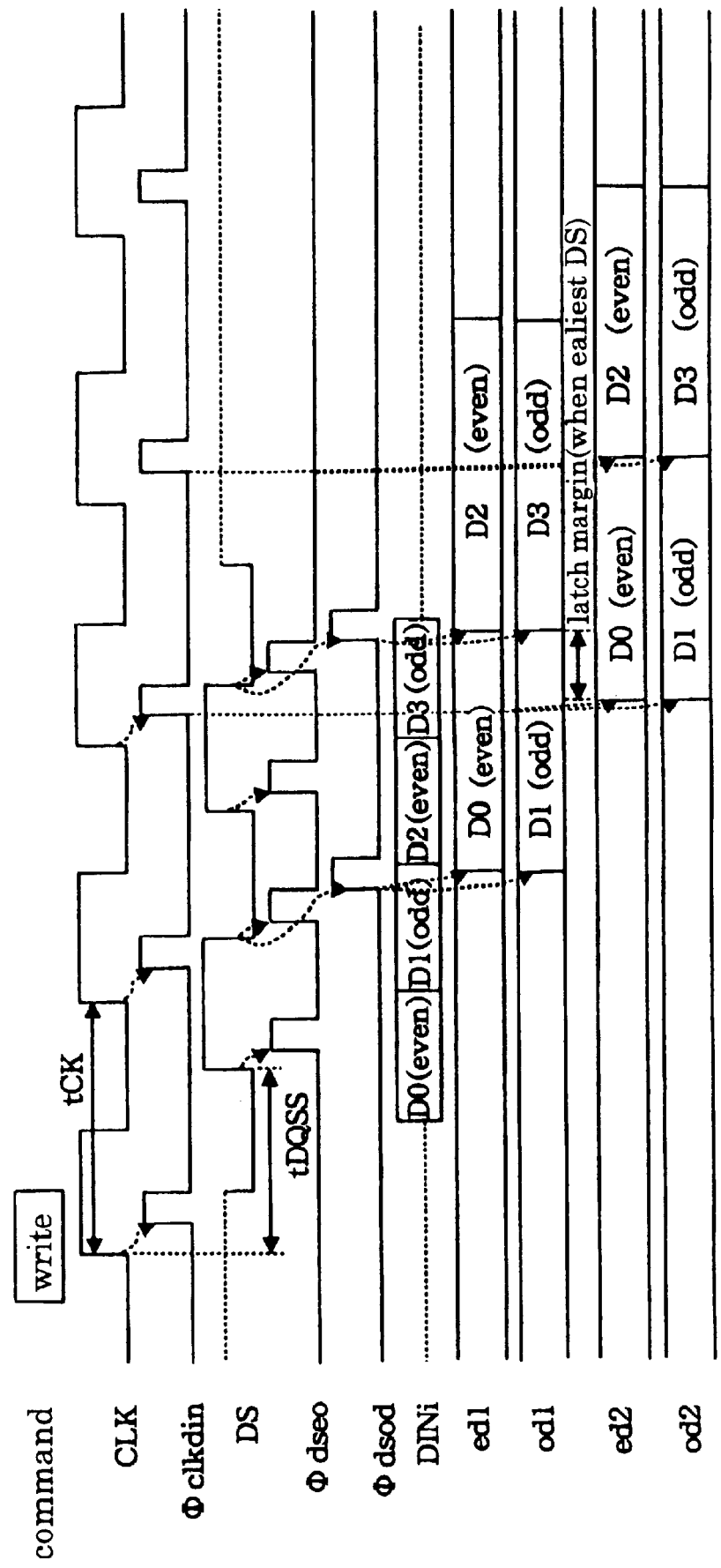
FIG. 4 is an explanatory diagram for explaining a latch margin of the first semiconductor memory device in the case that the data strobe signal owns the earliest timing.
Figure 5:
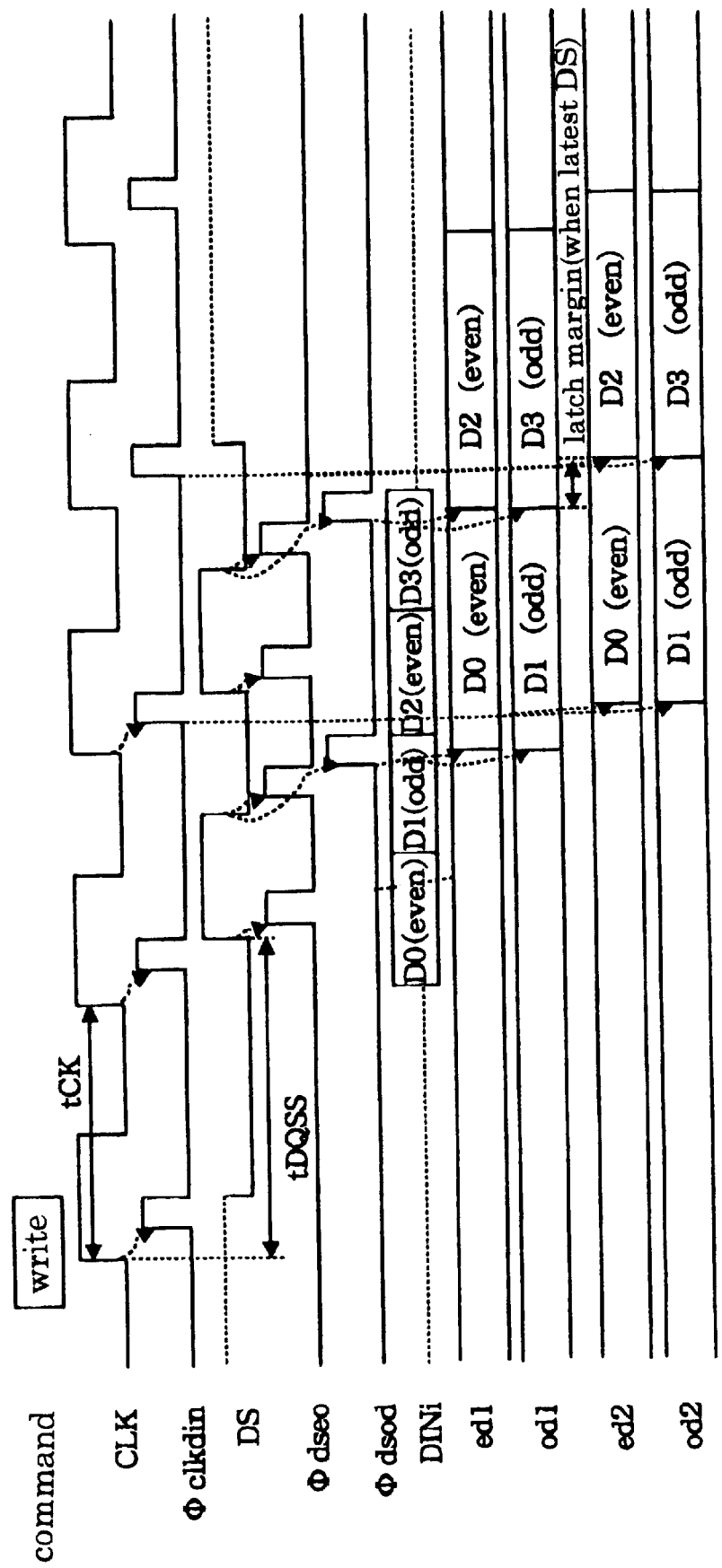
FIG. 5 is an explanatory diagram for explaining a latch margin of the first semiconductor memory device in the case that the data strobe signal owns the latest timing.

FIG. 1 and FIG. 2 are schematic block diagrams for representing an electric circuit arrangement of a semiconductor memory device according to a first embodiment of the present invention. FIG. 3 is a timing chart for explaining operations of the semiconductor memory device according to the first embodiment. FIG. 4 is an explanatory diagram for explaining a latch margin of the first semiconductor memory device in the case that the data strobe signal owns the earliest timing. FIG. 5 is an explanatory diagram for explaining a latch margin of the first semiconductor memory device in the case that the data strobe signal owns the latest timing.

As schematically shown in FIG. 1 and FIG. 2, this semiconductor memory device of the first embodiment is mainly arranged by a data strobe signal circuit 11, a clock signal circuit 12, and a data-in circuit 13.

Figure 1A:
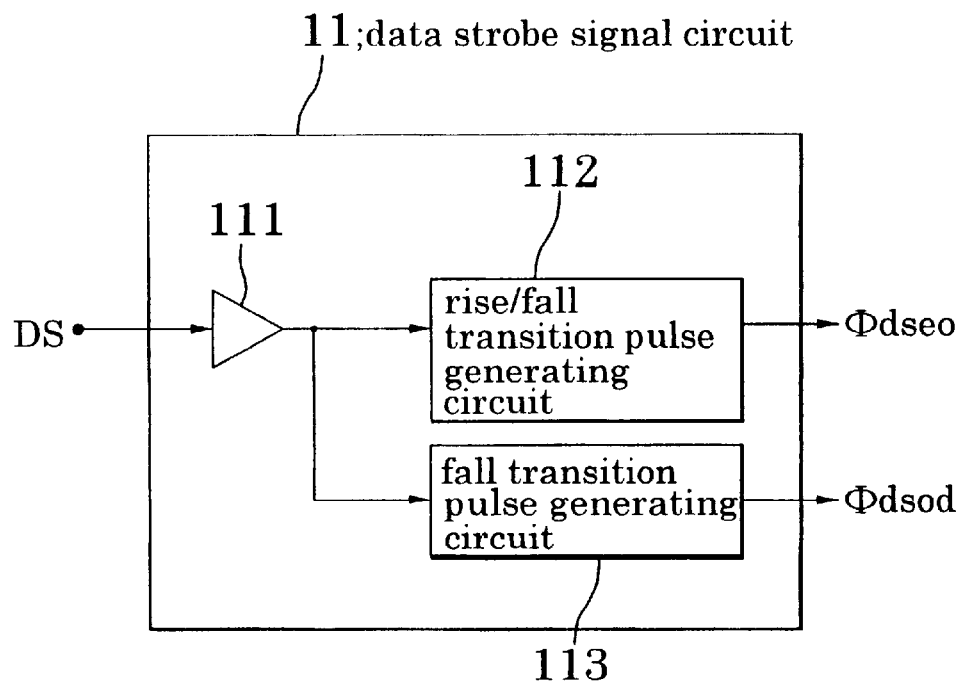
FIG. 1, diagrams a and b are schematic block diagrams for showing an electric circuit arrangement of a semiconductor memory device according to a first embodiment of the present invention.

Precisely speaking, as shown in FIG. 1(a), the data strobe signal circuit 11 contains an input buffer 111, a rise/fall transition pulse generating circuit 112, and a fall transition pulse generating circuit 113.

The input buffer 111 supplies a data strobe signal DS to both the rise/fall transition pulse generating circuit 112 and the fall transition pulse generating circuit 113. The rise/fall transition pulse generating circuit 112 detects both a rise edge and a fall edge of an output signal from the input buffer 111 to thereby generate an one-shot pulse signal "Φdseo". The fall transition pulse generating circuit 113 detects the fall edge of the output signal from the input buffer 111 to thereby generate an one-shot pulse signal "Φdsod".

Figure 1B:
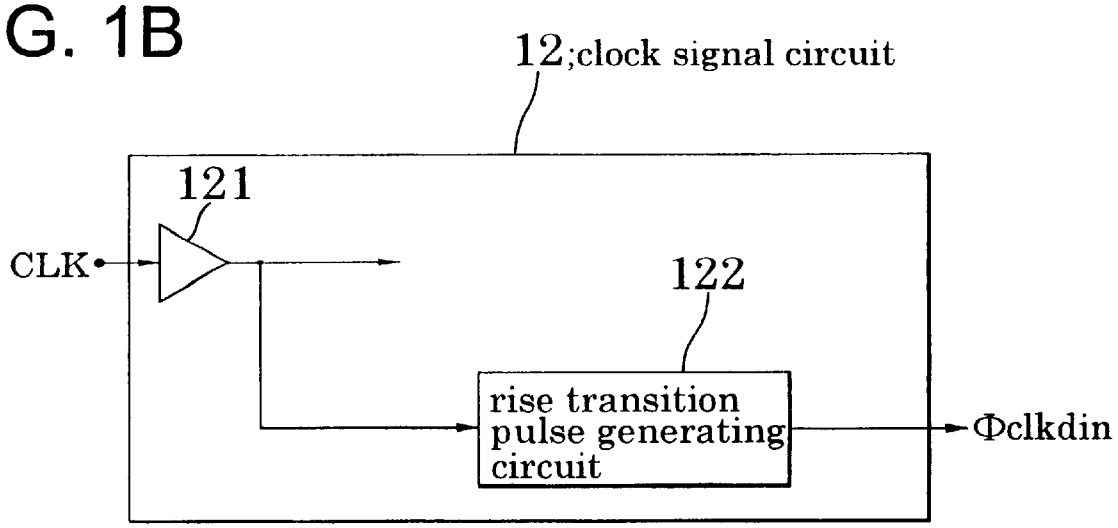

As indicated in FIG. 1(b), the clock signal circuit 12 contains an input buffer 121 and a rise transition pulse generating circuit 122.

The input buffer 121 supplies a clock signal CLK to the rise transition pulse generating circuit 122. The rise transition pulse generating circuit 122 detects a rise edge of an output signal from the input buffer 121 to thereby produce an one-shot pulse signal "Φclkdin".

Figure 2A:
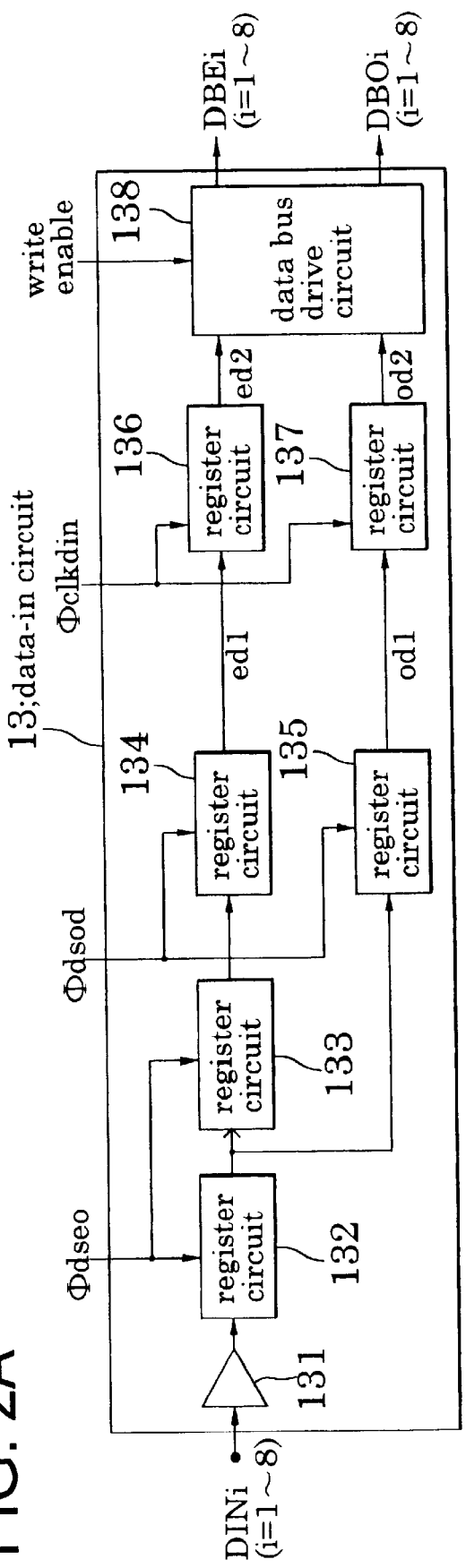
FIG. 2, diagrams a and b are schematic block diagrams for indicating another electric circuit arrangement of the semiconductor memory device according to the first embodiment of the present invention.

As shown in FIG. 2(a), the data-in circuit 13 contains an input buffer 131, register circuits 132, 133, 134, 135, 136, 137, and also a data bus drive circuit 138.

The input buffer 131 supplies a data input signal DINi (i=1 to 8) to the register circuit 132. The register circuit 132 acquires an output signal derived from the input buffer 131 in response to the one-shot pulse "Φdseo". The register circuit 133 acquires an output signal derived from the register circuit 132 in response to the next one-shot pulse signal "Φdseo". Both the register circuit 134 and the register circuit 135 acquire the output signals derived from the register circuits 132 and 133 in response to the one-shot pulse signal "Φdsod" to thereby generate output signals "ed1" and "od1", respectively. Also, both the register circuit 136 and the register circuit 137 acquire the output signals derived from the register circuits 134 and 135 in response to the one-shot pulse signal "Φclkdin" to thereby generate output signals "ed2" and "od2", respectively. The data bus drive circuit 138 supplies both the output data "ed2" derived from the register circuit 136 and the output data "od2" derived from the register circuit 137 in a parallel manner to even-numbered data buses DBEi (i=1 to 8) and also odd-numbered data buses DBOi (i=1 to 8), so that the input data may be written into a memory cell (not shown).

Figure 2B:
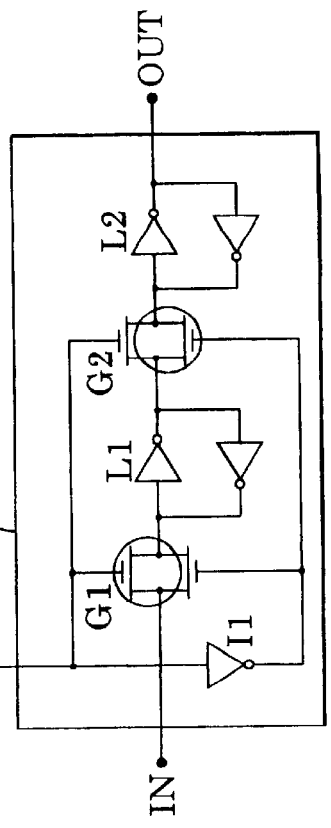
Figure 37A:
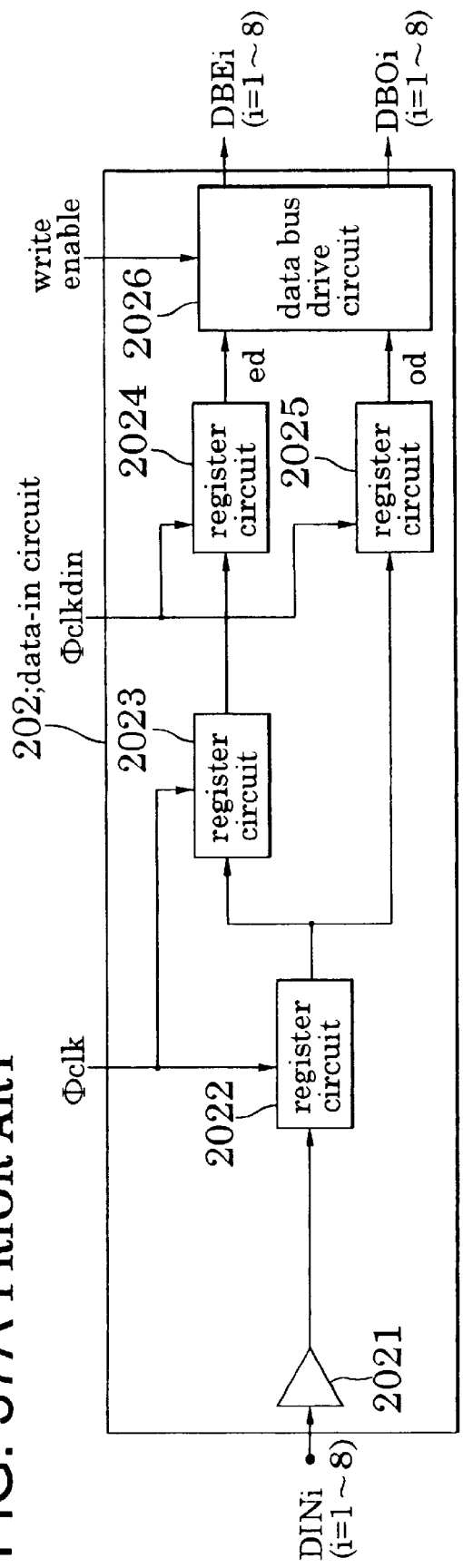
FIG. 37, diagrams a and b are schematic block diagrams for showing another electric circuit arrangement of the first prior art.
Figure 37B:
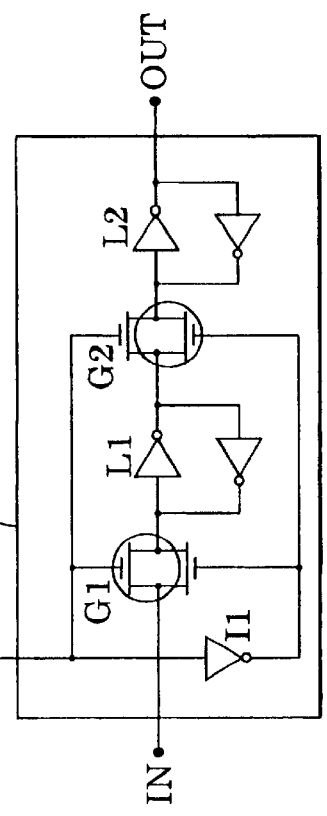
Figure 38:
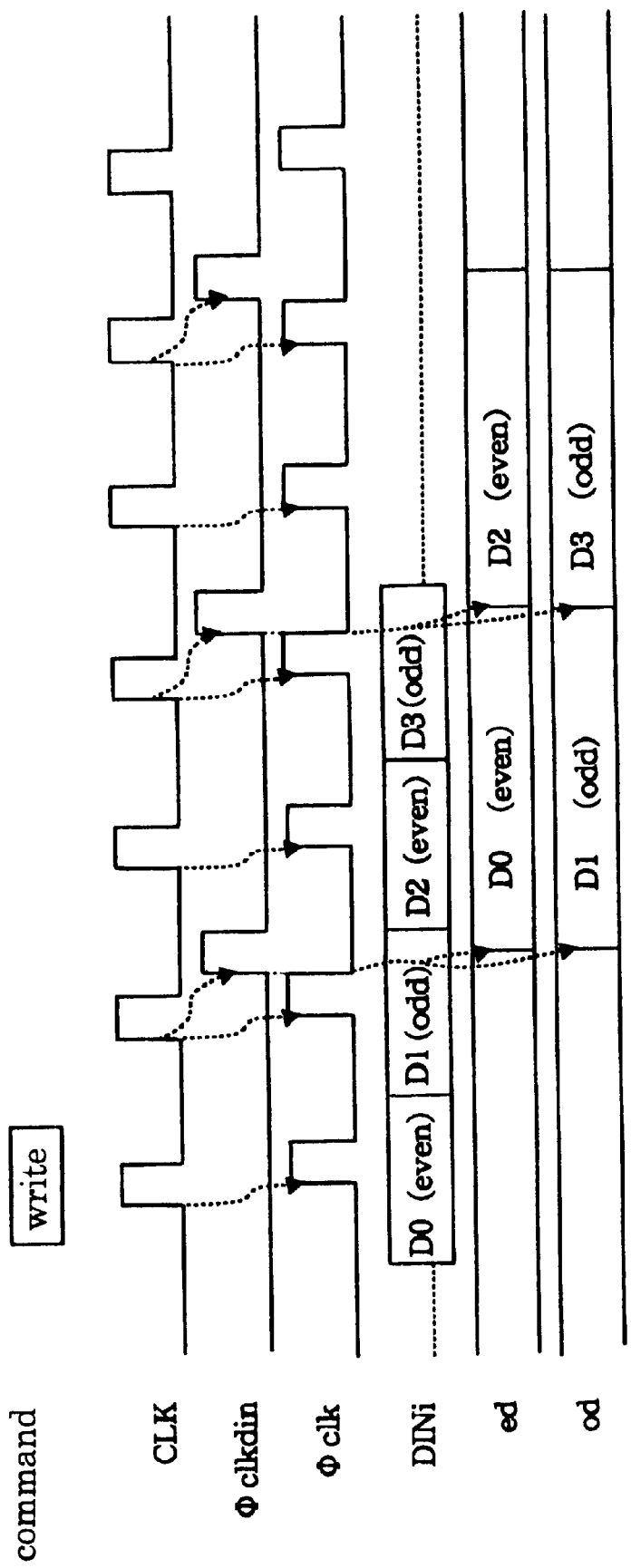
FIG. 38 is a timing chart for explaining operations of the first prior art.

It should be understood in this first embodiment that all of these register circuits 132, 133, 134, 135, 136, and 137 own the same circuit arrangements as a circuit arrangement of a register circuit 14 shown in FIG. 2(b). This register circuit 14 owns the same arrangement/function as those of the register circuit 203 indicated in FIG. 37(b).

OPERATION OF FIRST SEMICONDUCTOR MEMORY DEVICE

Next, operation of this semiconductor memory device according to the first embodiment will be described with reference to FIG. 1 to FIG. 5. In the data strobe signal circuit 11 shown in FIG. 1(a), both the rise edge of the data strobe signal DS and the fall edge thereof are detected so as to generate the one-shot pulse signal "Φdseo", and furthermore, the fall edge of this data strobe signal DS is detected in order to generate the one-shot pulse signal "Φdsod". On the other hand, in the clock signal circuit 12 shown in FIG. 1(b), the rise edge of the clock signal CLK is detected so as to produce the one-shot pulse signal "Φclkdin". In the data-in circuit 13 shown in FIG. 2(a), in response to the one-shot pulse signal "Φdseo" produced by detecting the rise/fall transition of the data strobe signal DS, the data input signals DINi are sequentially acquired one by one into the register circuits 132 and 133. Next, two sets (pieces) of data acquired by the register circuits 132 and 133 are simultaneously acquired by the register circuits 134 and 135 in response to another one-shot pulse signal "Φdsod" produced by detecting the fall transition of the data strobe signal DS. At this stage, in order to avoid mis-latching operation, the second-mentioned one-shot pulse signal "Φdsod" is delayed in such a manner that this one-shot pulse signal "Φdsod" is produced after the first-mentioned one-shot pulse signal "Φdseo"

Thereafter, both the data "ed1" and "od1" acquired by the register circuits 134 and 135 are transferred to the next register circuits 136 and 137 in response to the one-shot pulse signal "Φclkdin" produced by detecting the rise transition of the clock signal CLK. Assuming now that the clock period is selected to be "tCK", the technical standard "tDQSS" indicative of a timing difference between the clock signal CLK and the data strobe signal DS is located within a range from, for example, 0.75 tCK (minimum tDQSS) up to 1.25 tCK (maximum tDQSS). As a consequence, as represented in FIG. 4 and FIG. 5, in such two cases of 0.75 tCK and 1.25 tCK, a margin must be secured, or ensured with respect to the mis-latching operation. In this first embodiment, in the timing chart of FIG. 4, the latch margin can be secured by selecting the signal generation timing between the one-shot pulse signal "Φdsod" generating unit and the one-shot pulse signal "Φclkdin" generating unit even under such a condition that the data strobe signal DS owns the earliest timing. Also, in FIG. 5, this timing chart represents that the latch margin can be secured even under such a condition that the data strobe signal owns the latest timing.

As previously described, in accordance with the first semiconductor memory device having the above-described circuit arrangement, it is possible to secure the latch margin when the input data acquired by controlling the data strobe signal DS is converted into the control of the clock signal CLK. In this embodiment, this first semiconductor memory device can be applied in such a case that the technical standard tDQSS indicative of the timing difference between the clock signal CLK and the data strobe signal DS is relatively close to the reference value (1 tCK).

Furthermore, in this embodiment, since the control operation by the clock signal CLK is carried out by the one-shot pulse signal "Φclkdin", the dependent characteristic of this clock signal CK with respect to the duty ratio can be canceled.

CIRCUIT ARRANGEMENT OF SECOND SEMICONDUCTOR DEVICE

Figure 6A:
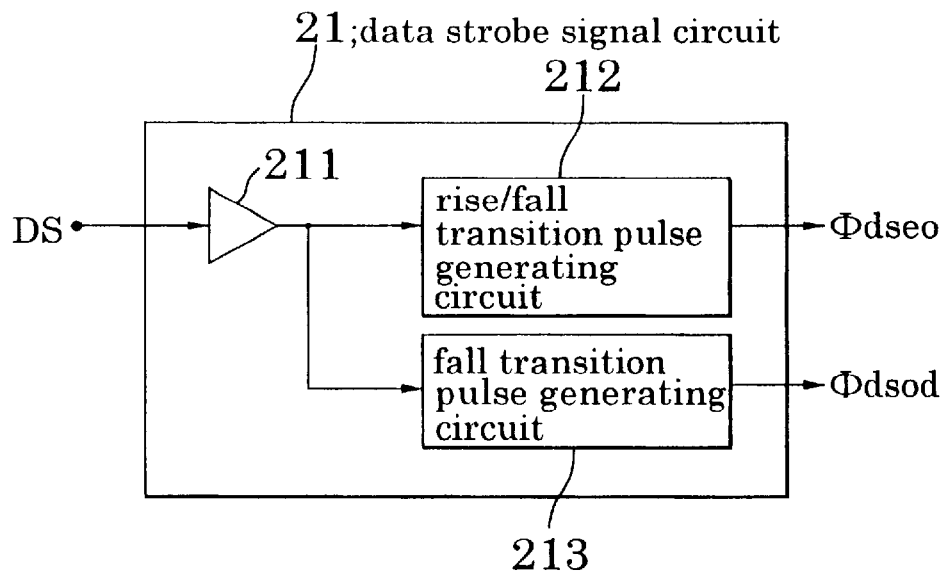
FIG. 6, diagrams a and b are schematic block diagrams for showing an electric circuit arrangement of a semiconductor memory device according to a second embodiment of the present invention.
Figure 6B:
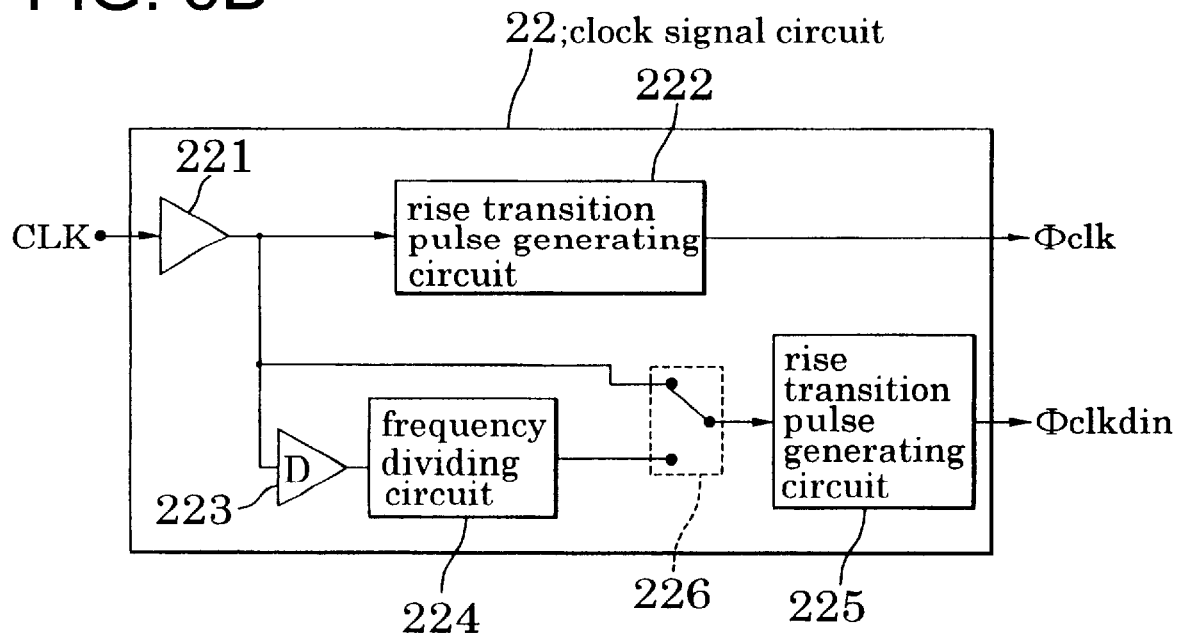
Figure 7:
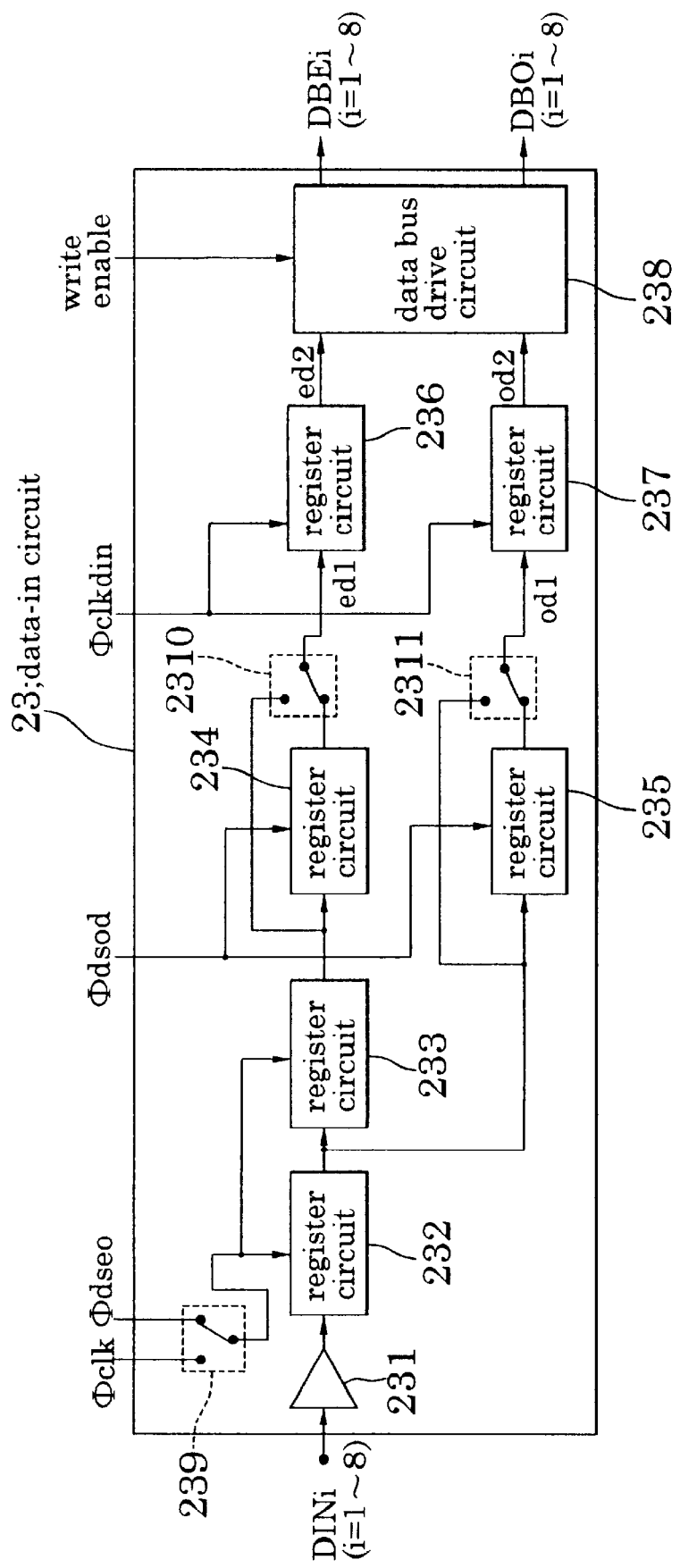
FIG. 7 is a schematic block diagram for indicating another electric circuit arrangement of the semiconductor memory device according to the second embodiment of the present invention.

FIG. 6 and FIG. 7 are schematic block diagrams for showing an electric circuit arrangement of a semiconductor memory device according to a second embodiment of the present invention.

This semiconductor memory device of the second embodiment is mainly arranged by a data strobe signal circuit 21, a clock signal circuit 22, and a data-in circuit 23.

As indicated in FIG. 6(a), the data strobe signal circuit 21 contains an input buffer 211, a rise/fall transition pulse generating circuit 212, and a fall transition pulse generating circuit 213.

The input buffer 211, the rise/fall transition pulse generating circuit 212, and the fall transition pulse generating circuit 213 employed in the second semiconductor memory device indicated in FIG. 6(a) own the same circuit arrangements and functions as those of the input buffer 111, the rise/fall transition pulse generating circuit 112, and the fall transition pulse generating circuit 213 employed in the first semiconductor memory device shown in FIG. 1(a).

As a result, the data strobe signal circuit 21 of the second embodiment owns the same function as that of the data strobe signal circuit 11 of the first embodiment.

As indicated in FIG. 6(b), the clock signal circuit 22 contains an input buffer 221, a rise transition pulse generating circuit 222, a delay circuit 223, a frequency dividing circuit 224, a rise transition pulse generating circuit 225, and a switch circuit 226.

Figure 36:
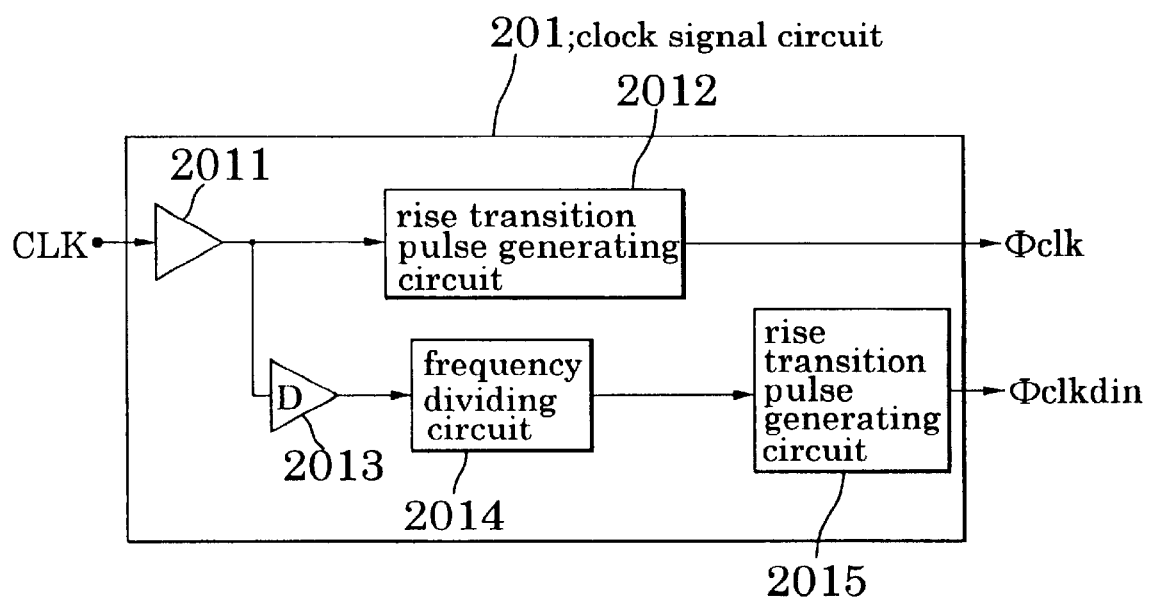
FIG. 36 is a schematic block diagram for representing one electric circuit arrangement of the first prior art semiconductor memory device.

The input buffer 221 and the rise transition pulse generating circuit 225 own the same circuit arrangements and functions as those of the input buffer 121 and the rise transition pulse generating circuit 122, as shown in FIG. 1(b), respectively. The input buffer 221, the rise transition pulse generating circuit 222, the delay circuit 223, the frequency dividing circuit 224, and the rise transition pulse generating circuit 225, employed in the second semiconductor memory device, have the same circuit arrangements and functions as those of the input buffer 2011, the rise transition pulse generating circuit 2012, the delay circuit 2013, the frequency dividing circuit 2014, and the rise transition pulse generating circuit 2015, employed in the first prior art memory device shown in FIG. 36. Accordingly, the clock signal circuit 22 may have the same function as that of the clock signal circuit 12 according to the first embodiment under such a condition that the switch circuit 226 is connected as shown in FIG. 6(b). To the contrary, when this switch circuit 226 is switched from the present connection state, the clock signal circuit 22 may have the same function as that of the clock signal circuit 201 employed in the first prior art.

As indicated in FIG. 7, the data-in circuit 23 contains an input buffer 231, register circuits 232, 233, 234, 235, 236, and 237, a data bus drive circuit 238, and also switch circuits 239, 2310, and 2311.

The input buffer 231, the register circuits 232, 233, 234, 235, 236, 237, and the data bus drive circuit 238 employed in the second embodiment own the same circuit arrangements and functions as those of the input buffer 131, the register circuits 132, 133, 134, 135, 136, 137, and the data bus drive circuit 138, employed in the first embodiment of FIG. 2(a), respectively. Also, the input buffer 231, the register circuits 232, 233, 236, 237, and the data bus drive circuit 238 employed in the second embodiment own the same circuit arrangements and functions as those of the input buffer 2021, the register circuits 2022, 2023, 2024, 2025, and the data bus drive circuit 2026, employed in the second prior art of FIG. 37(a), respectively.

As a result, the data-in circuit 23 may own the same function as that of the data-in circuit 13 of the first embodiment under such a condition that the switch circuits 239, 2310, 2311 are connected as shown in FIG. 7. To the contrary, when these switch circuits 239, 2310, 2311 are switched from the present connection state, this data-in circuit 23 of the second embodiment may have the same function as the data-in circuit 202 of the first prior art.

OPERATION OF SECOND SEMICONDUCTOR MEMORY DEVICE

As previously explained, in accordance with the second semiconductor memory device having the above-described circuit arrangement, the memory operation effected in the first semiconductor memory device and the memory operation effected in the first prior art memory device can be properly switched, depending upon the switching conditions of these switch circuits 226, 239, 2310, and 2311 employed in this second memory device.

It should also be understood that these switch circuits 226, 239, and 2310 may be switched to any switching position in a fixing manner by setting bonding option. As a consequence, in accordance with the second semiconductor memory device, since any one of the first semiconductor memory device and the first prior art memory device can be arbitrarily and readily selected, there is a great merit in the production plan of semiconductor memory devices in such a transition stage that sorts of devices into which desirable semiconductor memory devices should be assembled are switched.

CIRCUIT ARRANGEMENT/TIMING CHART OF THIRD SEMICONDUCTOR MEMORY DEVICE

Figure 8A:
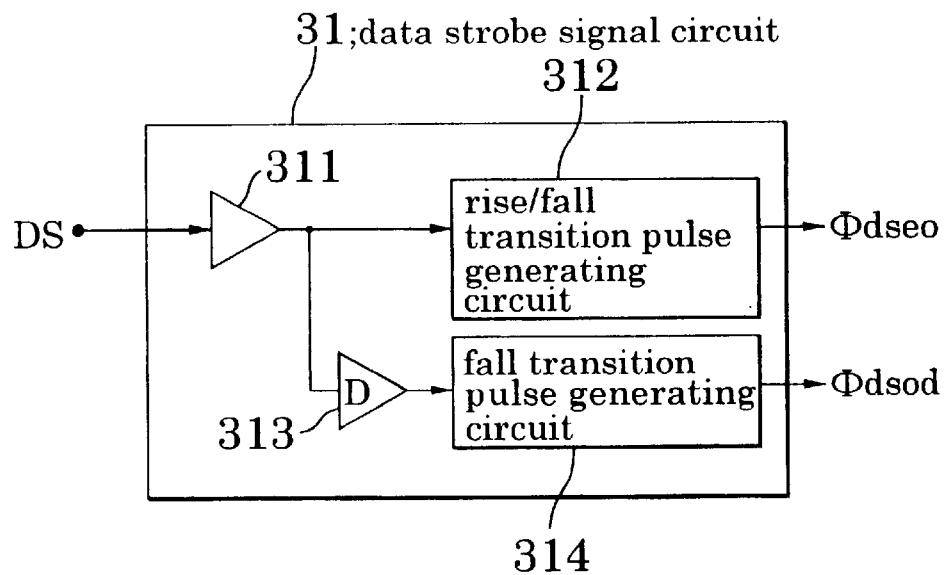
FIG. 8, diagrams a and b are schematic block diagrams for showing an electric circuit arrangement of a semiconductor memory device according to a third embodiment of the present invention.
Figure 8B:
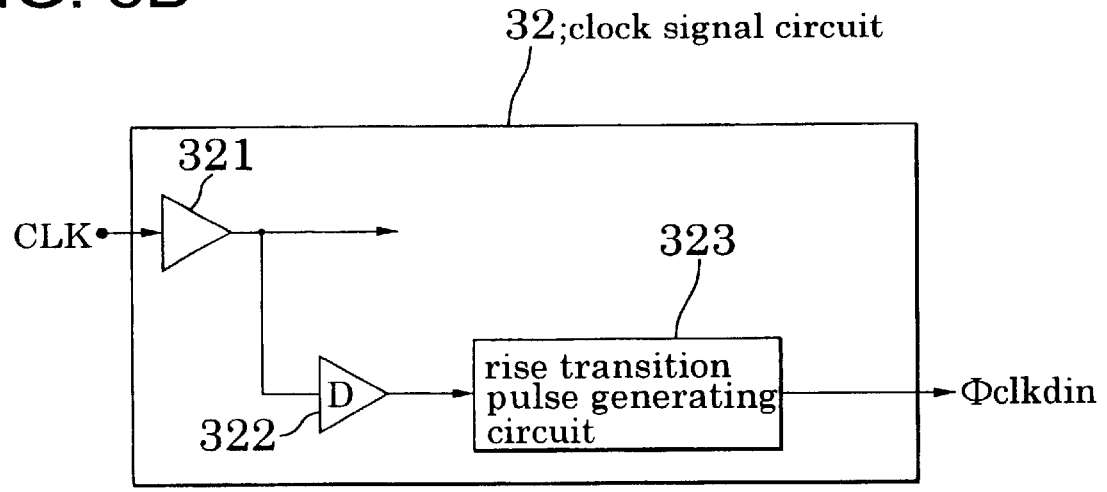
Figure 9A:
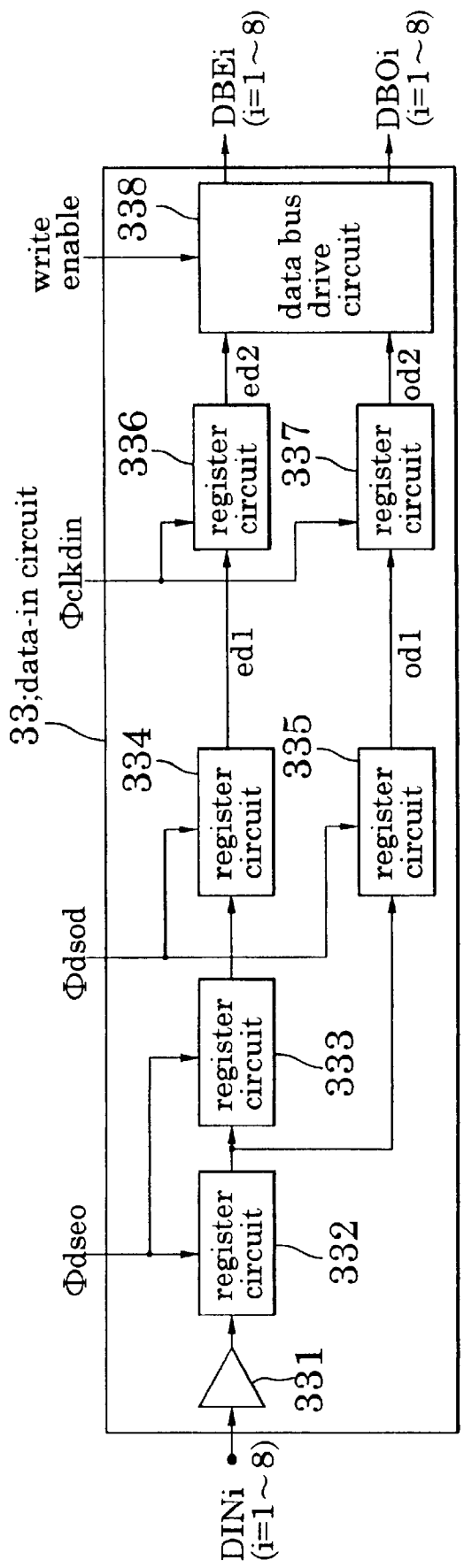
FIG. 9, diagrams a and b are schematic block diagrams for indicating another electric circuit arrangement of the semiconductor memory device according to the third embodiment of the present invention.
Figure 9B:
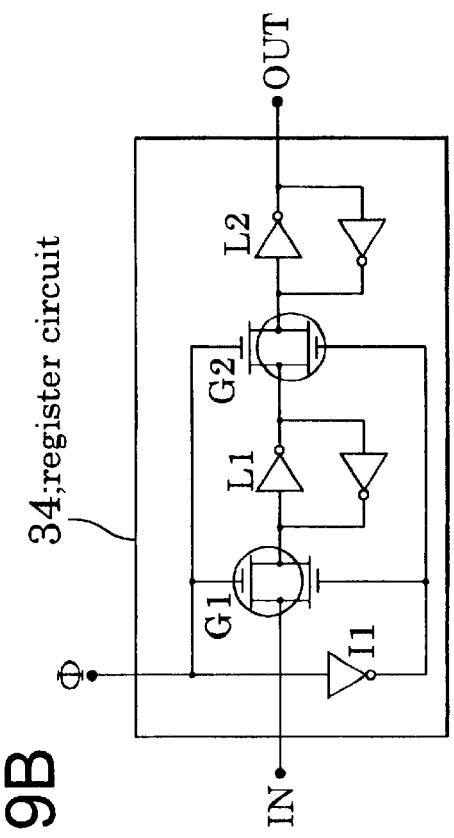
Figure 10:
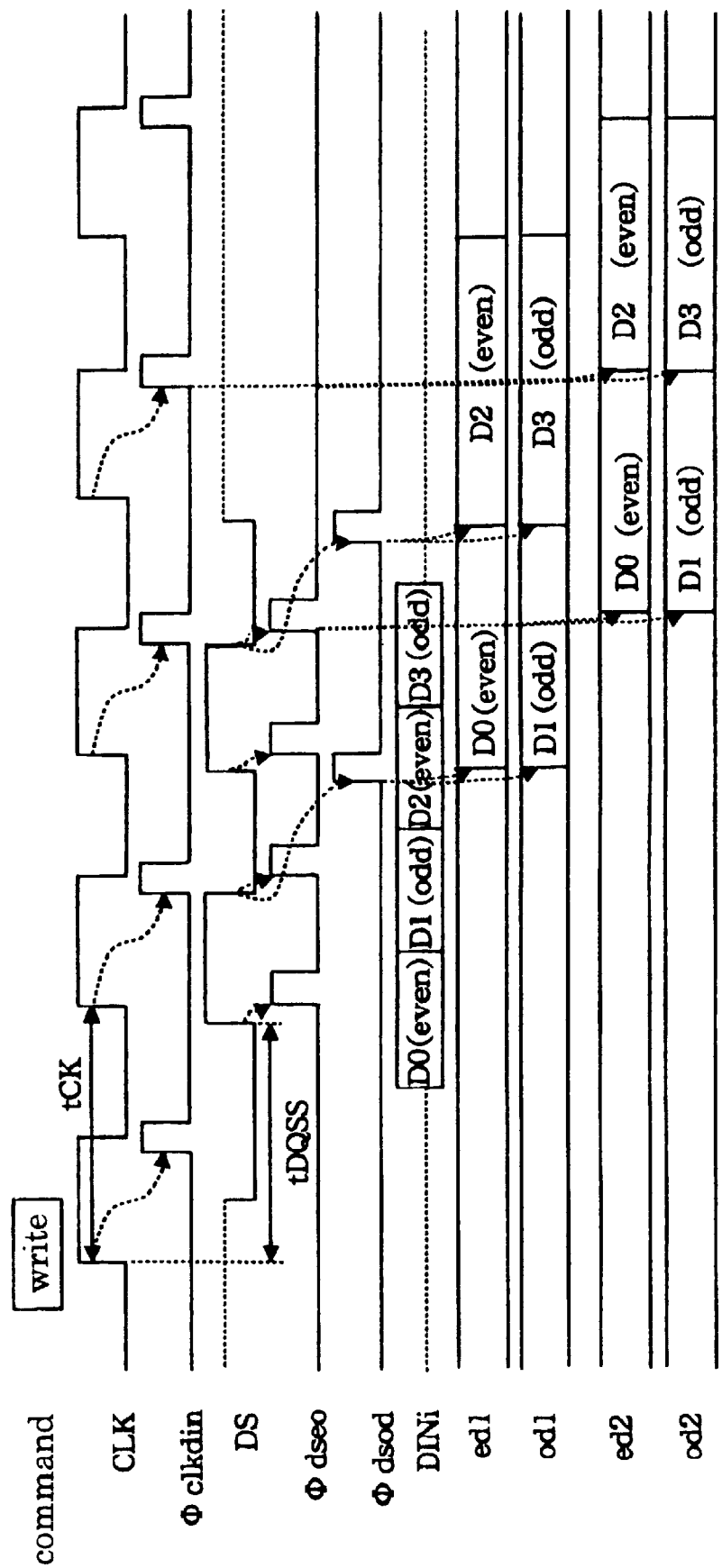
FIG. 10 is a timing chart for explaining operations of the semiconductor memory device according to the third embodiment.
Figure 11:
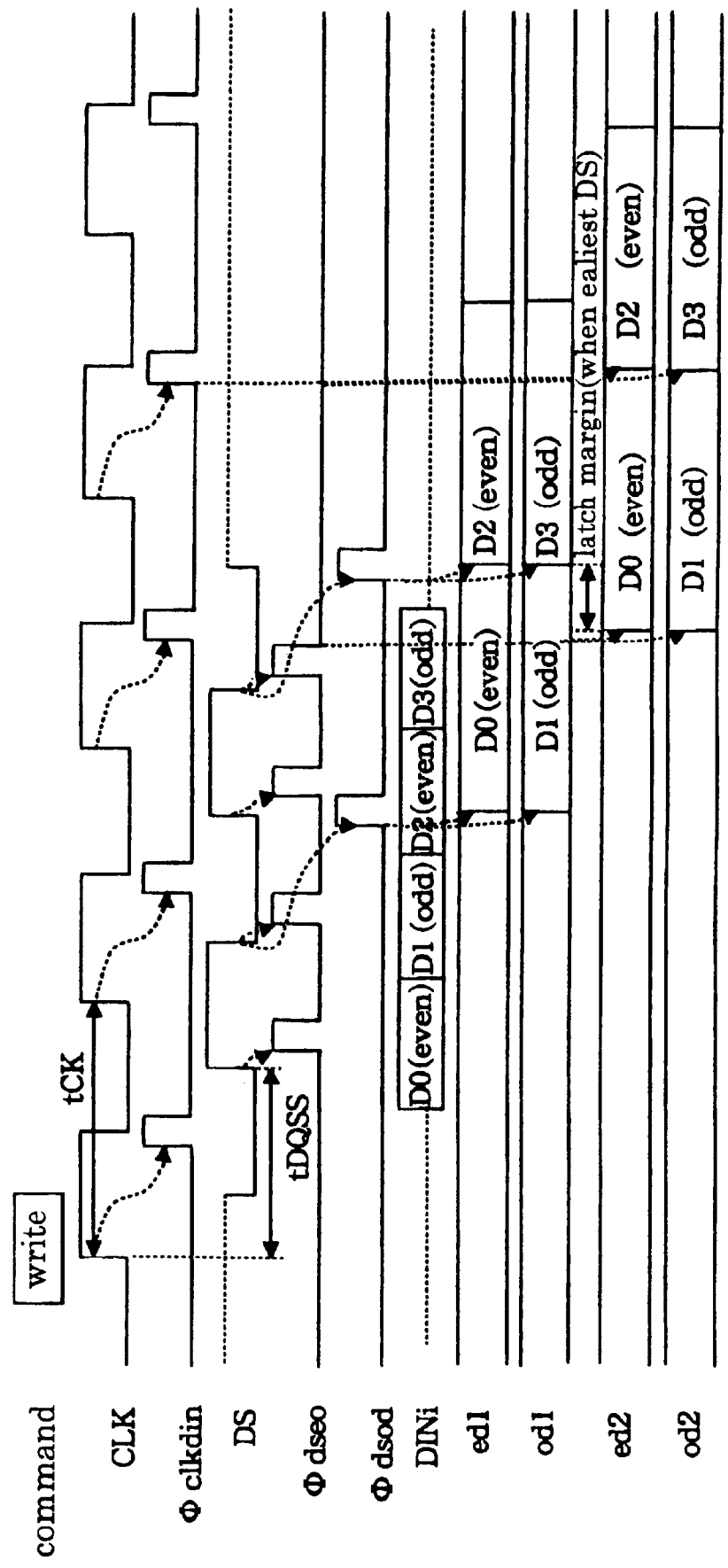
FIG. 11 is an explanatory diagram for explaining a latch margin of the third semiconductor memory device in the case that the data strobe signal owns the earliest timing.

FIG. 8 and FIG. 9 are schematic block diagrams for representing an electric circuit arrangement of a semiconductor memory device according to a third embodiment of the present invention. FIG. 10 is a timing chart for explaining operations of the semiconductor memory device according to the third embodiment. FIG. 11 is an explanatory diagram for explaining a latch margin of the third semiconductor memory device in the case that the data strobe signal owns the earliest timing. FIG. 12 is an explanatory diagram for explaining a latch margin of the third semiconductor memory device in the case that the data strobe signal owns the latest timing.

As schematically shown in FIG. 8 and FIG. 9, this semiconductor memory device of the third embodiment is mainly arranged by a data strobe signal circuit 31, a clock signal circuit 32, and a data-in circuit 33.

Precisely speaking, as shown in FIG. 8(a), the data strobe signal circuit 31 contains an input buffer 311, a rise/fall transition pulse generating circuit 312, a delay circuit 313, and a fall transition pulse generating circuit 314.

The input buffer 311, the rise/fall transition pulse generating circuit 312, and the fall transistor pulse generating circuit 314, employed in this third semiconductor memory device, own the same circuit arrangements and functions as those of the input buffer 111, the rise/fall transition pulse generating circuit 112, and the fall transition pulse generating circuit 113, employed in the first semiconductor memory device shown in FIG. 1(a). Also, the delay circuit 313 delays an output signal derived from the input buffer 311 by preselected delay time to supply the delayed signal to the fall transition pulse generating circuit 314. As a result, in the data strobe signal circuit 31 of this third embodiment, the generation timing of the one-shot pulse signal "Φdsod" with respect to another one-shot pulse signal "Φdsed" is delayed by the preselected time, as compared with the generation timing of the first embodiment.

The clock signal circuit 32 contains an input buffer 321, a delay circuit 322, and a rise transition pulse generating circuit 323, as represented in FIG. 8(b).

The input buffer 321, and the rise transition pulse generating circuit 323, employed in this third semiconductor memory device, own the same circuit arrangements and functions as those of the input buffer 121, and the rise transition pulse generating circuit 122, employed in the first semiconductor memory device shown in FIG. 1(b). Also, the delay circuit 322 delays an output signal derived from the input buffer 321 by preselected delay time to supply the delayed signal to the rise transition pulse generating circuit 323. As a result, in the clock signal circuit 32 of this third embodiment, the generation timing of the one-shot pulse signal "Φclkdin" is delayed by the preselected time, as compared with the generation timing of the first embodiment.

As shown in FIG. 9, the data-in circuit 33 contains an input buffer 331, register circuits 332, 333, 334, 335, 336, and 337, and also a data bus drive circuit 338.

The input buffer 331, the register circuits 332, 333, 334, 335, 336, 337, and the data bus drive circuit 338 employed in the third embodiment own the same circuit arrangements and functions as those of the input buffer 131, the register circuits 132, 133, 134, 135, 136, 137, and the data bus drive circuit 138, employed in the first embodiment of FIG. 2(a), respectively.

OPERATION OF THIRD SEMICONDUCTOR MEMORY DEVICE

Next, operation of this semiconductor memory device according to the third embodiment will be described with reference to FIG. 8 to FIG. 12. In the data strobe signal circuit 31 shown in FIG. 8(a), both the rise edge of the data strobe signal DS and the fall edge thereof are detected so as to generate an one-shot pulse signal "Φdseo", and furthermore, the fall edge of this data strobe signal DS is detected in order to generate another one-shot pulse signal "Φdsod". On the other hand, in the clock signal circuit 32 shown in FIG. 8(b), the rise edge of the delayed clock signal CLK is detected so as to produce a further one-shot pulse signal "Φclkdin".

In the data-in circuit 33 shown in FIG. 9, in response to the one-shot pulse signal "Φdseo" produced by detecting the rise/fall transition of the data strobe signal DS, the data input signals DINi are sequentially acquired one by one into the register circuits 332 and 333. Next, two sets (pieces) of data acquired by the register circuits 332 and 333 are simultaneously acquired by the register circuits 334 and 335 in response to another one-shot pulse signal "Φdsod" produced by detecting the fall transition of the data strobe signal DS. At this stage, in order to avoid mis-latching operation, the second-mentioned one-shot pulse signal "Φdsod" is delayed in such a manner that this one-shot pulse signal "Φdsod" is produced after the first-mentioned one-shot pulse signal "Φdseo".

Thereafter, both the data "ed1" and "od1" acquired by the register circuits 334 and 335 are transferred to the next register circuits 336 and 337 in response to the one-shot pulse signal "Φclkdin" produced by detecting the rise transition of the clock signal CLK. Assuming now that the clock period is selected to be "tCK", the technical standard "tDQSS" indicative of a timing difference between the clock signal CLK and the data strobe signal DS is located within a range from, for example, 0.75 tCK (minimum tDQSS) up to 1.25 tCK (maximum tDQSS). As a consequence, as represented in FIG. 11 and FIG. 12, in such two cases of 0.75 tCK and 1.25 tCK, a margin must be secured, or ensured with respect to the mis-latching operation. To this end, both the delay amount of the delay circuit 313 in the one-shot pulse signal "Φdsod" generating unit, and the delay amount of the delay circuit 322 in the one-shot pulse signal "Φclkdin" generating unit are controlled to optimum values. As a result, in this third embodiment, the latch margin can be secured even under such a condition that the data strobe signal DS owns the earliest timing in FIG. 11. Also, in FIG. 12, the timing chart represents that the latch margin can be secured even under such a condition that the data strobe signal owns the latest timing.

As previously described, in accordance with the third semiconductor memory device having the above-described circuit arrangement, it is possible to secure the latch margin when the input data acquired by controlling the data strobe signal DS is converted into the control of the clock signal CLK. In this embodiment, this third semiconductor memory device can be applied in such a case that the technical standard "tDQSS" indicative of the timing difference between the clock signal CLK and the data strobe signal DS is large, although a total number of delay circuits used to secure the latch margin is increased.

Furthermore, in this embodiment, since the control operation by the clock signal CLK is carried out by the one-shot pulse signal "Φclkdin", the dependent characteristic of this clock signal CK with respect to the duty ratio can be canceled.

CIRCUIT ARRANGEMENT OF FOURTH SEMICONDUCTOR DEVICE

Figure 13A:
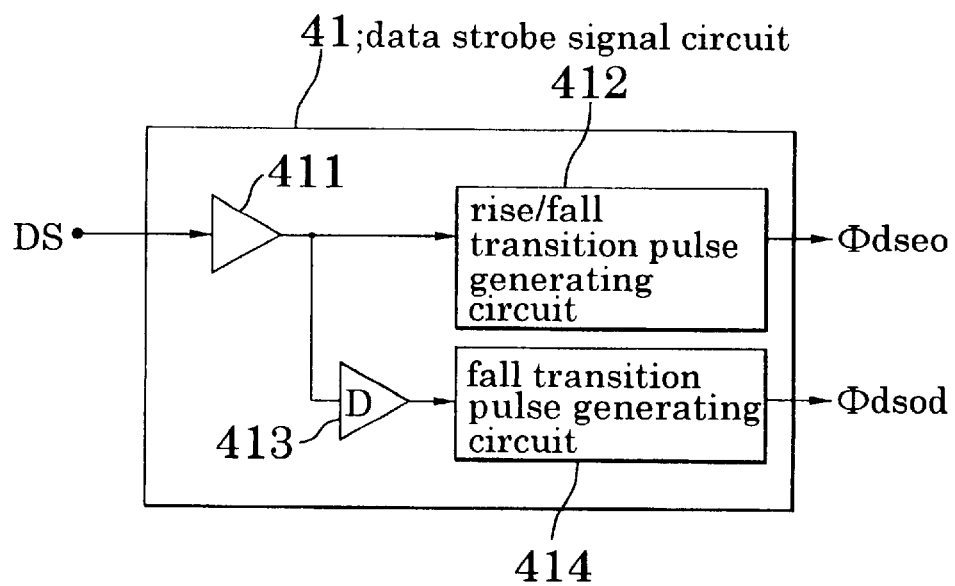
FIG. 13, diagrams a and b are schematic block diagrams for showing an electric circuit arrangement of a semiconductor memory device according to a fourth embodiment of the present invention.
Figure 13B:
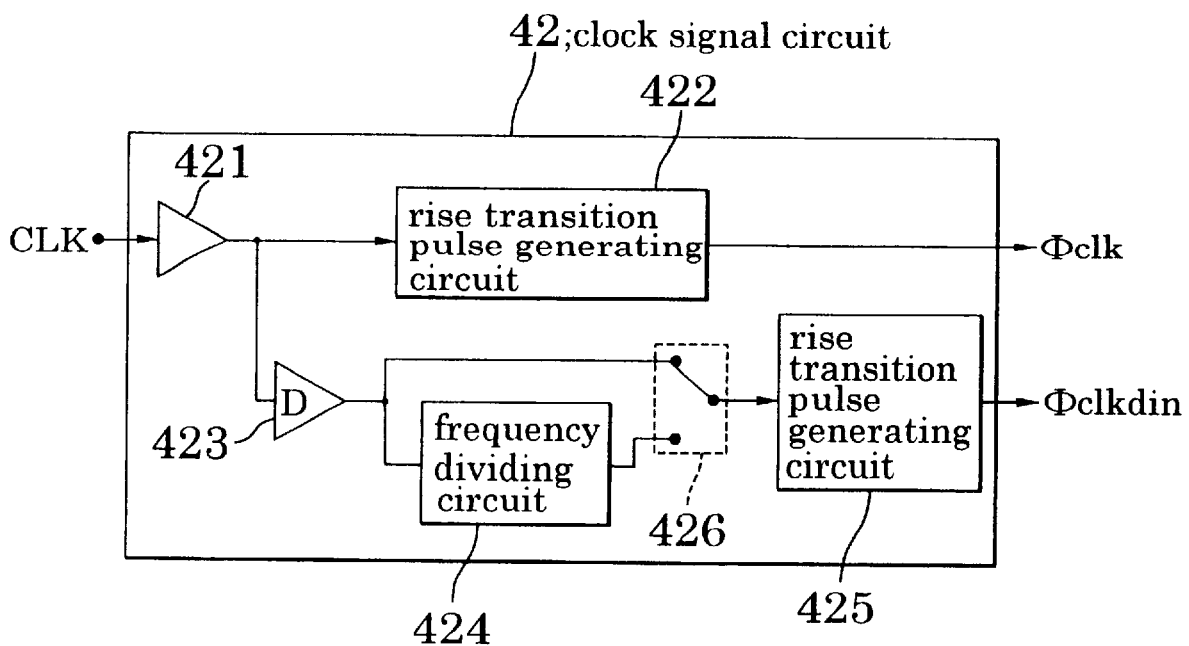
Figure 14:
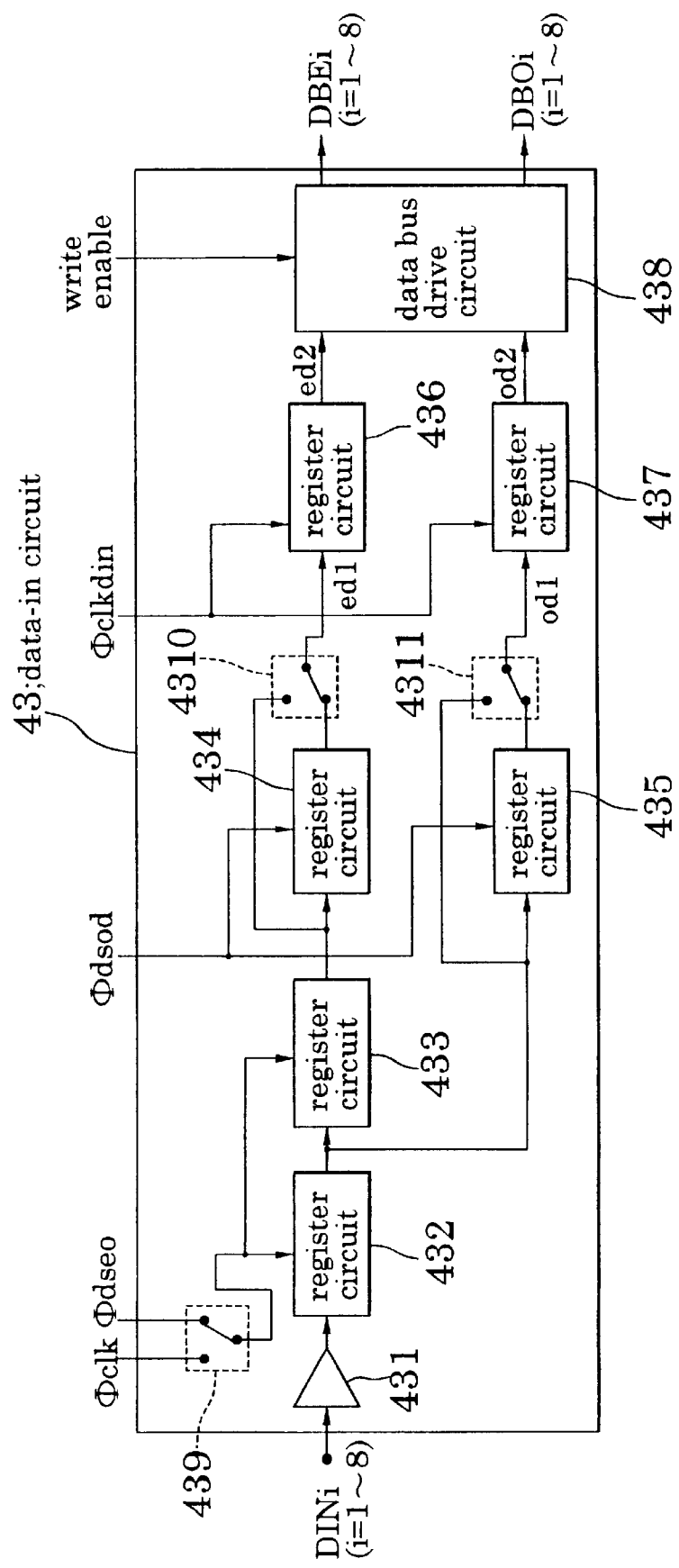
FIG. 14 is a schematic block diagram for indicating another electric circuit arrangement of the semiconductor memory device according to the fourth embodiment of the present invention.

FIG. 13 and FIG. 14 are schematic block diagrams for showing an electric circuit arrangement of a semiconductor memory device according to a fourth embodiment of the present invention.

This semiconductor memory device of the fourth embodiment is mainly arranged by a data strobe signal circuit 41, a clock signal circuit 42, and a data-in circuit 43.

As indicated in FIG. 13(a), the data strobe signal circuit 41 contains an input buffer 411, a rise/fall transition pulse generating circuit 412, a delay circuit 413, and a fall transition pulse generating circuit 414.

The input buffer 411, the rise/fall transition pulse generating circuit 412, the delay circuit 413, and the fall transition pulse generating circuit 414 employed in the fourth semiconductor memory device indicated in FIG. 13(a) own the same circuit arrangements and functions as those of the input buffer 311, the rise/fall transition pulse generating circuit 312, the delay circuit 313, and the fall transition pulse generating circuit 314 employed in the third semiconductor memory device shown in FIG. 8(a).

As a result, the data strobe signal circuit 41 of the fourth embodiment owns the same function as that of the data strobe signal circuit 31 of the third embodiment.

As indicated in FIG. 13(b), the clock signal circuit 42 contains an input buffer 421, a rise transition pulse generating circuit 422, a delay circuit 423, a frequency dividing circuit 424, a rise transition pulse generating circuit 425, and a switch circuit 426.

The input buffer 421, the delay circuit 423, and the rise transition pulse generating circuit 426 own the same circuit arrangements and functions as those of the input buffer 321, the delay circuit 322, and the rise transition pulse generating circuit 323, as shown in FIG. 8(b), respectively. The input buffer 421, the rise transition pulse generating circuit 422, the delay circuit 423, the frequency dividing circuit 424, and the rise transition pulse generating circuit 425, employed in the fourth semiconductor memory device, have the same circuit arrangements and functions as those of the input buffer 2011, the rise transition pulse generating circuit 2012, the delay circuit 2013, the frequency dividing circuit 2014, and the rise transition pulse generating circuit 2015, employed in the first prior art memory device shown in FIG. 36. Accordingly, the clock signal circuit 42 may have the same function as that of the clock signal circuit 32 according to the third embodiment under such a condition that the switch circuit 426 is connected as shown in FIG. 13(b). To the contrary, when this switch circuit 426 is switched from the present switch state, the clock signal circuit 42 may have the same function as that of the clock signal circuit 201 employed in the first prior art.

As indicated in FIG. 14, the data-in circuit 43 contains an input buffer 431, register circuits 432, 433, 434, 435, 436, and 437, a data bus drive circuit 438, and also switch circuits 439, 4310, and 4311.

The input buffer 431, the register circuits 432, 433, 434, 435, 436, 437, and the data bus drive circuit 438 employed in the fourth embodiment own the same circuit arrangements and functions as those of the input buffer 331, the register circuits 332, 333, 334, 335, 336, 337, and the data bus drive circuit 338, employed in the fourth embodiment of FIG. 9(a), respectively. Also, the input buffer 431, the register circuits 432, 433, 436, 437, and the data bus drive circuit 438 employed in the fourth embodiment own the same circuit arrangements and functions as those of the input buffer 2021, the register circuits 2022, 2023, 2024, 2025, and the data bus drive circuit 2026, employed in the second prior art of FIG. 37(a), respectively.

As a result, the data-in circuit 43 may own the same function as that of the data-in circuit 33 of the third embodiment under such a condition that the switch circuits 439, 4310, 4311 are connected as shown in FIG. 14. To the contrary, when these switch circuits 439, 4310, 4311 are switched from the present switch states, this data-in circuit 33 of the third embodiment may have the same function as the data-in circuit 202 of the first prior art.

OPERATION OF FOURTH SEMICONDUCTOR MEMORY DEVICE

As previously explained, in accordance with the fourth semiconductor memory device having the above-described circuit arrangement, the memory operation effected in the third semiconductor memory device and the memory operation effected in the first prior art memory device can be properly switched, depending upon the switching conditions of these switch circuits 426, 439, 4310, and 4311 employed in this fourth memory device.

It should also be understood that these switch circuits 426, 439, 4310, and 4311 may be switched to any switching position in a fixing manner by setting bonding option. As a consequence, in accordance with the fourth semiconductor memory device, the same advantage of the second semiconductor memory device can be achieved.

CIRCUIT ARRANGEMENT/TIMING CHART OF FIFTH SEMICONDUCTOR MEMORY DEVICE

Figure 15A:
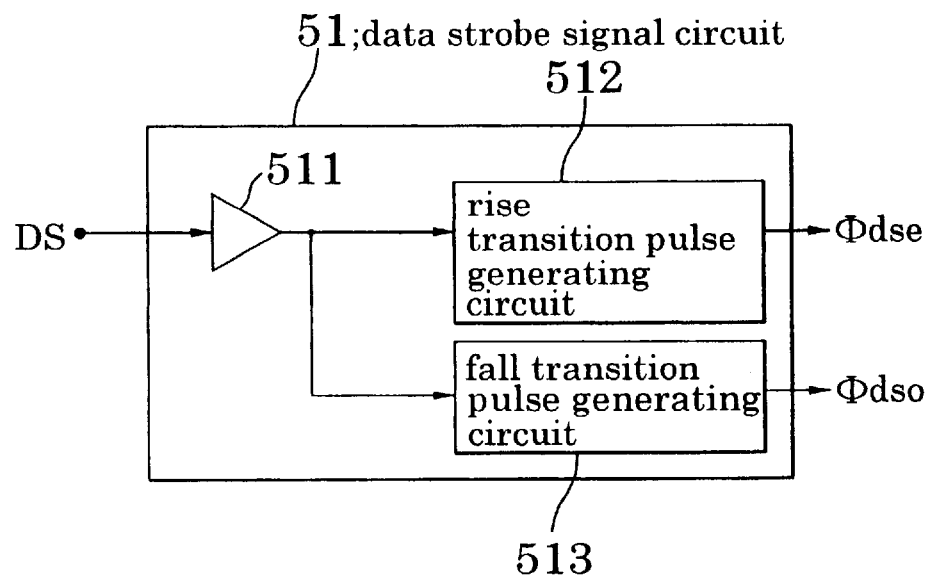
FIG. 15, diagrams a and b are schematic block diagrams for showing an electric circuit arrangement of a semiconductor memory device according to a fifth embodiment of the present invention.
Figure 15B:
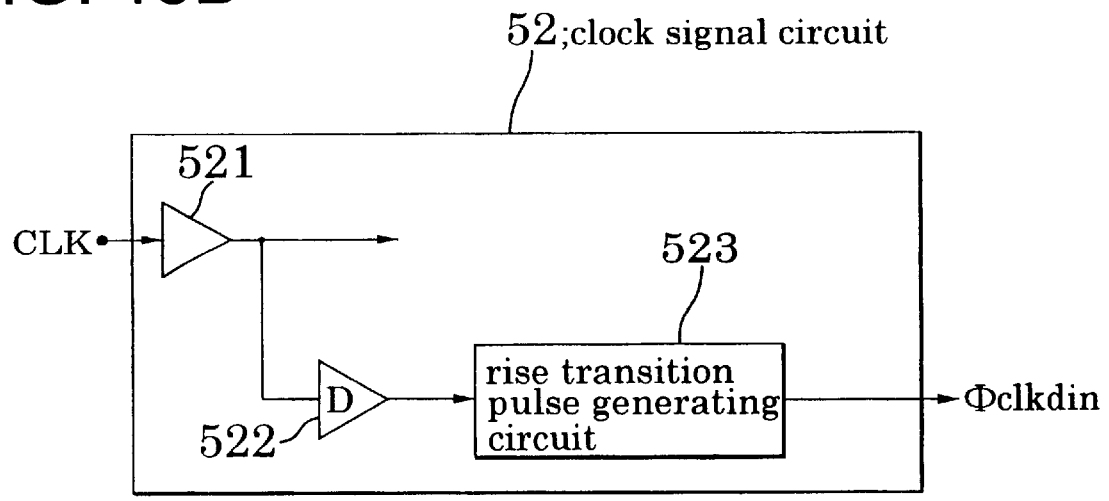
Figure 16A:
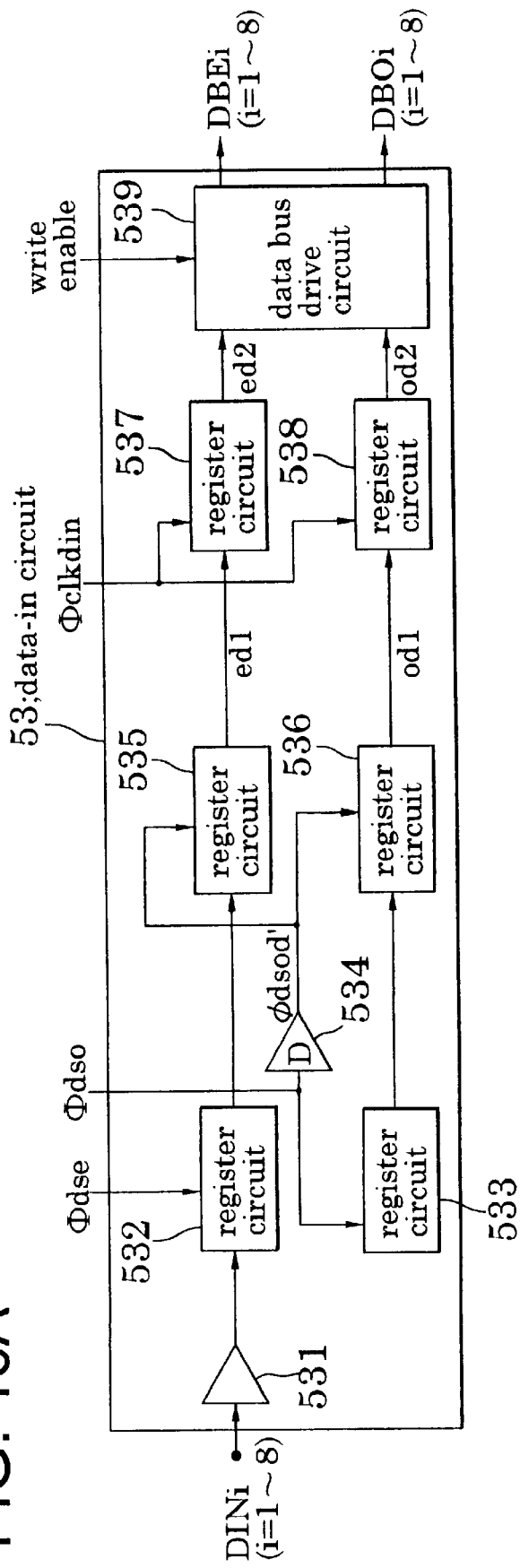
FIG. 16, diagrams a and b are schematic block diagrams for indicating another electric circuit arrangement of the semiconductor memory device according to the fifth embodiment of the present invention.
Figure 16B:
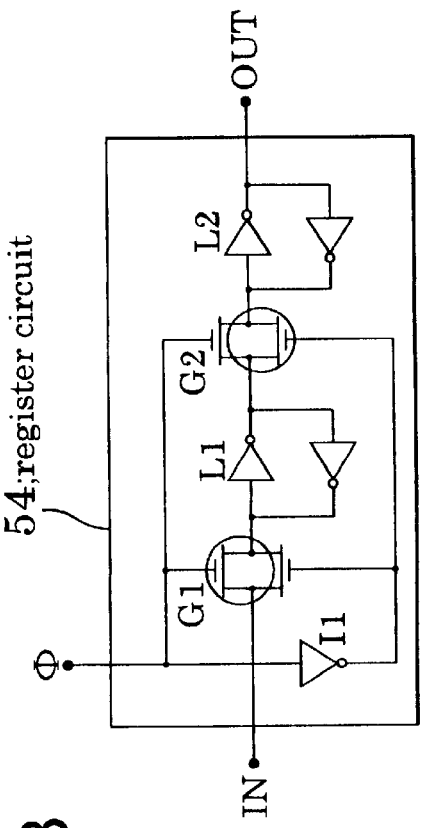
Figure 17:
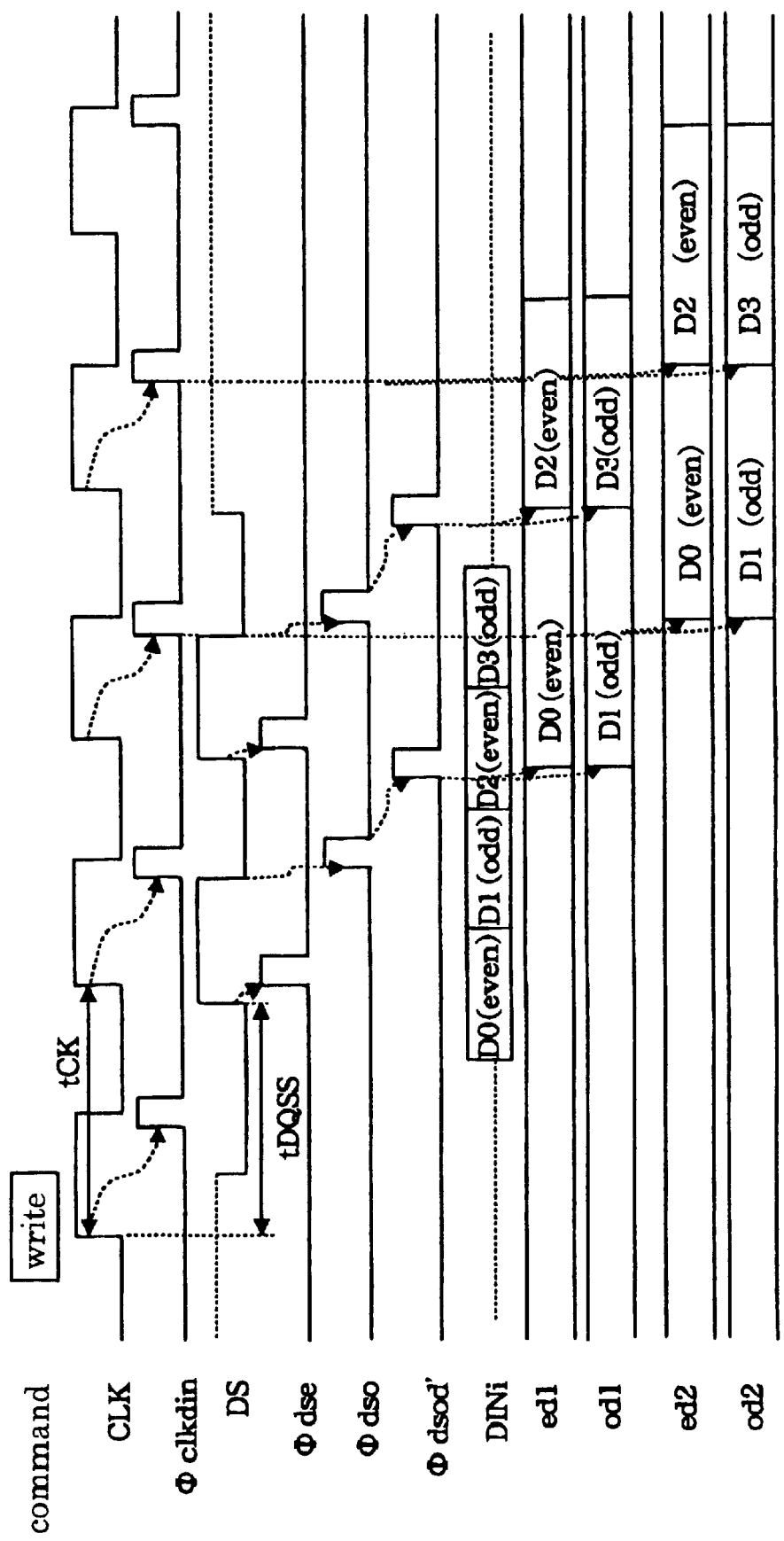
FIG. 17 is a timing chart for explaining operations of the semiconductor memory device according to the fifth embodiment.
Figure 18:
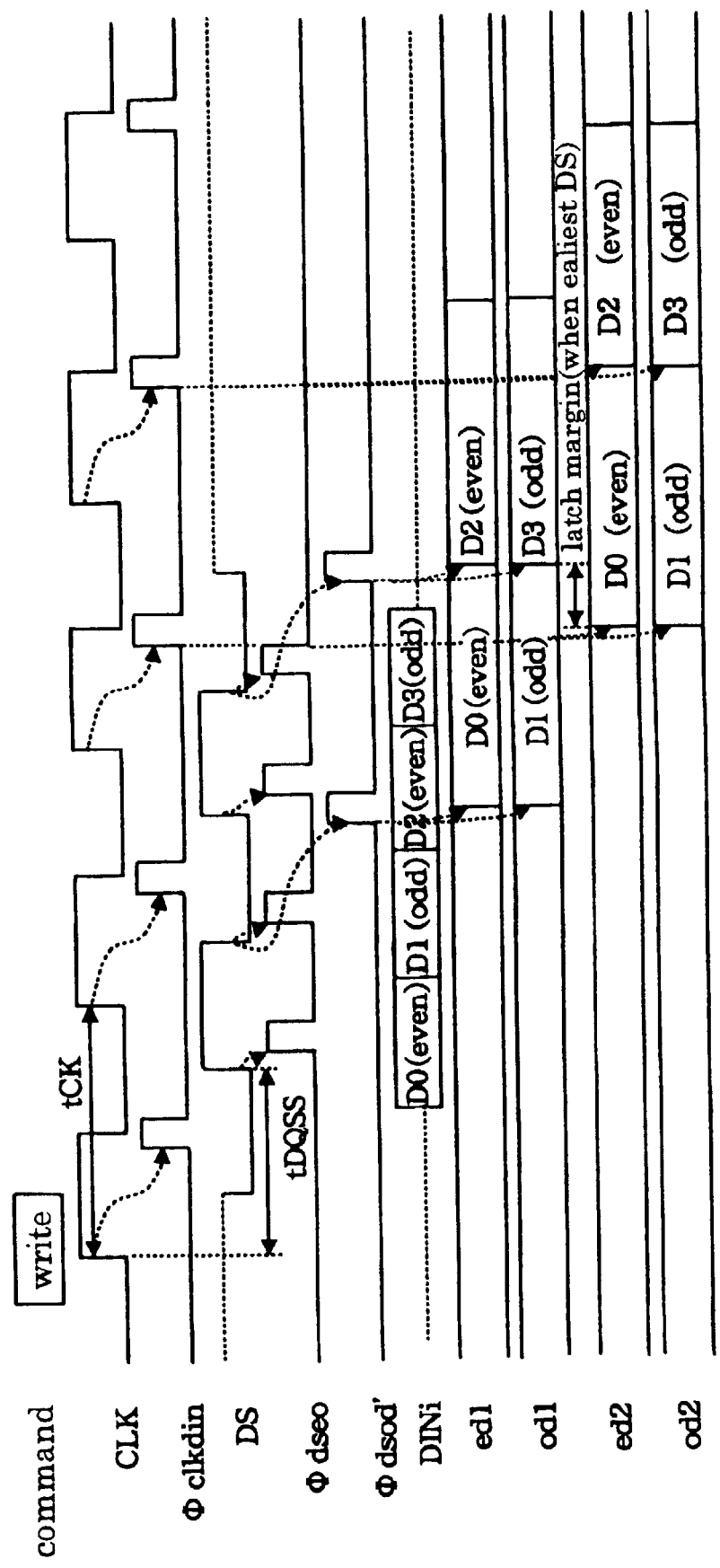
FIG. 18 is an explanatory diagram for explaining a latch margin of the fifth semiconductor memory device in the case that the data strobe signal owns the earliest timing.

FIG. 15 and FIG. 16 are schematic block diagrams for representing an electric circuit arrangement of a semiconductor memory device according to a fifth embodiment of the present invention. FIG. 17 is a timing chart for explaining operations of the semiconductor memory device according to the fifth embodiment. FIG. 18 is an explanatory diagram for explaining a latch margin of the fifth semiconductor memory device in the case that the data strobe signal owns the earliest timing. FIG. 19 is an explanatory diagram for explaining a latch margin of the fifth semiconductor memory device in the case that the data strobe signal owns the latest timing. This semiconductor memory device of the fifth embodiment is mainly arranged by a data strobe signal circuit 51, a clock signal circuit 52, and a data-in circuit 53.

Precisely speaking, as shown in FIG. 15(a), the data strobe signal circuit 51 contains an input buffer 511, a rise transition pulse generating circuit 512, and a fall transition pulse generating circuit 513.

The input buffer 511 supplies a data strobe signal DS to both the rise transition pulse generating circuit 512 and the fall transition pulse generating circuit 513. The rise transition pulse generating circuit 512 detects a rise edge of an output signal from the input buffer 511 to thereby generate an one-shot pulse signal "Φdse". The fall transition pulse generating circuit 513 detects the fall edge of the output signal from the input buffer 511 to thereby generate an one-shot pulse signal "Φdso".

As indicated in FIG. 15(b), the clock signal circuit 52 contains an input buffer 521, a delay circuit 522, and a rise transition pulse generating circuit 523.

The input buffer 521 supplies a clock signal CLK to the delay circuit 522. The delay circuit 522 delays an output signal derived from the input buffer 521 by preselected time. The rise transition pulse generating circuit 523 detects a rise edge of an output signal from the delay circuit 522 to thereby produce an one-shot pulse signal "Φclkdin".

As shown in FIG. 16(a), the data-in circuit 53 contains an input buffer 531, register circuits 532, 533, 535, 536, 537, 538, a delay circuit 534, and also a data bus drive circuit 539.

The input buffer 531 supplies a data input signal DINi (i=1 to 8) to the register circuits 532 and 533. The register circuit 532 acquires an output signal derived from the input buffer 531 in response to the one-shot pulse "Φdse". The register circuit 533 acquires an output signal derived from the input buffer 531 in response to the one-shot pulse signal "Φdseo". The delay circuit 534 delays the one-shot pulse signal "Φdso" by preselected time to thereby another one-shot pulse signal "Φdsod'". Both the register circuit 535 and the register circuit 536 acquire the output signals derived from the register circuits 532 and 533 in response to the one-shot pulse signal "Φdsod'" to thereby generate output signals "ed1" and "od1", respectively. Also, both the register circuit 537 and the register circuit 538 acquire the output signals derived from the register circuits 535 and 536 in response to the one-shot pulse signal "Φclkdin" to thereby generate output signals "ed2" and "od2", respectively. The data bus drive circuit 539 supplies both the output data "ed2" derived from the register circuit 537 and the output data "od2" derived from the register circuit 538 in a parallel manner to even-numbered data buses DBEi (i=1 to 8) and also odd-numbered data buses DBOi (i=1 to 8), so that the input data may be written into a memory cell (not shown).

It should be understood in this fifth embodiment that all of these register circuits 532, 533, 535, 536, 537, and 538 own the same circuit arrangements as a circuit arrangement of a register circuit 54 shown in FIG. 16(*b*). This register circuit 54 owns the same arrangement/function as those of the register circuit 203 indicated in FIG. 37(*b*).

OPERATION OF FIFTH SEMICONDUCTOR MEMORY DEVICE

Next, operation of this semiconductor memory device according to the fifth embodiment will be described with reference to FIG. 15 to FIG. 19.

In the data strobe signal circuit 51 shown in FIG. 15(*a*), the rise edge of the data strobe signal DS detected so as to generate the one-shot pulse signal "Φdse", and furthermore, the fall edge of this data strobe signal DS is detected in order to generate the one-shot pulse signal "Φdso". On the other hand, in the clock signal circuit 52 shown in FIG. 15(*b*), the rise edge of the delayed clock signal CLK is detected so as to produce the one-shot pulse signal "Φclkdin".

In the data-in circuit 53 shown in FIG. 16(*a*), in response to the one-shot pulse signal "Φdse" produced by detecting the rise transition of the data strobe signal DS, the data input signals DINi are acquired into the register circuit 532. Also, in response to the one-shot pulse signal "Φdso" produced by detecting the fall transition of the data strobe signal DS, the data input signals DINi are acquired into the register circuit 533. Next, two sets (pieces) of data acquired by the register circuits 532 and 533 are simultaneously acquired by the register circuits 535 and 536 in response to another one-shot pulse signal "Φdsod'" produced by detecting the fall transition of the data strobe signal DS. At this stage, in order to avoid mis-latching operation, the second-mentioned one-shot pulse signal "Φdsod'" is delayed in such a manner that this one-shot pulse signal "Φdsod'" is produced after the first-mentioned one-shot pulse signal "Φdso".

Thereafter, both the data "ed1" and "od1" acquired by the register circuits 535 and 536 are transferred to the next register circuits 537 and 538 in response to the one-shot pulse signal "Φclkdin" produced by detecting the rise transition of the clock signal CLK. Assuming now that the clock period is selected to be "tCK", the technical standard "tDQSS" indicative of a timing difference between the clock signal CLK and the data strobe signal DS is located within a range from, for example, 0.75 tCK (minimum tDQSS) up to 1.25 tCK (maximum tDQSS). As a consequence, as represented in FIG. 18 and FIG. 19, in such two cases of 0.75 tCK and 1.25 tCK, a margin must be secured, or ensured with respect to the mis-latching operation. To this end, both the delay amount of the delay circuit 534 in the one-shot pulse signal "Φdsod'" generating unit, and the delay amount of the delay circuit 522 in the one-shot pulse signal "Φclkdin" generating unit are controlled to optimum values. Accordingly, in FIG. 18, the latch margin can be secured even under such a condition that the data strobe signal DS owns the earliest timing. Also, in FIG. 19, this timing chart represents that the latch margin can be secured even under such a condition that the data strobe signal owns the latest timing.

As previously described, in accordance with the fifth semiconductor memory device having the above-described circuit arrangement, it is possible to secure the latch margin when the input data acquired by controlling the data strobe signal DS is converted into the control of the clock signal CLK. In this embodiment, although a total number of these delay circuits used to secure the latch margin is increased, since the frequencies of the one-shot pulse signals generated by the clock signal CLK and the data strobe signal DS can be made equal to each other, the fifth semiconductor memory device can be applied to more higher frequency memory devices, as compared with other embodiments.

CIRCUIT ARRANGEMENT OF SIXTH SEMICONDUCTOR DEVICE

Figure 20A:
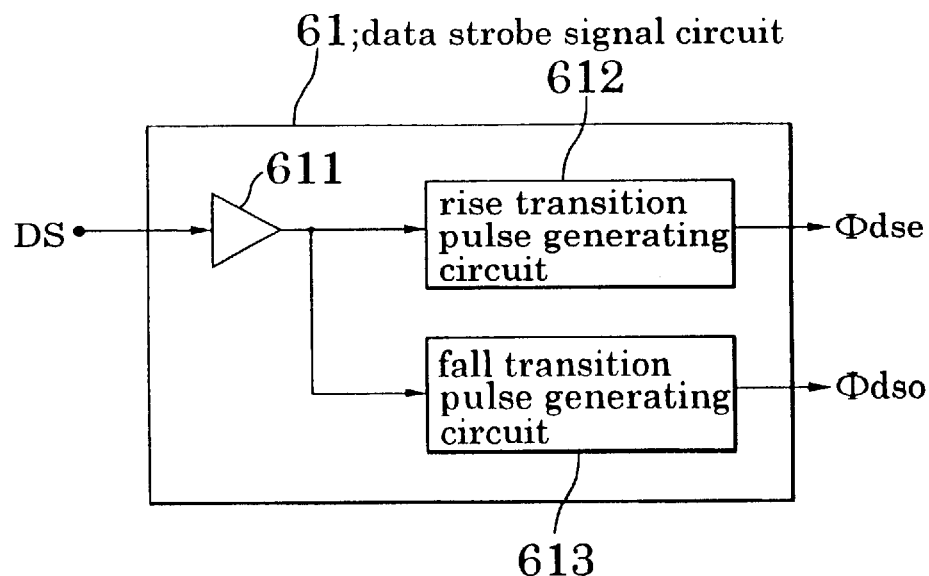
FIG. 20, diagrams a and b are schematic block diagrams for showing an electric circuit arrangement of a semiconductor memory device according to a sixth embodiment of the present invention.
Figure 20B:
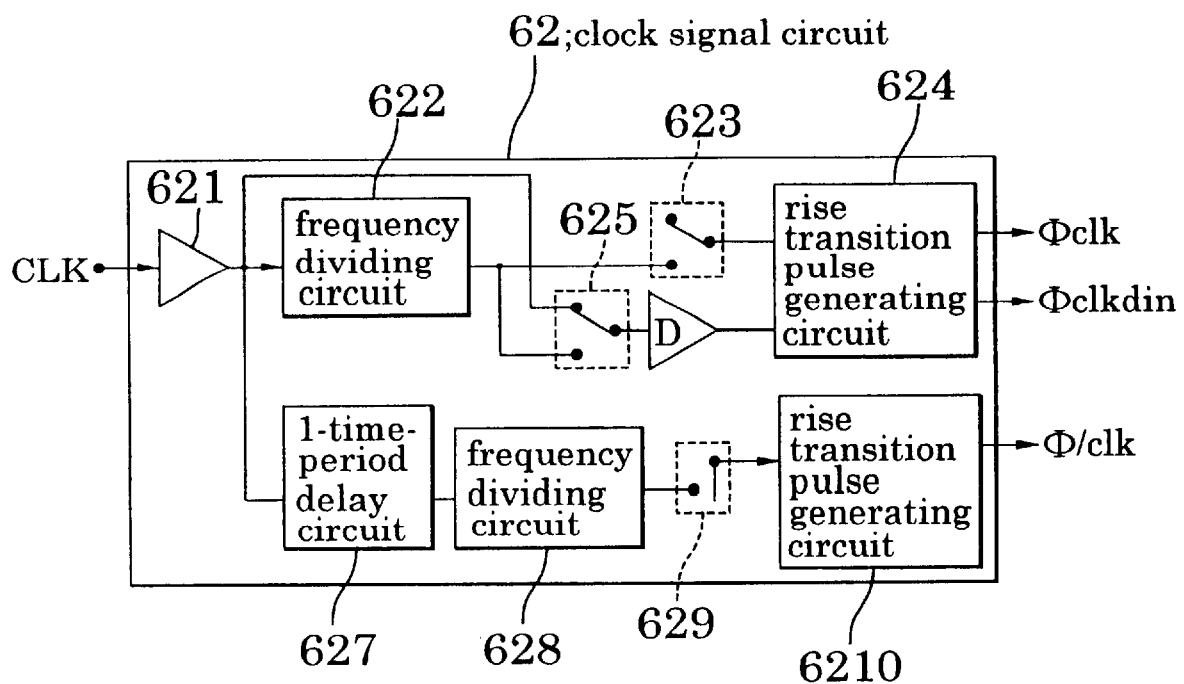
Figure 21:
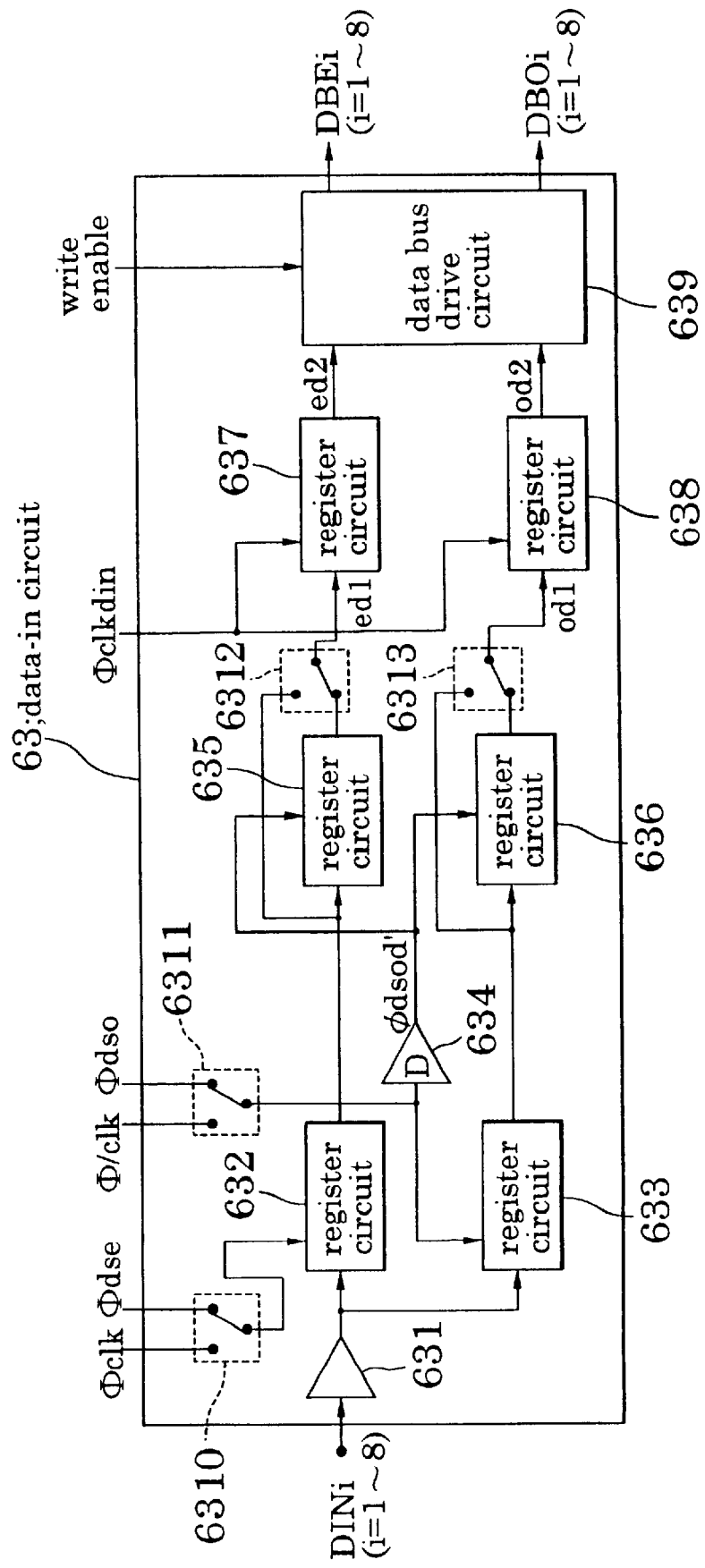
FIG. 21 is a schematic block diagram for indicating another electric circuit arrangement of the semiconductor memory device according to the sixth embodiment of the present invention.

FIG. 20 and FIG. 21 are schematic block diagrams for showing an electric circuit arrangement of a semiconductor memory device according to a sixth embodiment of the present invention.

This semiconductor memory device of the sixth embodiment is mainly arranged by a data strobe signal circuit 61, a clock signal circuit 62, and a data-in circuit 63.

As indicated in FIG. 20(*a*), the data strobe signal circuit 61 contains an input buffer 611, a rise transition pulse generating circuit 612, and a fall transition pulse generating circuit 613.

The input buffer 611, the rise transition pulse generating circuit 612, and the fall transition pulse generating circuit 613 employed in this sixth semiconductor memory device indicated in FIG. 20(*a*) own the same circuit arrangements and functions as those of the input buffer 511, the rise transition pulse generating circuit 512, and the fall transition pulse generating circuit 513 employed in the fifth semiconductor memory device shown in FIG. 15(*a*).

As a result, the data strobe signal circuit 61 of the sixth embodiment owns the same function as that of the data strobe signal circuit 51 of the fifth embodiment.

Figure 39:
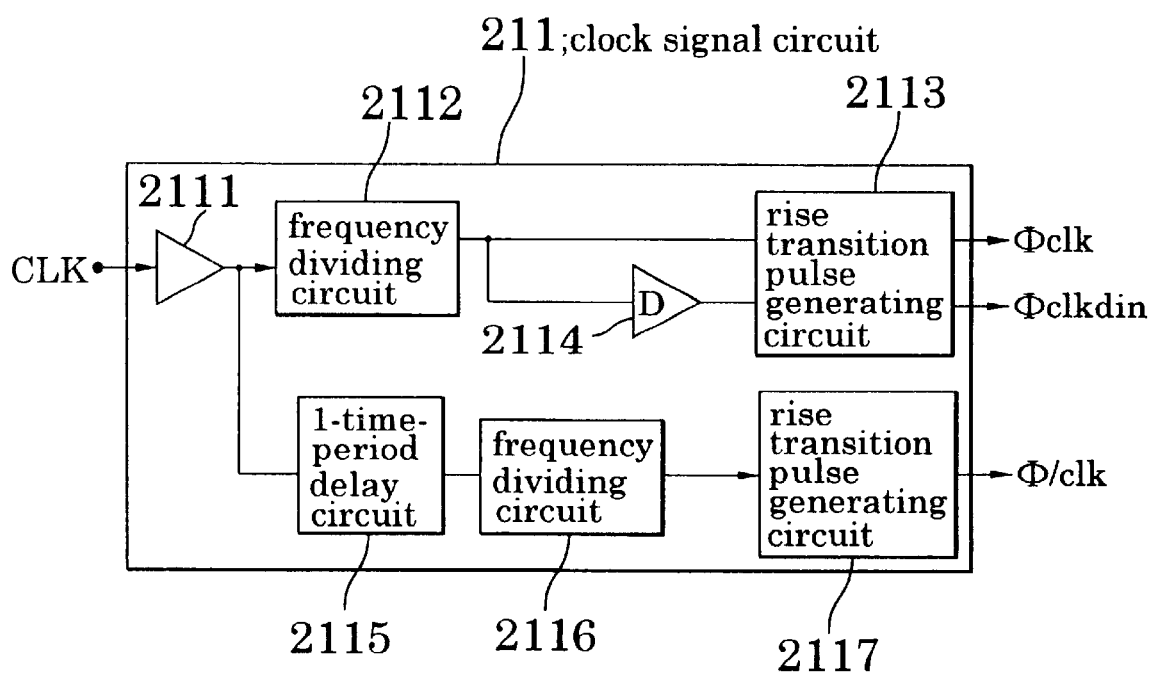
FIG. 39 is a schematic block diagram for representing one electric circuit arrangement of the second prior art semiconductor memory device.

As indicated in FIG. 20(*b*), the clock signal circuit 62 contains an input buffer 621, a frequency dividing circuit 622, a switch circuit 623, a rise transition pulse generating circuit 624, a switch circuit 625, a delay circuit 626, an 1-time-period delay circuit 627, another frequency dividing circuit 628, another switch 629, and another rise transition pulse generating circuit 6210. The input buffer 621, the delay circuit 626, and the rise transition pulse generating circuit 624 own the substantially same circuit arrangements and functions as those of the input buffer 521, the delay circuit 522, and the rise transition pulse generating circuit 523, as shown in FIG. 15(*b*), respectively. The input buffer 621, the frequency dividing circuit 622, the rise transition pulse generating circuit 624, the delay circuit 626, the 1-time-period delay circuit 627, the frequency dividing circuit 628, and the rise transition pulse generating circuit 6210, employed in this sixth semiconductor memory device, have the substantially same circuit arrangements and functions as those of the input buffer 2111, the frequency dividing circuit 2112, the rise transition pulse generating circuit 2113, the delay circuit 2114, the 1-time-period delay circuit 2115, the frequency dividing circuit 2116, and the rise transition pulse generating circuit 2117, employed in the second prior art memory device shown in FIG. 39.

Accordingly, the clock signal circuit 62 may have the same function as that of the clock signal circuit 52 according to the fifth embodiment under such a condition that the switch circuits 623, 625, 626, 629, are connected as shown in FIG. 20(*b*). To the contrary, when these switch circuits 623, 625, 626, 629 are switched from the present switch states, the clock signal circuit 62 may have the same function as that of the clock signal circuit 211 employed in the second prior art. As indicated in FIG. 21, the data-in circuit 63 contains an input buffer 631, register circuits 632, 633, 635, 636, 637, and 638, a delay circuit 634, a data bus drive circuit 639, and also switch circuits 6310, 6311, 6312, and 6313.

Figure 40A:
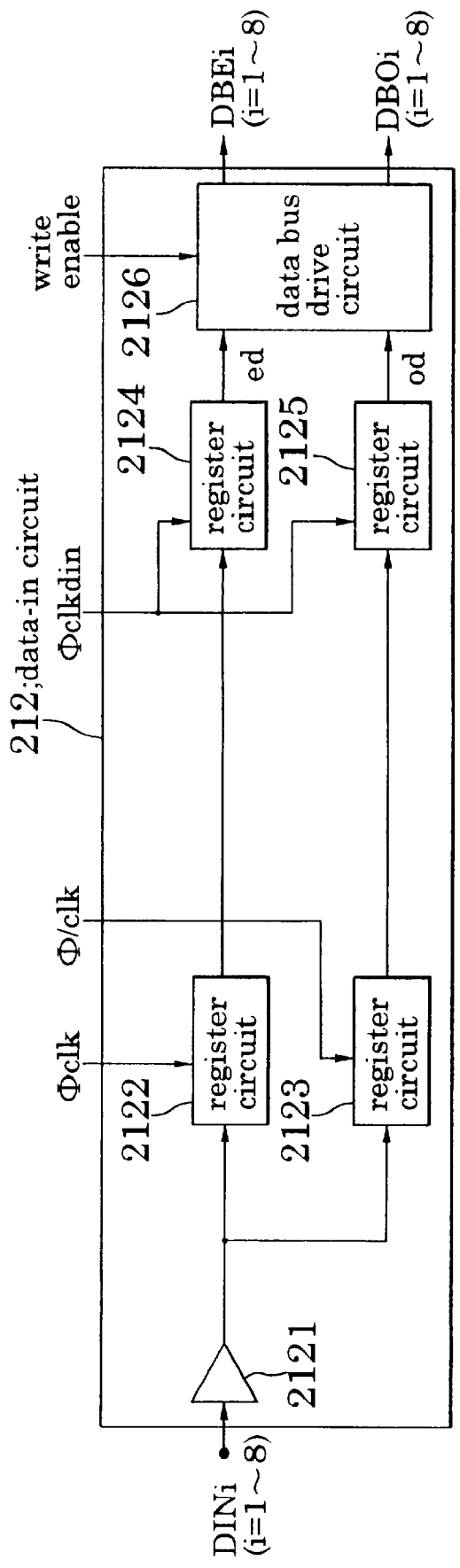
FIG. 40, diagrams a and b are schematic block diagrams for showing another electric circuit arrangement of the second prior art.

The input buffer 631, the register circuits 632, 633, 635, 636, 637, 638, the delay circuit 634, and the data bus drive circuit 639 employed in the fifth embodiment own the same circuit arrangements and functions as those of the input buffer 531, the register circuits 532, 533, 535, 536, 537, 538, the delay circuit 534, and the data bus drive circuit 539, employed in the fifth embodiment of FIG. 16(a), respectively. Also, the input buffer 631, the register circuits 632, 633, 637, 638, and the data bus drive circuit 639 employed in the sixth embodiment own the same circuit arrangements and functions as those of the input buffer 2121, the register circuits 2122, 2123, 21224, 2125, and the data bus drive circuit 2126, employed in the second prior art of FIG. 40(a), respectively.

As a result, the data-in circuit 63 may own the same function as that of the data-in circuit 53 of the fifth embodiment under such a condition that the switch circuits 6310, 6311, 6312, 6313, are connected as shown in FIG. 21. To the contrary, when these switch circuits 6310, 6311, 6312, 6313 are switched from the present switch states, this data-in circuit 63 of the sixth embodiment may have the same function as the data-in circuit 212 of the second prior art.

OPERATION OF SIXTH SEMICONDUCTOR MEMORY DEVICE

As previously explained, in accordance with the sixth semiconductor memory device having the above-described circuit arrangement, the memory operation effected in the fifth semiconductor memory device and the memory operation effected in the second prior art memory device can be properly switched, depending upon the switching conditions of these switch circuits 623, 625, 629, 6310, 6311, 6312, and 6313 employed in this sixth memory device.

It should be understood that these switch circuits 623, 625, 626, 629, 6310, 6311, 6312, and 6313 may be switched to any switching position in a fixing manner by setting bonding option, which is similar to that of the second embodiment.

CIRCUIT ARRANGEMENT/TIMING CHART OF SEVENTH SEMICONDUCTOR MEMORY DEVICE

Figure 24:
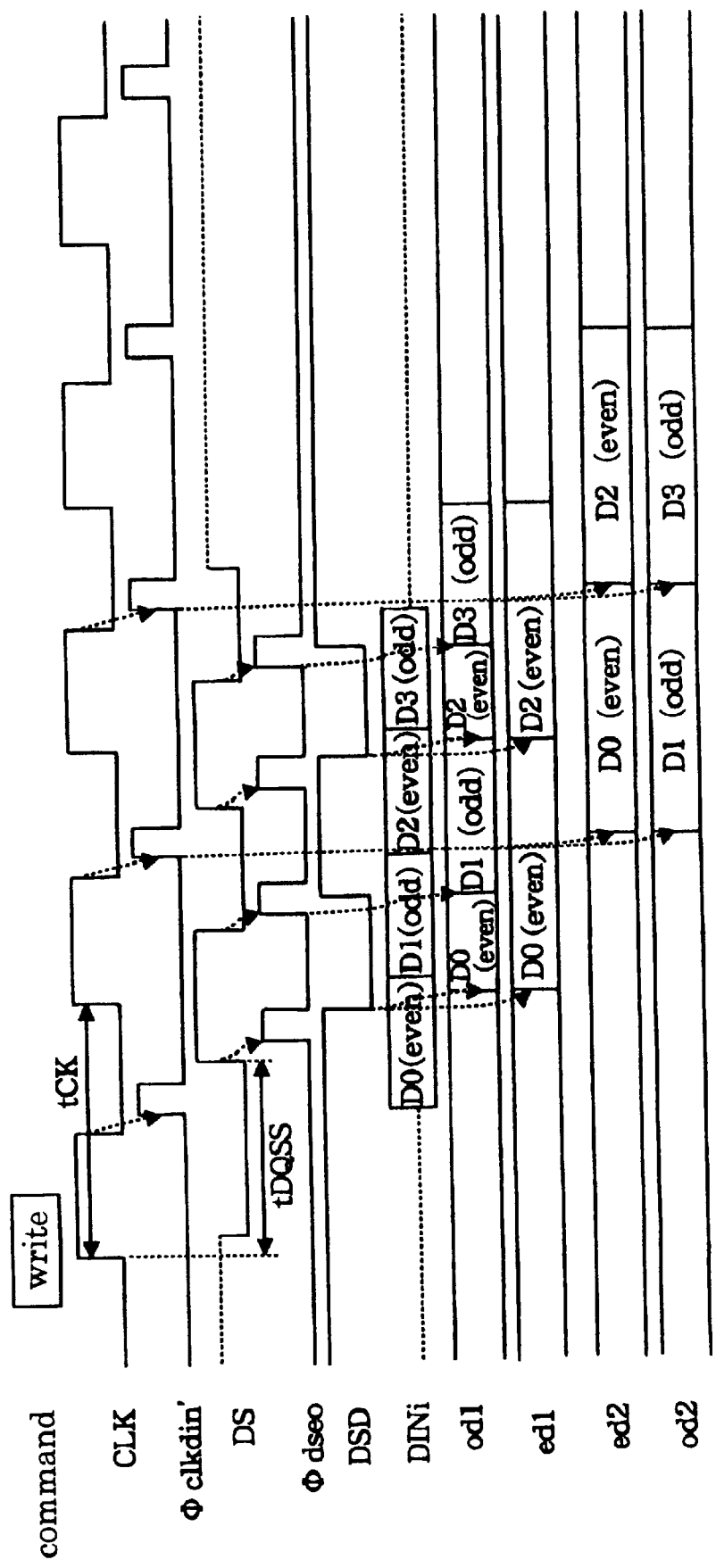
FIG. 24 is a timing chart for explaining operations of the semiconductor memory device according to the seventh embodiment.
Figure 25:
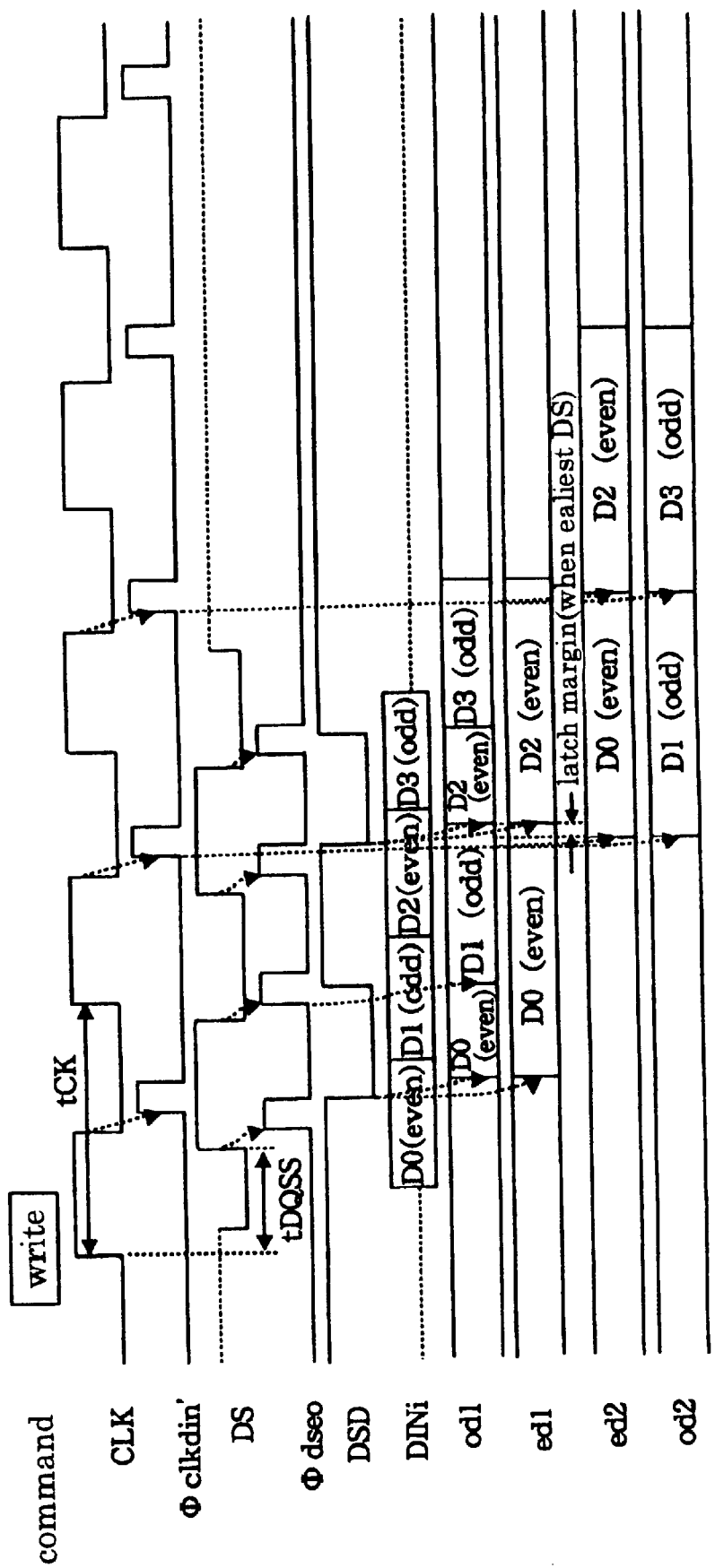
FIG. 25 is an explanatory diagram for explaining a latch margin of the seventh semiconductor memory device in the case that the data strobe signal owns the earliest timing.
Figure 26:
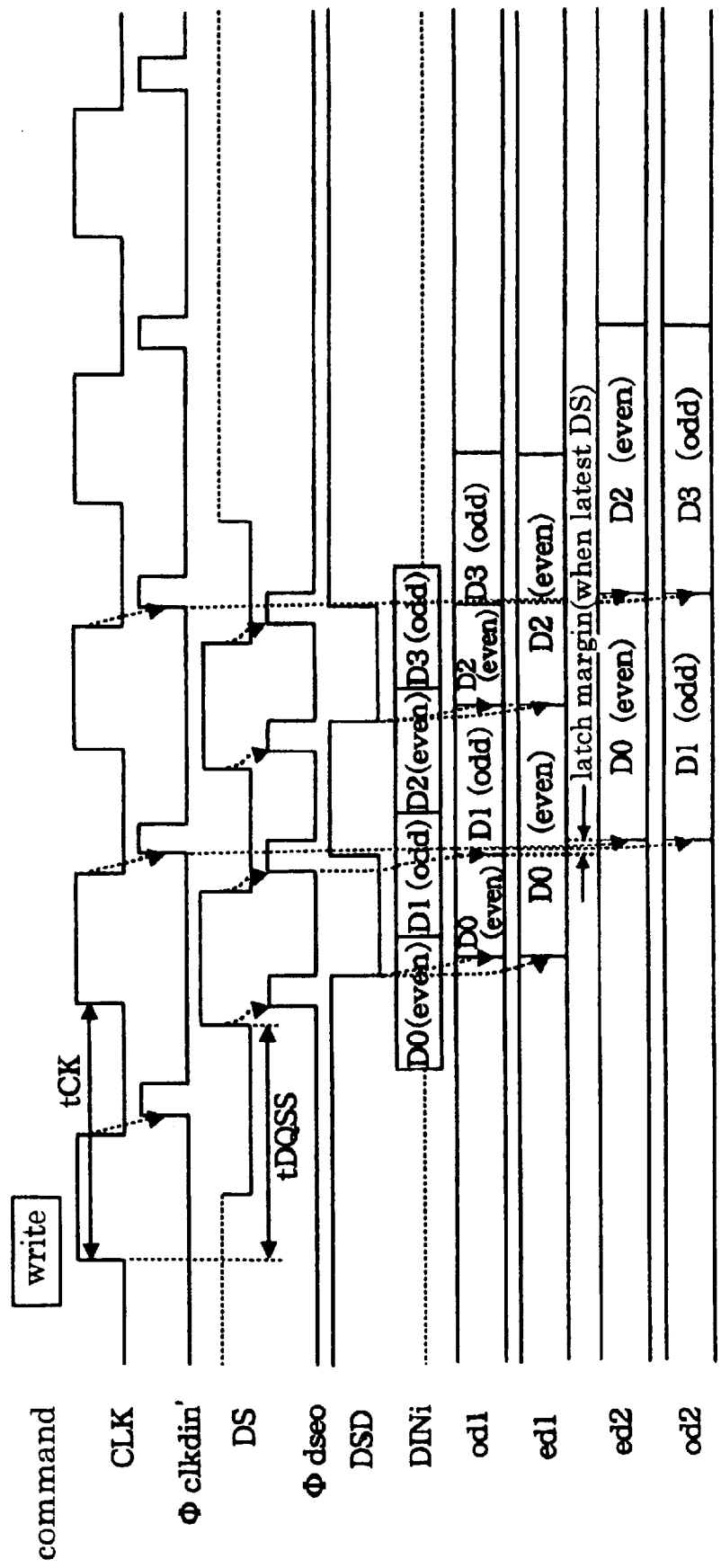
FIG. 26 is an explanatory diagram for explaining a latch margin of the seventh semiconductor memory device in the case that the data strobe signal owns the latest timing.

FIG. 22 and FIG. 23 are schematic block diagrams for representing an electric circuit arrangement of a semiconductor memory device according to a seventh embodiment of the present invention. FIG. 24 is a timing chart for explaining operations of the semiconductor memory device according to the seventh embodiment. FIG. 25 is an explanatory diagram for explaining a latch margin of the first semiconductor memory device in the case that the data strobe signal owns the earliest timing. FIG. 26 is an explanatory diagram for explaining a latch margin of the seventh semiconductor memory device in the case that the data strobe signal owns the latest timing. As schematically shown in FIG. 22 and FIG. 23, this semiconductor memory device of the seventh embodiment is mainly arranged by a data strobe signal circuit 71, a clock signal circuit 72, and a data-in circuit 73.

Figure 22A:
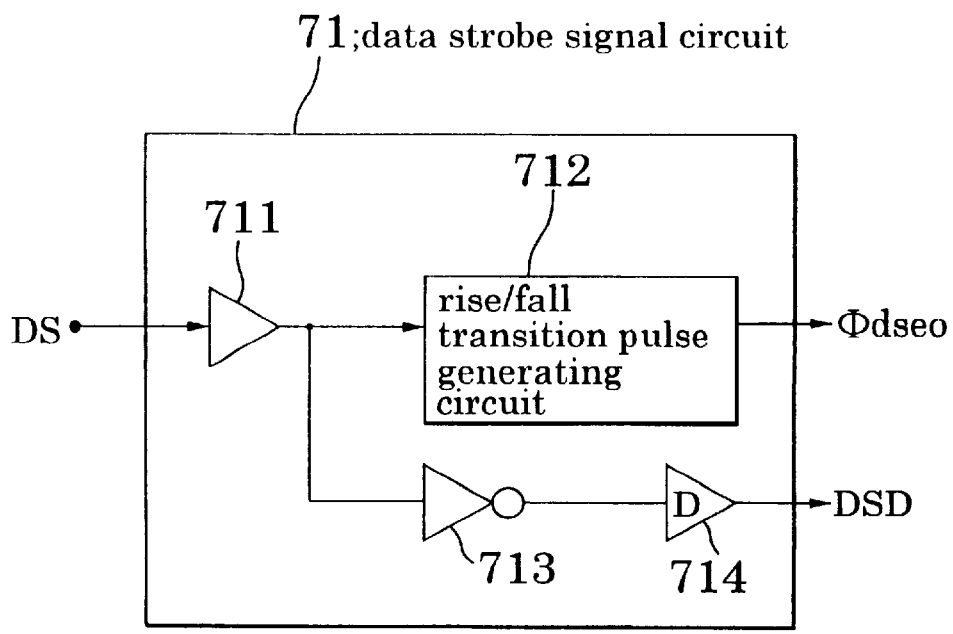
FIG. 22, diagrams a and b are schematic block diagrams for showing an electric circuit arrangement of a semiconductor memory device according to a seventh embodiment of the present invention.

Precisely speaking, as shown in FIG. 22(a), the data strobe signal circuit 71 contains an input buffer 711, a rise/fall transition pulse generating circuit 712, an inverter 713, and a delay circuit 714.

The input buffer 711 supplies a data strobe signal DS to both the rise/fall transition pulse generating circuit 712 and the inverter 713. The rise/fall transition pulse generating circuit 712 detects both a rise edge and a fall edge of an output signal from the input buffer 511 to thereby generate an one-shot pulse signal "Φdseo". The inverter 713 inverts the output signal derived from the input buffer 711 to there by out put the inverted signal. The delay circuit 714 delays the output signal derived from this inverter 713 by preselected time to thereby output a delayed data strobe signal "DSD".

Figure 22B:
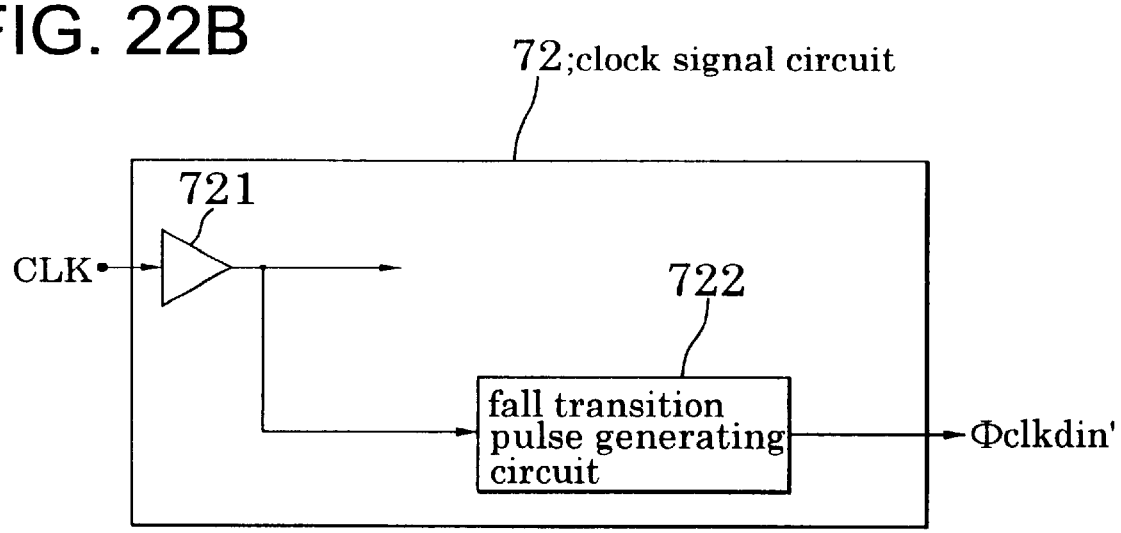

As indicated in FIG. 22(b), the clock signal circuit 72 contains an input buffer 721 and a fall transition pulse generating circuit 722.

The input buffer 721 supplies a clock signal CLK to the fall transition pulse generating circuit 722. The fall transition pulse generating circuit 722 detects a fall edge of an output signal from the input buffer 721 to thereby produce an one-shot pulse signal "Φclkdin'".

As shown in FIG. 23(a), the data-in circuit 73 contains an input buffer 731, register circuits 732, 733, 736, 737, data latch circuits 734, 735, and also a data bus drive circuit 738.

The input buffer 731 supplies a data input signal DINi (i=1 to 8) to the register circuit 732. The register circuit 732 acquires an output signal derived from the input buffer 731 in response to the one-shot pulse "Φdseo". The register circuit 733 acquires an output signal derived from the register circuit 732 in response to the next one-shot pulse signal "Φdseo". Both the data latch circuit 734 and the data latch circuit 735 acquire the output signals derived from the register circuits 732 and 733 in response to the delayed data strobe signal DSD to thereby generate output signals "ed1" and "od1", respectively. Also, both the register circuit 736 and the register circuit 737 acquire the output signals derived from the data latch circuits 734 and 735 in response to the one-shot pulse signal "Φclkdin'" to thereby generate output signals "ed2" and "od2", respectively. The data bus drive circuit 738 supplies both the output data "ed2" derived from the register circuit 736 and the output data "od2" derived from the register circuit 737 in a parallel manner to even-numbered data buses DBEi (i=1 to 8) and also odd-numbered data buses DBOi (i=1 to 8), so that the input data may be written into a memory cell (not shown).

It should be understood in this seventh embodiment that all of these register circuits 732, 733, 736, and 737 own the same circuit arrangements as a circuit arrangement of a register circuit 74 shown in FIG. 23(b). This register circuit 74, as shown in FIG. 23(b), owns the same arrangement/function as those of the register circuit 203 indicated in FIG. 37(b).

Also, the data latch circuits 734 and 735 each own such a circuit arrangement as indicated by the data latch circuit 75 of FIG. 23(c). The data latch circuit 75 contains an inverter I2, a gate G3, a latch L3, and another inverter I3. In this data latch circuit 75, the input data IN is latched by the latch circuit L3 by opening the gate G3 in response to the fall edge of the delayed data strobe signal DSD, and the latched input data is inverted by the inverter I3, so that this input data IN is delayed by preset time to thereby output the delayed input data IN.

OPERATION OF SEVENTH SEMICONDUCTOR MEMORY DEVICE

Next, operation of this semiconductor memory device according to the seventh embodiment will be described with reference to FIG. 22 to FIG. 26.

In the data strobe signal circuit 71 shown in FIG. 22(*a*), both the rise edge of the data strobe signal DS and the fall edge thereof are detected so as to generate the one-shot pulse signal "Φdseo", and this data strobe signal DS is inverted and then delayed to thereby produce the delayed data strobe signal DSD. On the other hand, in the clock signal circuit 72 shown in FIG. 22(*b*), the fall edge of the clock signal CLK is detected so as to produce the one-shot pulse signal "Φclkdin'".

In the data-in circuit 73 shown in FIG. 23(*a*), in response to the one-shot pulse signal "Φdseo" produced by detecting the rise/fall transitions of the data strobe signal DS, the data input signals DINi are acquired into the register circuit 732. In response to the next one-shot pulse signal "Φdseo", the output signal derived from the register circuit 732 is acquired into the register 733. Next, two sets (pieces) of data acquired by the register circuits 732 and 733 are simultaneously acquired by the register circuits 734 and 735 in response to the delayed data strobe signal DSD.

Thereafter, both the data acquired by the register circuits 734 and 735 are transferred to the next register circuits 736 and 737 in response to the one-shot pulse signal "Φclkdin'" produced by detecting the fall transition of the clock signal CLK. Assuming now that the clock period is selected to be "tCK", the technical standard "tDQSS" indicative of a timing difference between the clock signal CLK and the data strobe signal DS is located within a range from, for example, 0.4 tCK (minimum tDQSS) up to 0.9 tCK (maximum tDQSS) As a consequence, as represented in FIG. 25 and FIG. 26, in such two cases of 0.4 tCK and 0.9 tCK, a margin must be secured, or ensured with respect to the mis-latching operation. To this end, the delay amount of the delay circuit 714 in the delayed data strobe signal "DSD" generating unit is controlled to an optimum delay amount. As a result, in this seventh embodiment, in the timing chart of FIG. 24, the latch margin can be secured even under such a condition that the data strobe signal DS owns the earliest timing, as indicated in FIG. 25. Also, in FIG. 26, this timing chart represents that the latch margin can be secured even under such a condition that the data strobe signal DS owns the latest timing.

As previously described, in accordance with the first semiconductor memory device having the above-described circuit arrangement, it is possible to secure the latch margin when the input data acquired by controlling the data strobe signal DS is converted into the control of the clock signal CLK. In this embodiment, this seventh semiconductor memory device can be effectively applied in such a case that the value of "tDQS" indicative of the timing difference between the clock signal CLK and the data strobe signal DS is small. Furthermore, since the total number of the delay circuit used to secure the latch margin is small, the entire circuit arrangement can be made simple.

Furthermore, in this embodiment, since the control operation by the clock signal CLK is carried out by the one-shot pulse signal "Φcldkin'" the dependent characteristic of this clock signal CK with respect to the duty ratio can be canceled.

CIRCUIT ARRANGEMENT OF EIGHTH SEMICONDUCTOR DEVICE

Figure 27A:
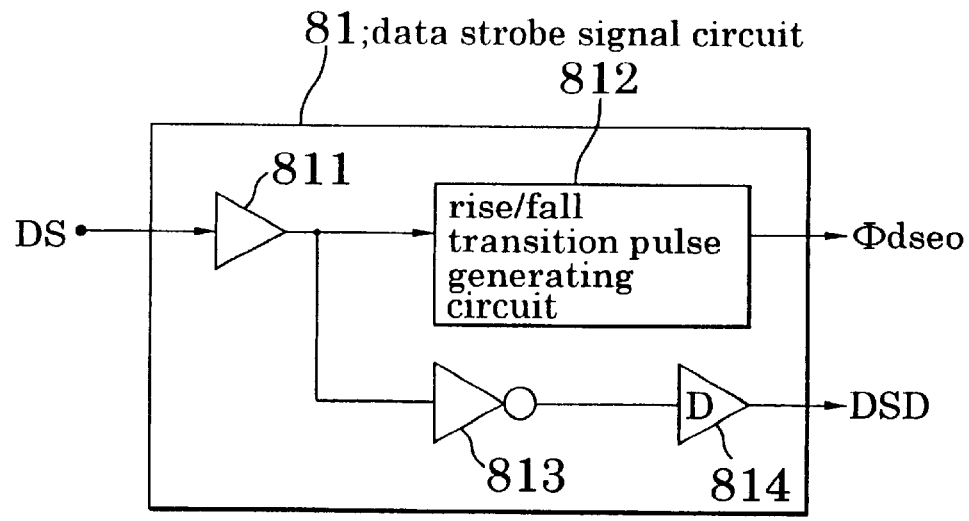
FIG. 27, diagrams a and b are schematic block diagrams for showing an electric circuit arrangement of a semiconductor memory device according to an eighth embodiment of the present invention.
Figure 27B:
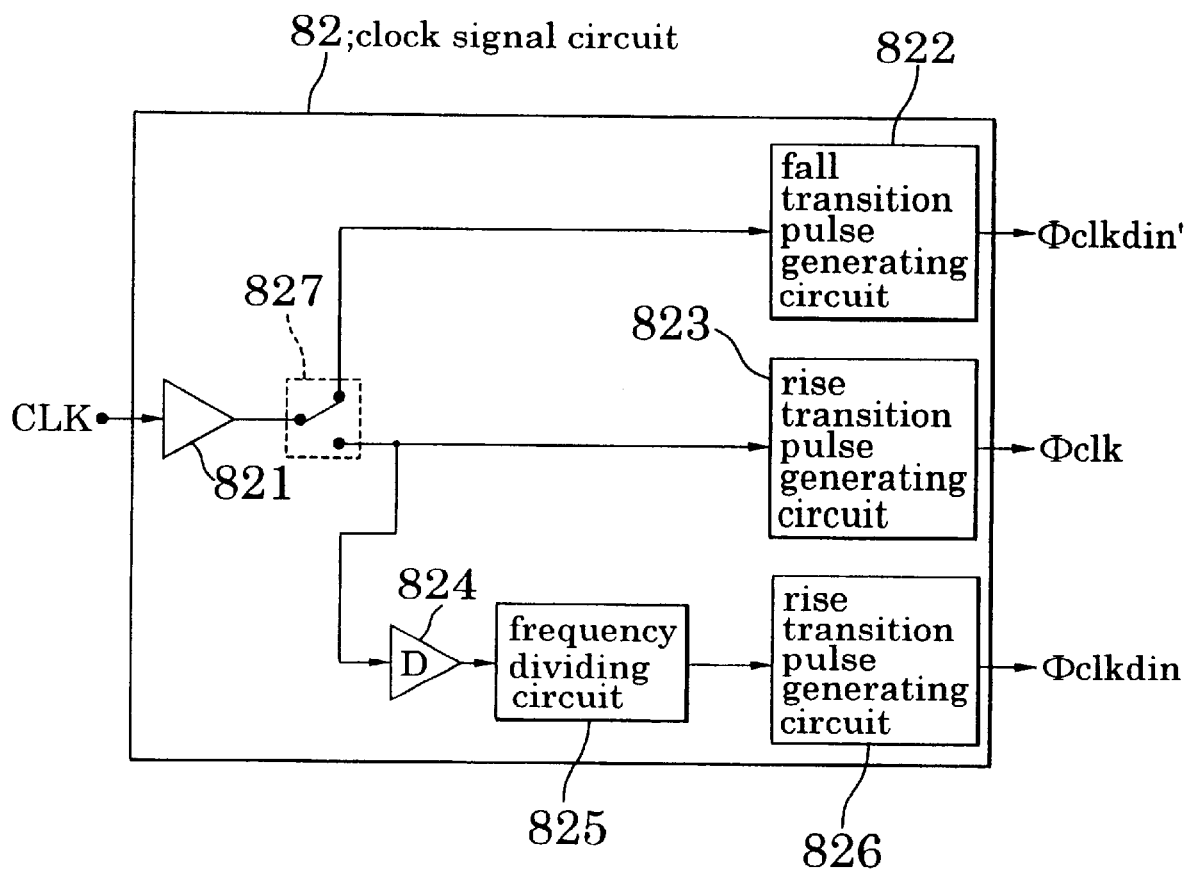
Figure 28:
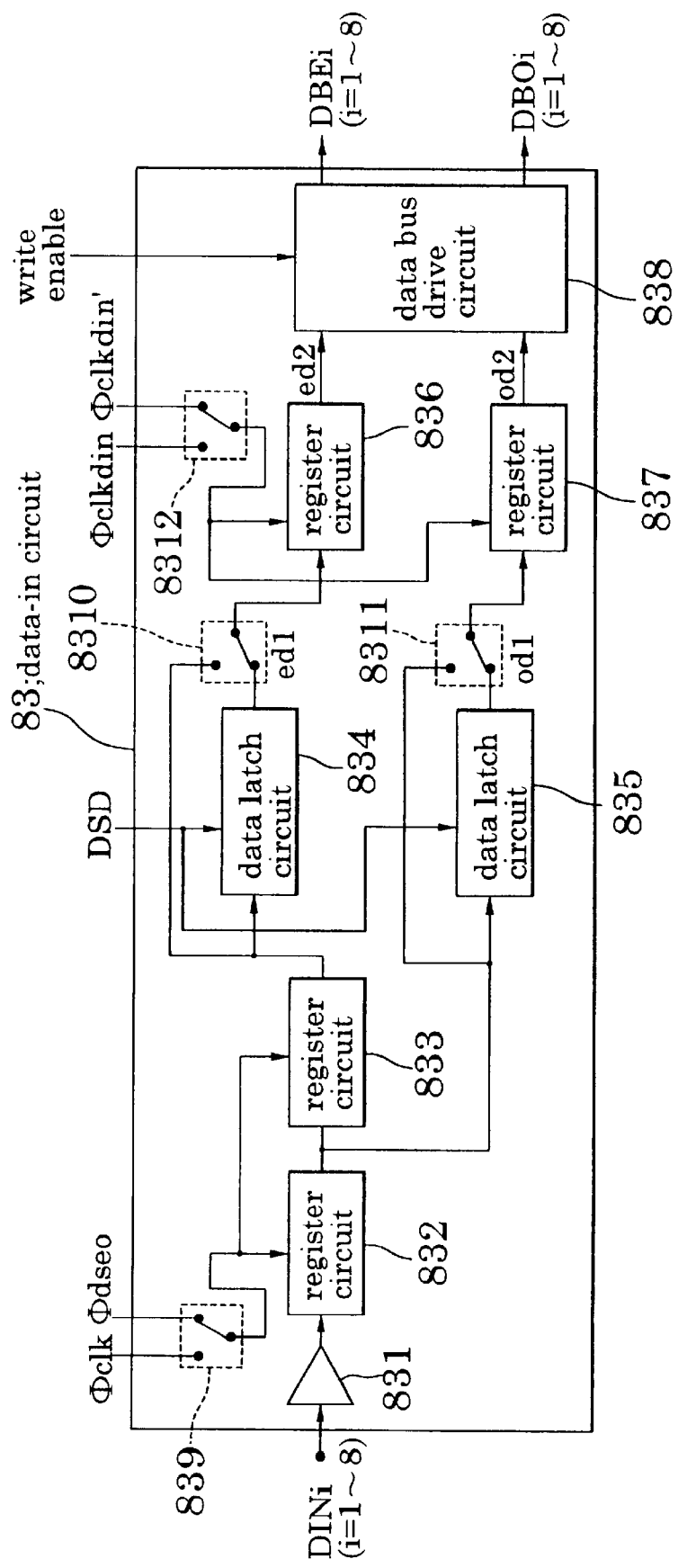
FIG. 28 is a schematic block diagram for indicating another electric circuit arrangement of the semiconductor memory device according to the eighth embodiment of the present invention.

FIG. 27 and FIG. 28 are schematic block diagrams for showing an electric circuit arrangement of a semiconductor memory device according to an eighth embodiment of the present invention.

This semiconductor memory device of the eighth embodiment is mainly arranged by a data strobe signal circuit 81, a clock signal circuit 82, and a data-in circuit 83, as indicated in FIG. 27 and FIG. 28.

As indicated in FIG. 27(*a*), the data strobe signal circuit 81 contains an input buffer 811, a rise/fall transition pulse generating circuit 812, an inverter 813, and a delay circuit 814.

The input buffer 811, the rise/fall transition pulse generating circuit 812, the inverter 813, and the delay circuit 814 employed in the eighth semiconductor memory device indicated in FIG. 27 and FIG. 28 own the same circuit arrangements and functions as those of the input buffer 711, the rise/fall transition pulse generating circuit 712, the inverter 713, and the delay circuit 714 employed in the seventh semiconductor memory device shown in FIG. 22 and FIG. 23.

As a result, the data strobe signal circuit 81 of the eighth embodiment owns the same function as that of the data strobe signal circuit 711 of the seventh embodiment.

As indicated in FIG. 27(*b*), the clock signal circuit 82 contains an input buffer 821, a fall transition pulse generating circuit 822, a rise transition pulse generating circuit 823, a delay circuit 824, a frequency dividing circuit 825, another rise transition pulse generating circuit 826, and a switch circuit 827.

The input buffer 821 and the fall transition pulse generating circuit 822 own the same circuit arrangements and functions as those of the input buffer 721 and the fall transition pulse generating circuit 722, as shown in FIG. 22(*b*), respectively. The input buffer 821, the rise transition pulse generating circuit 823, the delay circuit 824, the frequency dividing circuit 825, and the rise transition pulse generating circuit 826, employed in this eighth semiconductor memory device, have the same circuit arrangements and functions as those of the input buffer 2011, the rise transition pulse generating circuit 2012, the delay circuit 2013, the frequency dividing circuit 2014, and the rise transition pulse generating circuit 2015, employed in the first prior art memory device shown in FIG. 36.

Accordingly, the clock signal circuit 82 may have the same function as that of the clock signal circuit 72 according to the seventh embodiment under such a condition that the switch circuit 827 is connected as shown in FIG. 27(*b*). To the contrary, when this switch circuit 827 is switched from the present connection state, the clock signal circuit 82 may have the same function as that of the clock signal circuit 201 employed in the first prior art.

As indicated in FIG. 28, the data-in circuit 83 contains an input buffer 831, register circuits 832, 833, 836, and 837, data latch circuits 834, 835, a data bus drive circuit 838, and also switch circuits 839, 8310, 8311, and 8312.

The input buffer 831, the register circuits 832, 833, 836, 837, the data latch circuits 834, 835, and the data bus drive circuit 838 employed in the eighth embodiment own the same circuit arrangements and functions as those of the input buffer 731, the register circuits 732, 733, 736, 737, the data latch circuits 734, 735, data bus drive circuit 738, employed in the seventh embodiment of FIG. 23(*a*), respectively. Also, the input buffer 831, the register circuits 832, 833, 836, 837, and the data bus drive circuit 838 employed in the eighth embodiment own the same circuit arrangements and functions as those of the input buffer 2021, the register circuits 2022, 2023, 2024, 2025, and the data bus drive circuit 2026, employed in the second prior art of FIG. 37(*a*), respectively. As a result, the data-in circuit 83 may own the same function as that of the data-in circuit 73 of the seventh embodiment under such a condition that the switch circuits 839, 8310, 8311, 8312 are connected as shown in FIG. 28. To the contrary, when these switch circuits 839, 8310, 8311, 8312 are switched from the present connection state, this data-in circuit 83 of the eighth embodiment may have the same function as the data-in circuit 202 of the first prior art.

OPERATION OF EIGHTH SEMICONDUCTOR MEMORY DEVICE

As previously explained, in accordance with the eighth semiconductor memory device having the above-described circuit arrangement, the memory operation effected in the seventh semiconductor memory device and the memory operation effected in the first prior art memory device can be properly switched, depending upon the switching conditions of these switch circuits 827, 839, 8310, and 8312 employed in this eighth memory device.

It should also be understood that these switch circuits 827, 839, 8310, 8311, and 8312 may be switched to any switching position in a fixing manner by setting bonding option, which is similar to that of the second embodiment.

CIRCUIT ARRANGEMENT/TIMING CHART OF NINTH SEMICONDUCTOR MEMORY DEVICE

FIG. 29 and FIG. 30 are schematic block diagrams for representing an electric circuit arrangement of a semiconductor memory device according to a ninth embodiment of the present invention. FIG. 31 is a timing chart for explaining operations of the semiconductor memory device according to the ninth embodiment. FIG. 32 is an explanatory diagram for explaining a latch margin of the ninth semiconductor memory device in the case that the data strobe signal owns the earliest timing. FIG. 33 is an explanatory diagram for explaining a latch margin of the ninth semiconductor memory device in the case that the data strobe signal owns the latest timing. As schematically shown in FIG. 29 and FIG. 30, this semiconductor memory device of the ninth embodiment is mainly arranged by a data strobe signal circuit 91, a clock signal circuit 92, and a data-in circuit 93.

Figure 29A:
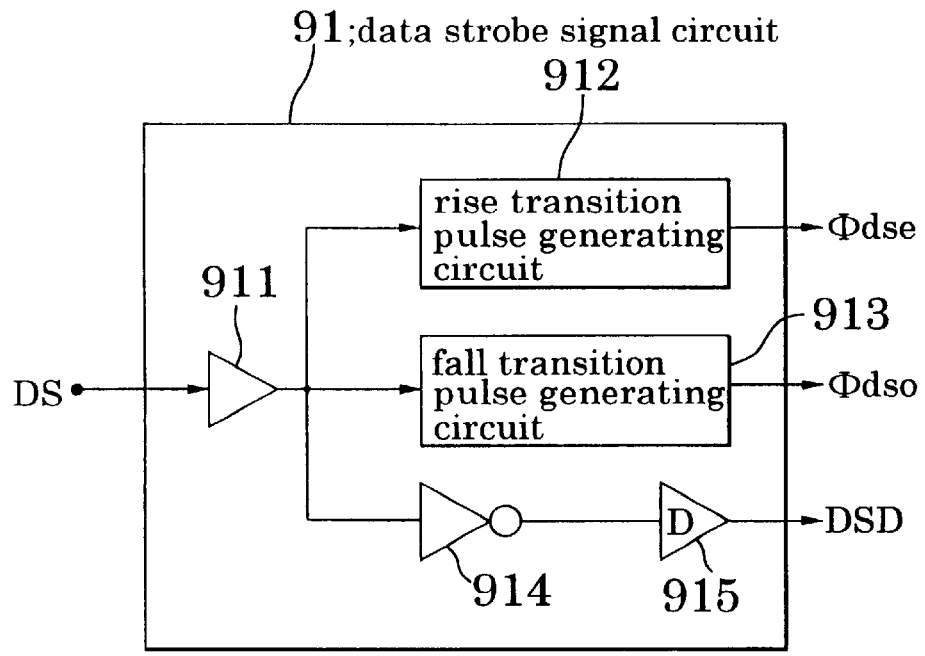
FIG. 29, diagrams a and b are schematic block diagrams for showing an electric circuit arrangement of a semiconductor memory device according to a ninth embodiment of the present invention.

Precisely speaking, as shown in FIG. 29(a), the data strobe signal circuit 91 contains an input buffer 911, a rise transition pulse generating circuit 912, an inverter 914, a delay circuit 915, and a fall transition pulse generating circuit 913.

The input buffer 911 supplies a data strobe signal DS to the rise transition pulse generating circuit 912, the fall transition pulse generating circuit 913, and the inverter 914. The rise transition pulse generating circuit 912 detects a rise edge of an output signal from the input buffer 911 to thereby generate an one-shot pulse signal "Φdse". The fall transition pulse generating circuit 913 detects the fall edge of the output signal from the input buffer 911 to thereby generate an one-shot pulse signal "Φdso". The inverter 914 inverts the output signal derived from the input buffer 911. The delay circuit 915 delays the output signal derived from the inverter 914 by preselected time to thereby produce a delayed data strobe signal DSD.

Figure 29B:
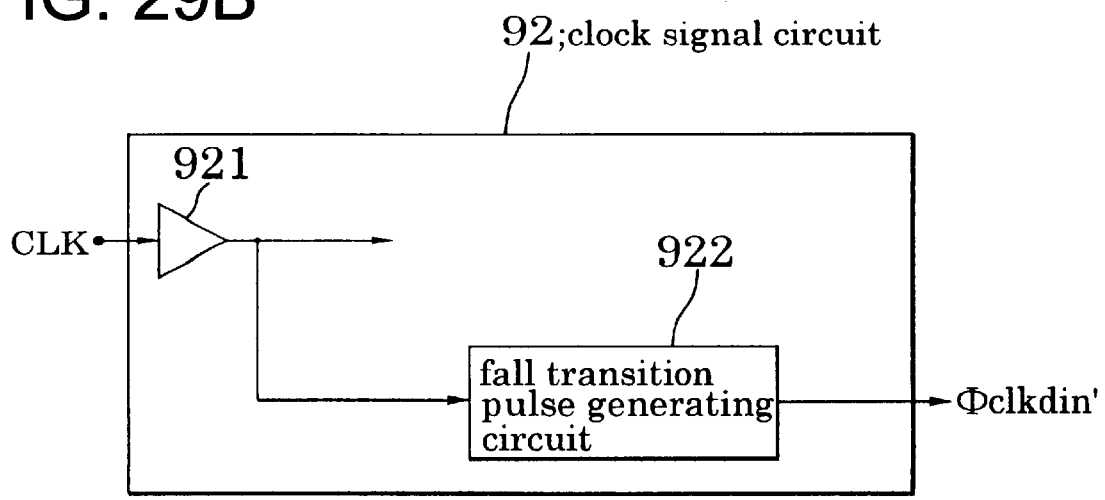

As indicated in FIG. 29(b), the clock signal circuit 92 contains an input buffer 921 and a fall transition pulse generating circuit 922.

The input buffer 921 supplies a clock signal CLK to the fall transition pulse generating circuit 922. The fall transition pulse generating circuit 922 detects a fall edge of an output signal from the input buffer 921 to thereby produce an one-shot pulse signal "Φclkdin".

Figure 30A:
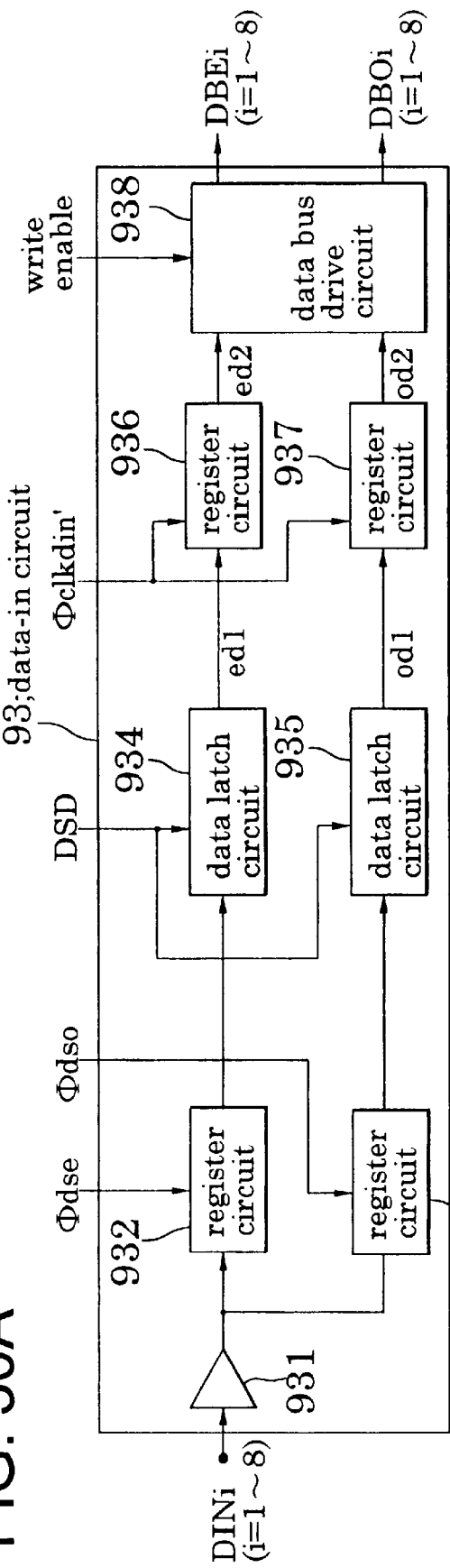
FIG. 30, diagrams a and b are schematic block diagrams for indicating another electric circuit arrangement of the semiconductor memory device according to the ninth embodiment of the present invention.
Figure 31:
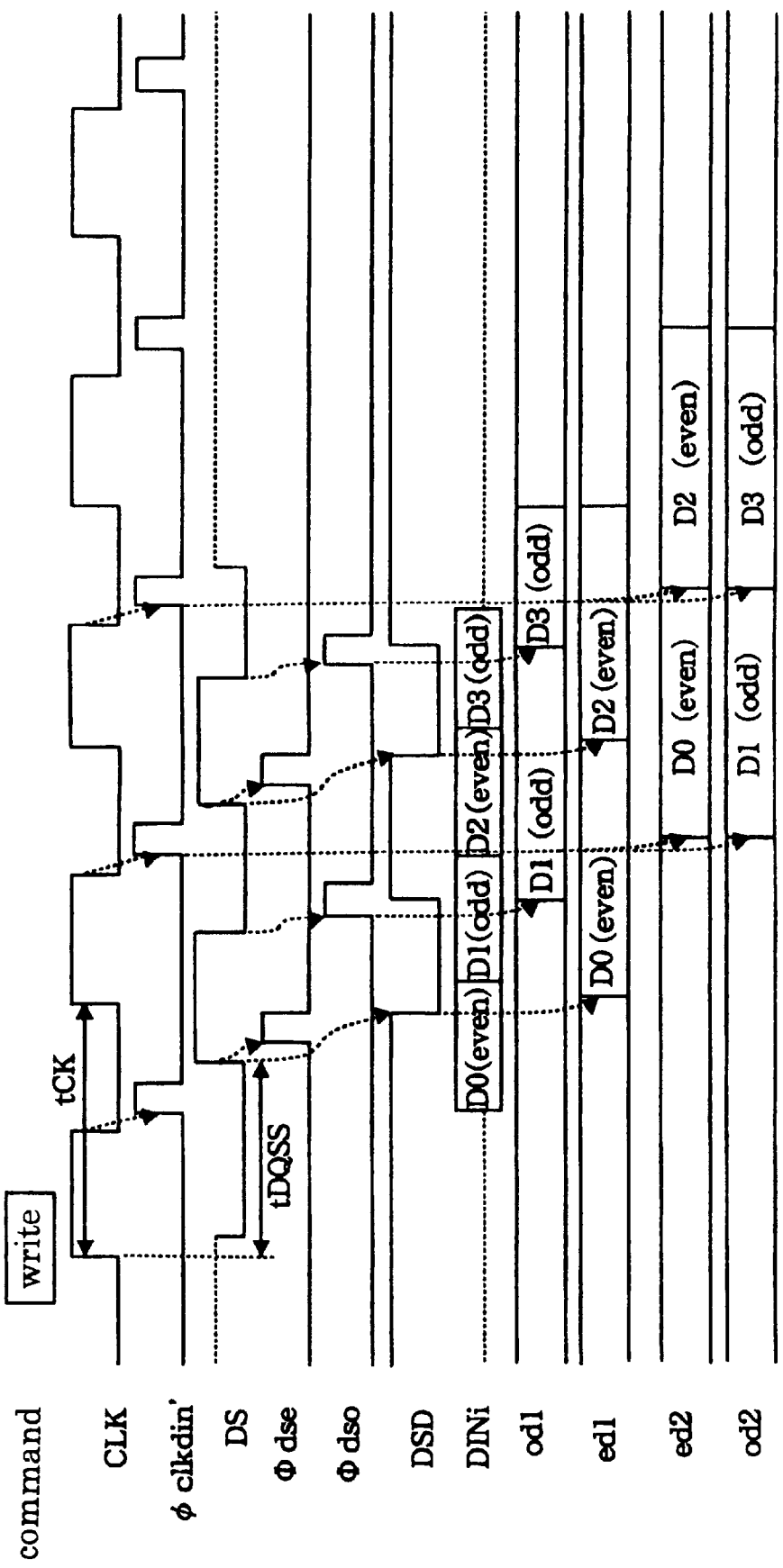
FIG. 31 is a timing chart for explaining operations of the semiconductor memory device according to the ninth embodiment.

As shown in FIG. 30(a), the data-in circuit 93 contains an input buffer 931, register circuits 932, 933, 936, 937, data latch circuits 934, 935, and also a data bus drive circuit 938.

The input buffer 931 supplies a data input signal DINi (i=1 to 8) to the register circuits 932 and 933. The register circuit 932 acquires an output signal derived from the input buffer 931 in response to the one-shot pulse "Φdse". The register circuit 933 acquires an output signal derived from the input buffer 931 in response to the one-shot pulse signal "Φdso". The data latch circuits 934 and 935 latch the output signals derived from the register circuits 932 and 933 in response to the delayed data strobe signal DSD to thereby produce output signals "ed1" and "od1", respectively. Both the register circuit 936 and the register circuit 937 acquire the output signals derived from the data latch circuits 934 and 935 in response to the one-shot pulse signal "Φclkdin'" to thereby generate output signals "ed2" and "od2", respectively. The data bus drive circuit 938 supplies both the output data "ed2" derived from the register circuit 936 and the output data "od2" derived from the register circuit 937 in a parallel manner to even-numbered data buses DBEi (i=1 to 8) and also odd-numbered data buses DBOi (i=1 to 8), so that the input data may be written into a memory cell (not shown).

Figure 30C:
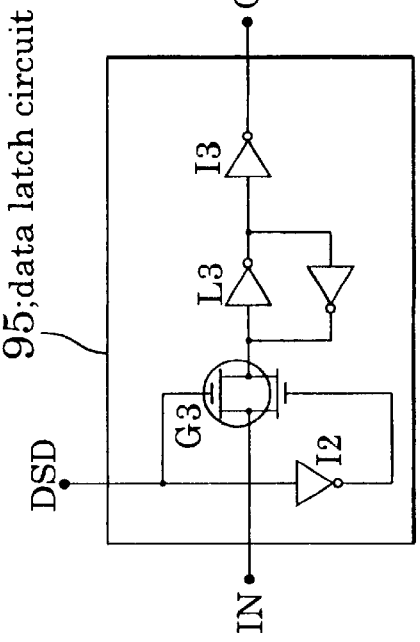
Figure 30B:
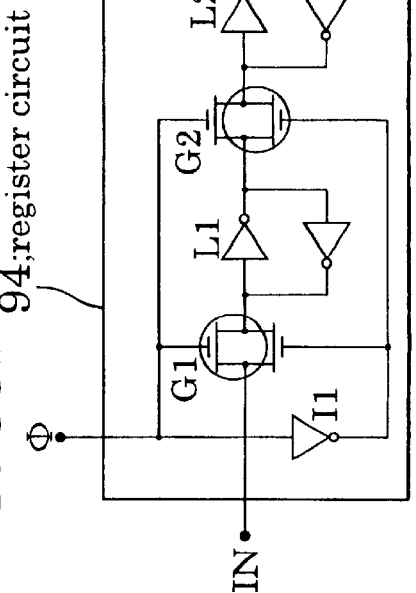

It should be understood in this ninth embodiment that all of these register circuits 932, 933, 936, and 937 own the same circuit arrangements as the circuit arrangement of a register circuit 94 shown in FIG. 30(b). This register circuit 94 owns the substantially same arrangement/function as those of the register circuit 203 indicated in FIG. 37(b).

Also, the data latch circuits 934 and 935 own the same circuit arrangements as the circuit arrangement of the data latch circuit 95 indicated in FIG. 30(c). Then, the data latch circuit 95 has the substantially same circuit arrangement/function as that of the data latch circuit shown in FIG. 23(c).

OPERATION OF NINTH SEMICONDUCTOR MEMORY DEVICE

Next, operation of this semiconductor memory device according to the ninth embodiment will be described with reference to FIG. 29 to FIG. 33.

In the data strobe signal circuit 91 shown in FIG. 29(a), the rise edge of the data strobe signal DS is detected so as to generate the one-shot pulse signal "Φdse", and furthermore, the fall edge of this data strobe signal DS is detected in order to generate the one-shot pulse signal "Φdso". Furthermore, the data strobe signal DS is inverted and delayed so as to produce a delayed data strobe signal DSD. On the other hand, in the clock signal circuit 92 shown in FIG. 29(b), the fall edge of the clock signal CLK is detected so as to produce the one-shot pulse signal "Φclkdin'".

In the data-in circuit 93 shown in FIG. 30(a), in response to the one-shot pulse signal "Φdse" produced by detecting the rise transition of the data strobe signal DS, the data input signal DINi is acquired into the register circuit 933. Next, two sets (pieces) of data acquired by the register circuits 932 and 933 are simultaneously acquired into the register circuits 934 and 935 in response to the delayed data strobe signal DSD.

Thereafter, both the data "ed1" and "od1" acquired by the register circuits 934 and 935 are transferred to the next register circuits 936 and 937 in response to the one-shot pulse signal "Φclkdin'" produced by detecting the fall transition of the clock signal CLK. Assuming now that the clock period is selected to be "tCK", the technical standard "tDQSS" indicative of a timing difference between the clock signal CLK and the data strobe signal DS is located within a range from, for example, 0.4 tCK (minimum tDQSS) up to 0.9 tCK (maximum tDQSS). As a consequence, as represented in FIG. 32 and FIG. 33, in such two cases of 0.4 tCK and 0.9 tCK, a margin must be secured, or ensured with respect to the mis-latching operation. To this end, the delay amount of the delay circuit 915 in the delayed data strobe signal "DSD" generating unit is controlled to an optimum value. In this ninth embodiment, in the timing chart of FIG. 32, the latch margin can be secured even under such a condition that the data strobe signal DS owns the earliest timing. Also, in FIG. 33, this timing chart represents that the latch margin can be secured even under such a condition that the data strobe signal owns the latest timing.

As previously described, in accordance with the ninth semiconductor memory device having the above-described circuit arrangement, it is possible to secure the latch margin when the input data acquired by controlling the data strobe signal DS is converted into the control of the clock signal CLK. In this ninth embodiment, this ninth semiconductor memory device can be effectively applied in such a case that the technical standard "tDQSS" indicative of the timing difference between the clock signal CLK and the data strobe signal DS is small. Since a total number of these delay circuits used to secure the latch margin is small, the circuit arrangement can be made simple.

Furthermore, in this embodiment, since the control operation by the clock signal CLK is carried out by the one-shot pulse signal "Φclkdin'", the dependent characteristic of this clock signal CK with respect to the duty ratio can be canceled.

CIRCUIT ARRANGEMENT OF TENTH SEMICONDUCTOR DEVICE

Figure 34A:
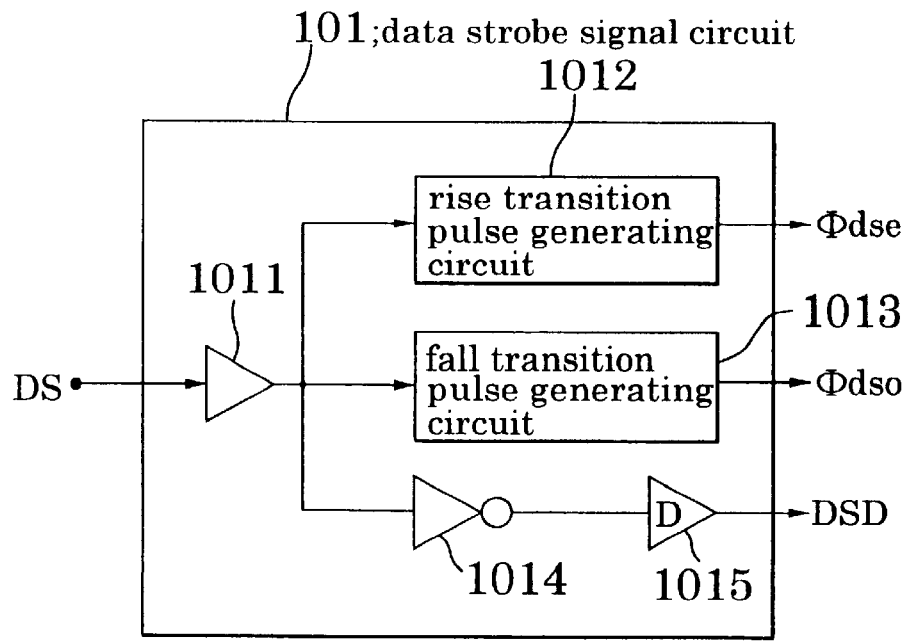
FIG. 34, diagrams a and b are schematic block diagrams for showing an electric circuit arrangement of a semiconductor memory device according to a tenth embodiment of the present invention.
Figure 34B:
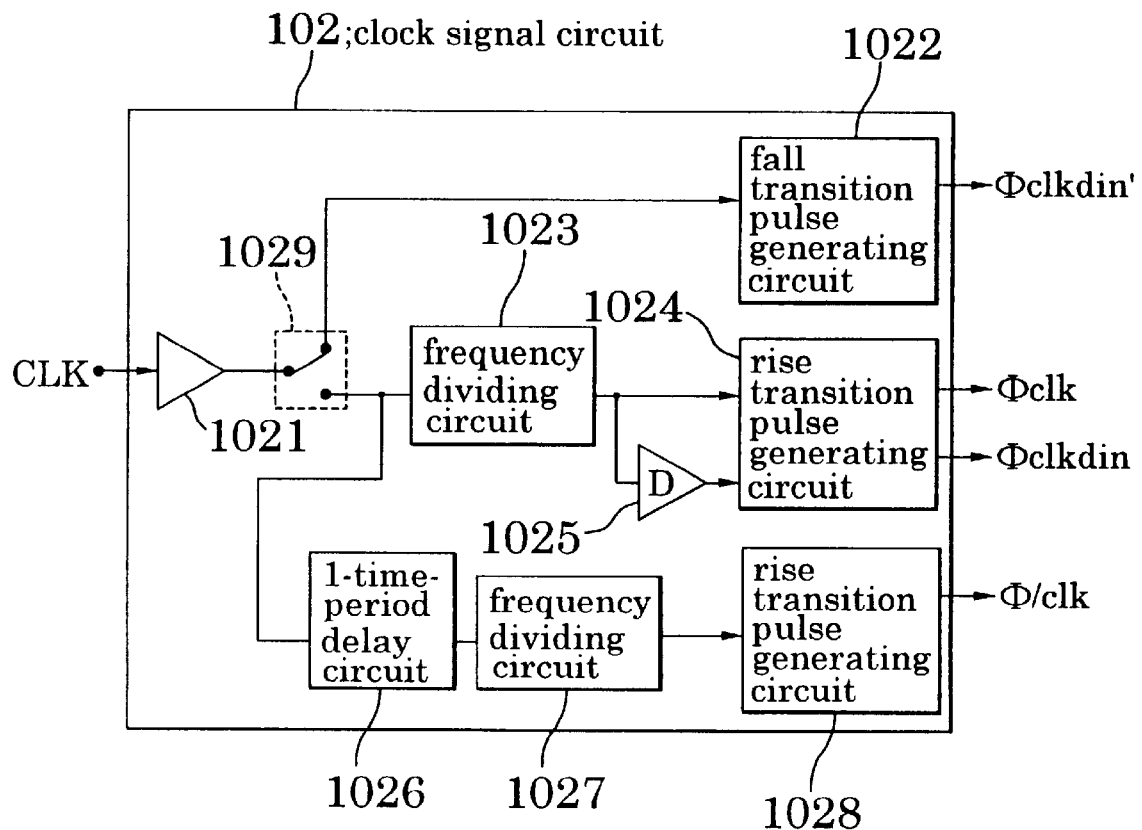
Figure 35:
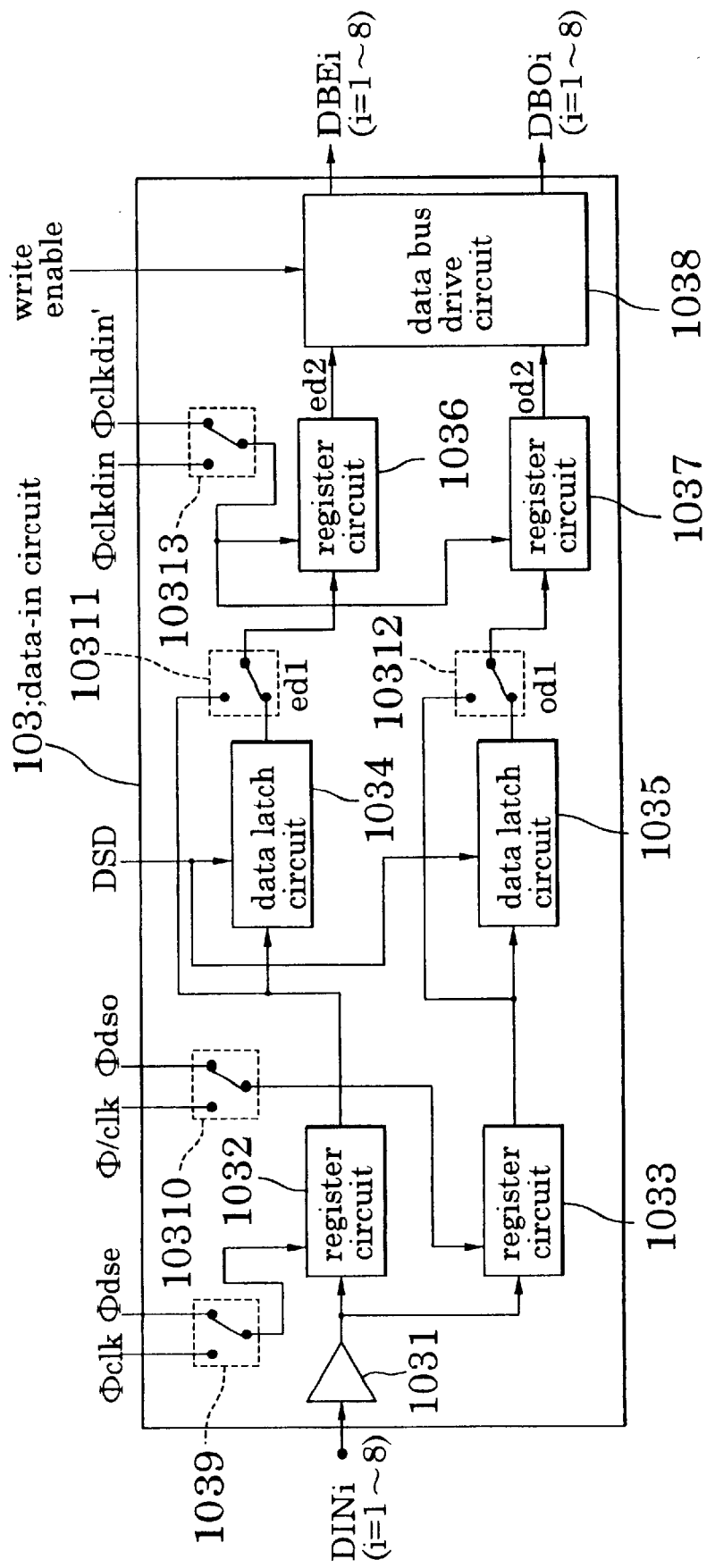
FIG. 35 is a schematic block diagram for indicating another electric circuit arrangement of the semiconductor memory device according to the tenth embodiment of the present invention.

FIG. 34 and FIG. 35 are schematic block diagrams for showing an electric circuit arrangement of a semiconductor memory device according to a tenth embodiment of the present invention.

This semiconductor memory device of the tenth embodiment is mainly arranged by a data strobe signal circuit 101, a clock signal circuit 102, and a data-in circuit 103.

As indicated in FIG. 34 (*a*), the data strobe signal circuit 101 contains an input buffer 1011, a rise transition pulse generating circuit 1012, a fall transition pulse generating circuit 1013, an inverter 1014, and a delay circuit 1015.

The input buffer 1011, the rise transition pulse generating circuit 1012, the fall transition pulse generating circuit 1013, the inverter 1014, and the delay circuit 1015 employed in this tenth semiconductor memory device indicated in FIG. 34(*a*) own the same circuit arrangements and functions as those of the input buffer 911, the rise transition pulse generating circuit 912, the fall transition pulse generating circuit 913, the inverter 914, and the delay circuit 915 employed in the ninth semiconductor memory device shown in FIG. 29(*a*).

As a result, the data strobe signal circuit 101 of this tenth embodiment owns the same function as that of the data strobe signal circuit 91 of the ninth embodiment.

As indicated in FIG. 34 (*b*), the clock signal circuit 102 contains an input buffer 1021, a fall transition pulse generating circuit 1022, a frequency dividing circuit 1023, a rise transition pulse generating circuit 1024, a delay circuit 1025, a 1-time-period delay circuit 1026, a frequency dividing circuit 1027, a rise transition pulse generating circuit 1028, and a switch circuit 1029.

The input buffer 1021 and the fall transition pulse generating circuit 1022 own the same circuit arrangements and functions as those of the input buffer 921 and the fall transition pulse generating circuit 922, as shown in FIG. 29(*b*), respectively. The input buffer 1021, the frequency dividing circuit 1023, the rise transition pulse generating circuit 1024, the delay circuit 1025, the 1-time-period delay circuit 1026, the frequency dividing circuit 1027, and the rise transition pulse generating circuit 1028, employed in this tenth semiconductor memory device, have the same circuit arrangements and functions as those of the input buffer 2111, the frequency dividing circuit 2112, the rise transition pulse generating circuit 2113, the delay circuit 2114, the 1-time-period delay circuit 2115, the frequency dividing circuit 2116, and the rise transition pulse generating circuit 2117, employed in the second prior art memory device shown in FIG. 39.

Accordingly, the clock signal circuit 102 may have the same function as that of the clock signal circuit 92 according to the ninth embodiment under such a condition that the switch circuit 1029 is connected as shown in FIG. 34(*b*). To the contrary, when this switch circuit 1029 is switched from the present connection state, the clock signal circuit 102 may have the same function as that of the clock signal circuit 211 employed in the second prior art.

As indicated in FIG. 35, the data-in circuit 103 contains an input buffer 1031, register circuits 1032, 1033, 1036, and 1037, data latch circuits 1034, 1035, a data bus drive circuit 1038, and also switch circuits 1039, 10310, 10311, 10312, and 10313.

Figure 40B:
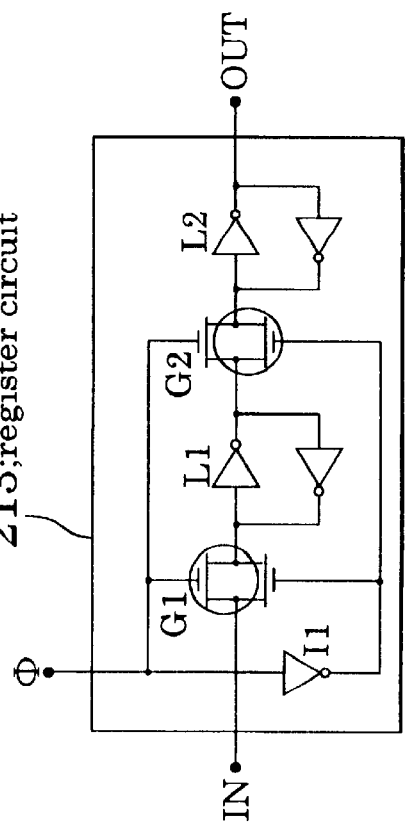
Figure 41:
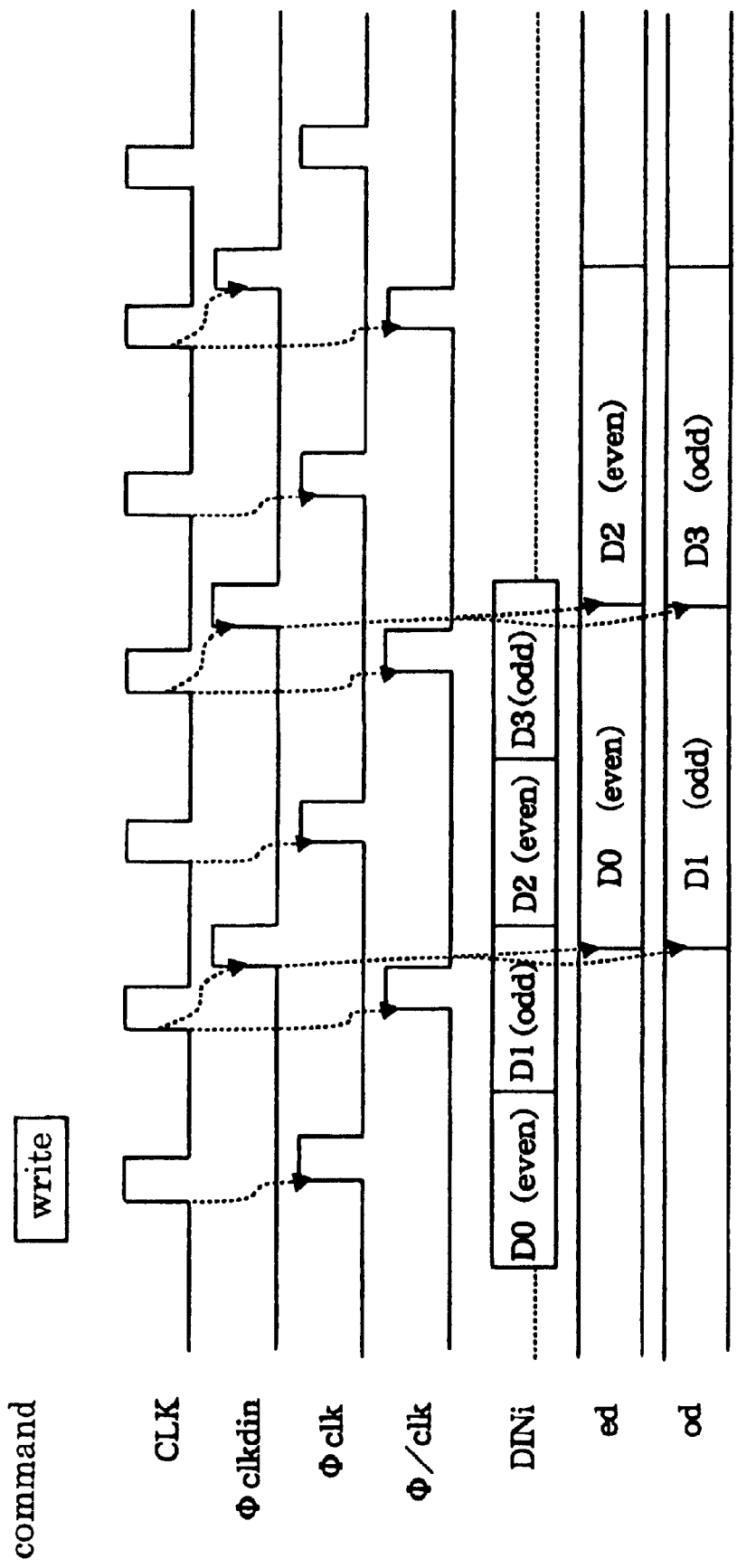
FIG. 41 is a timing chart for explaining operations of the second prior art.

The input buffer 1031, the register circuits 1032, 1033, 1036, 1037, the data latch circuits 1034, 1035, and the data bus drive circuit 1038 employed in the tenth embodiment own the same circuit arrangements and functions as those of the input buffer 931, the register circuits 932, 933, 936, 937, the data latch circuits 934, 935, and the data bus drive circuit 938, employed in the ninth embodiment of FIG. 30(*a*), respectively. Also, the input buffer 1031, the register circuits 1032, 1033, 1036, 1037, and the data bus drive circuit 1038 employed in this tenth embodiment own the same circuit arrangements and functions as those of the input buffer 2121, the register circuits 2122, 2123, 2124, 2125, and the data bus drive circuit 2126, employed in the second prior art of FIG. 40(*a*), respectively. As a result, the data-in circuit 103 may own the same function as that of the data-in circuit 93 of the ninth embodiment under such a condition that the switch circuits 1039, 10310, 10311, 10312, 10313 are connected as shown in FIG. 35. To the contrary, when these switch circuits 1039, 10310, 10311, 10312, 10313 are switched from the present connection state, this data-in circuit 103 of the tenth embodiment may have the same function as the data-in circuit 212 of the second prior art.

OPERATION OF TENTH SEMICONDUCTOR MEMORY DEVICE

As previously explained, in accordance with the tenth semiconductor memory device having the above-described circuit arrangement, the memory operation effected in the ninth semiconductor memory device and the memory operation effected in the second prior art memory device can be properly switched, depending upon the switching conditions of these switch circuits 1029, 1039, 10310, 10312, and 10313 employed in this tenth memory device.

It should also be understood that these switch circuits 1029, 1039, 10310, 10311, 10312, and 10313 may be switched to any switching position in a fixing manner by setting bonding option, which is similar to that of the second embodiment shown in FIG. 6 and FIG. 7.

While the present invention has been described in detail with reference to the drawing, the concrete circuit arrangements of this invention are not limited to these embodiments, but may be modified, changed, and substituted without departing from the technical scope and spirit of the present invention. For instance, in the fifth embodiment, when the delay circuits 522 and 534 are omitted, the modified semiconductor memory device may be applied to such a case that the standard value of "tDQSS" is relatively close to the reference value "1tCK". Alternatively, this modified circuit arrangement may be combined with the memory device circuit arrangement of the second prior art. Furthermore, for instance, such a delay circuit equivalent to the delay circuit 534 employed in the fifth embodiment may be provided within the data strobe signal circuit 51. As a result, it is possible to arrange a memory device circuit from which the delay circuit 534 of the data-in circuit 53 is omitted.

As previously explained in detail, in accordance with the semiconductor memory device of the present invention, the following advantages can be achieved. That is, in the DDR-SDRAM with employment of the data strobe signal DS, after the input data is latched by employing the one-shot pulse signal produced from this data strobe signal DS, this latched input data is again latched by using another one-shot pulse signal generated from the clock signal. As a result, while the input data which has been acquired by the DS control is converted into the CLK control, the sufficient latch margin of the input data can be secured by controlling the delay amounts of the respective one-shot pulse signals.

At this stage, since the control operation by the clock signal CLK is carried out by way of the one-shot pulse signal produced from the clock signal CLK, the dependent characteristic of the clock signal CLK with respect to the duty ratio (namely, ratio of high-level width to low-level width) can be canceled. It is thus apparent that the present invention is not limited to the above embodiments but may be changed and modified without departing from the scope and spirit of the invention.

Finally, the present application claims the priority of Japanese Patent Application No.Hei10-140128 filed on May 21 which is herein incorporated by reference.

What is claimed is:

1. A semiconductor memory device comprising:

a data strobe signal processing circuit for detecting at least one of a rise edge of a data strobe signal and a fall edge thereof to thereby produce at least a first one-shot pulse signal;

a clock signal processing circuit for detecting a rise edge of a clock signal to thereby produce a second one-shot pulse signal; and a data-in processing circuit for latching input data by using said first one-shot pulse signal produced from said data strobe signal, and further for latching said latched input data by using said second one-shot pulse signal produced from said clock signal, and also for simultaneously writing both the latched data into a memory cell in a parallel manner, wherein:

said data-in processing circuit controls a delay amount of said first one-shot pulse signal and another delay amount of said second one-shot pulse signal so as to secure a latch margin of said input data.

2. The semiconductor memory device according to claim 1 wherein:

said semiconductor memory device is a double data rate type synchronous dynamic random access memory capable of simultaneously reading/writing 2-bit input data.

3. The semiconductor memory device according to claim 1 wherein:

said data strobe signal processing circuit includes at least a rise/fall transition pulse generating circuit;

said clock signal processing circuit includes at least a rise transition pulse generating circuit; and said data-in processing circuit includes at least two sets of cascade-connected register circuits.

* * * * *